US012804283B2

(12) United States Patent
Tsai

(10) Patent No.: US 12,804,283 B2
(45) **Date of Patent: *Nov. 17, 2026**

(54) IMAGE SENSOR WITH CONTROLLED SPAD AVALANCHE

(71) Applicant: PixArt Imaging Inc., Hsin-Chu County (TW)

(72) Inventor: Tso-Sheng Tsai, Hsin-Chu County (TW)

(73) Assignee: PIXART IMAGING INC., Hsin-Chu County (TW)

(*) Notice: Subject to any disclaimer, the term of this patent is extended or adjusted under 35 U.S.C. 154(b) by 16 days.

This patent is subject to a terminal disclaimer.

(21) Appl. No.: 19/069,289

(22) Filed: Mar. 4, 2025

(65) Prior Publication Data

US 2025/0203241 A1 Jun. 19, 2025

Related U.S. Application Data

(60) Continuation of application No. 18/677,949, filed on May 30, 2024, now Pat. No. 12,267,607, which is a division of application No. 17/943,579, filed on Sep. 13, 2022, now Pat. No. 12,028,636, which is a continuation-in-part of application No. 17/883,746, filed on Aug. 9, 2022, now abandoned.

(51) Int. Cl.

| | |
|---|---|
| ***H04N 25/75*** | (2023.01) |
| ***H04N 25/76*** | (2023.01) |
| ***H10F 30/225*** | (2025.01) |
| ***H10F 39/00*** | (2025.01) |
| ***H10F 39/18*** | (2025.01) |

(52) U.S. Cl.

CPC ............. *H04N 25/75* (2023.01); *H04N 25/76* (2023.01); *H10F 39/18* (2025.01); *H10F 39/8037* (2025.01); *H10F 30/225* (2025.01)

(58) Field of Classification Search

CPC ........ H04N 25/75; H04N 25/76; H04N 25/77; H04N 25/773; H10F 39/18; H10F 39/8037; H10F 30/225; H10F 77/959

See application file for complete search history.

(56) References Cited

U.S. PATENT DOCUMENTS 12,028,636 B2 * 7/2024 Tsai ..................... H04N 25/773

FOREIGN PATENT DOCUMENTS

CN 105791718 A * 7/2016 ........... H04N 25/768

OTHER PUBLICATIONS

CN 105791718 translation (Year: 2016).*

* cited by examiner

*Primary Examiner* — Sinh Tran
*Assistant Examiner* — Angel L Garces-Rivera
(74) *Attorney, Agent, or Firm* — WPAT, PC

(57) ABSTRACT

There is provided an image sensor employing an avalanche diode. The image sensor includes a plurality of pixel circuits arranged in a matrix, a plurality of pulling circuits and a global current source circuit. Each of the plurality of pixel circuits includes a single photon avalanche diode (SPAD) and a floating diffusion. Each of the plurality of pulling circuits is arranged corresponding to one pixel circuit column. The global current source circuit is used to form a current mirror with each of the plurality of pulling circuits. The floating diffusion is used to record a voltage of one photon event detected by the SPAD in an exposure period.

20 Claims, 33 Drawing Sheets

IMAGE SENSOR WITH CONTROLLED SPAD AVALANCHE

CROSS REFERENCE TO RELATED APPLICATION

This application is a continuation application of U.S. application Ser. No. 18/677,949, filed on May 30, 2024, which a divisional application of U.S. application Ser. No. 17/943,579, filed on Sep. 13, 2022, which is a continuation-in-part application of U.S. application Ser. No. 17/883,746, filed on Aug. 9, 2022 the full disclosures of which are incorporated herein by reference.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to the photon detection technology and, more particularly, to an image sensor employing a single photon avalanche diode (SPAD) in the pixel circuit. The quenching and readout circuit of the SPAD has a low limitation on minimum pixel unit and a high fill factor.

2. Description of the Related Art

Single photon detection is a good choice in dealing with weak light environment and high frequency light signals.

For example, a single photon avalanche diode (SPAD) can be used as a detector for weak light, and has the benefits of high avalanche gain, fast response and low power consumption. When each photon is received by the SPAD, an avalanche current is triggered to respond that one photon is detected. A pulse generated by the avalanche current can be referred as an event.

However, the SPAD cannot accomplish the quenching by itself, and thus a quenching circuit is required in operation so as to quickly pull down a bias voltage of the SPAD to be lower than a breakdown voltage after an avalanche occurs. Then, the bias voltage is quickly pulled up to be higher than the breakdown voltage to cause the SPAD to return to a photon detecting state.

One requirement of the quenching circuit is not to decrease the fill factor.

One conventional method is to form an independent 3D quenching circuit outside a pixel circuit. Because the pixel circuit and the quenching circuit are not arranged in the same chip, the impact upon the fill factor is reduced.

Another conventional method is to use a logic circuit having a combination of p-type and N-type transistors to implement a quenching circuit. However, in this kind of quenching circuit, two Nwells having different potentials have to be formed within a signal pixel unit. Due to the design rules checking, a minimum distance should be maintained between the Nwells having different potentials that causes a limitation on the minimum pixel size.

Accordingly, it is necessary to provide a quenching circuit of the SPAD having a low limitation on minimum pixel unit and a high fill factor.

SUMMARY

The present disclosure provides an image sensor incorporating an SPAD within each pixel circuit, and the SPAD has a low limitation on minimum pixel size and a high fill factor.

The present disclosure provides an image sensor including a pixel array. The pixel array includes a plurality of pixel circuits arranged in a matrix. Each pixel circuit includes an avalanche diode, an enable transistor, a first switch transistor, an exposure transistor, a pull down transistor and a second switch transistor. The avalanche diode has an anode connected to a first node. A source of the enable transistor is connected to the first node, and a gate of the enable transistor is configured to receive an enable signal, which is configured to pull up a voltage on the first node when the pixel circuit is not in sampling or resetting to prevent the avalanche diode from avalanche. A drain of the first switch transistor is connected to the first node, a gate of the first switch transistor is configured to receive a first reset signal, and a source of the first switch transistor connected to ground. A source of the exposure transistor is connected to the first node, a drain of the exposure transistor is connected to a second node, and a gate of the exposure transistor receives an exposure signal for determining an exposure period. A gate of the pull down transistor is connected to the second node, and a source of the pull down transistor is connected to the ground. A gate of the second switch transistor is configured to receive a readout signal, a source of the second switch transistor is connected to a drain of the pull down transistor, and a drain of the second switch transistor is configured to generate an output voltage.

The present disclosure further provides an image sensor including a pixel array. The pixel array includes a plurality of pixel circuits arranged in a matrix. Each pixel circuit includes an avalanche diode, an enable transistor, a first switch transistor, an exposure transistor, a pull up transistor and a second switch transistor. The avalanche diode has a cathode connected to a first node. A source of the enable transistor is connected to the first node, and a gate of the enable transistor is configured to receive an enable signal, which is configured to pull down a voltage on the first node when the pixel circuit is not in sampling or resetting to prevent the avalanche diode from avalanche. A drain of the first switch transistor is connected to the first node, a gate of the first switch transistor is configured to receive a first reset signal, and a source of the first switch transistor is connected to a system voltage. A source of the exposure transistor is connected to a second node, a drain of the exposure transistor is connected to the first node, and a gate of the exposure transistor receives an exposure signal for determining an exposure period. A gate of the pull up transistor is connected to the second node, and a source of the pull up transistor is connected to the system voltage. A gate of the second switch transistor is configured to receive a readout signal, a source of the second switch transistor is connected to a drain of the pull up transistor, and a drain of the second switch transistor is configured to generate an output voltage.

The present disclosure provides an image sensor including a pixel array. The pixel array includes a plurality of pixel circuits arranged in a matrix. Each pixel circuit includes an avalanche diode, an enable transistor, a first switch transistor, a pull down transistor and a second switch transistor. The avalanche diode has an anode connected to a first node. A source of the enable transistor is connected to the node, and a gate of the enable transistor is configured to receive an enable signal, which is configured to pull up a voltage on the node when the pixel circuit is not in sampling or resetting to prevent the avalanche diode from avalanche. A drain of the first switch transistor is connected to the node, a gate of the first switch transistor is configured to receive a reset signal, and a source of the first switch transistor is connected to ground. A gate of the pull down transistor is connected to the node, and a source of the pull down transistor is connected to the ground. A gate of the second switch transistor is configured to receive an exposure signal, a source of the second switch transistor is connected to a drain of the pull down transistor, and a drain of the second switch transistor is configured to generate an output voltage.

The present disclosure further provides an image sensor including a pixel array. The pixel array includes a plurality of pixel circuits arranged in a matrix. Each pixel circuit includes an avalanche diode, an enable transistor, a first switch transistor, a pull up transistor and a second switch transistor. The avalanche diode has a cathode connected to a first node. A source of the enable transistor is connected to the node, and a gate of the enable transistor is configured to receive an enable signal, which is configured to pull down a voltage on the node when the pixel circuit is not in sampling or resetting to prevent the avalanche diode from avalanche. A drain of the first switch transistor is connected to the node, a gate of the first switch transistor is configured to receive a reset signal, and a source of the first switch transistor is connected to a system voltage. A gate of the pull up transistor is connected to the node, and a source of the pull up transistor is connected to the system voltage. A gate of the second switch transistor is configured to receive an exposure signal, a source of the second switch transistor is connected to a drain of the pull up transistor, and a drain of the second switch transistor is configured to generate an output voltage.

In the quenching and readout circuit of the SPAD of the present disclosure, each pixel only has N-type transistors or P-type transistors, and thus each pixel only has one Nwell.

In the image sensor of the present disclosure, as the pulling circuit is arranged outside of each pixel, it can neither become a limitation on the minimum pixel unit nor affect the fill factor.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
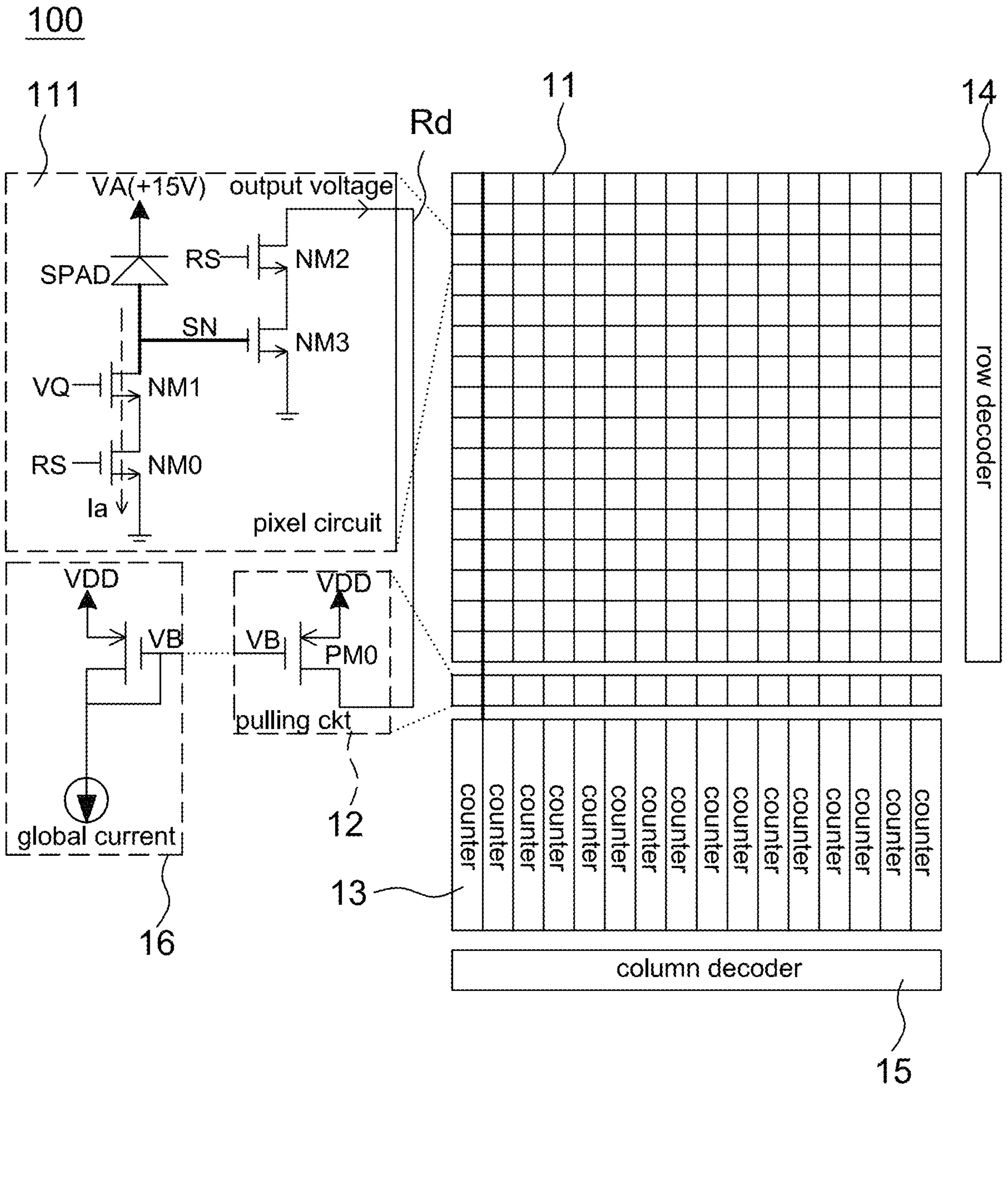
FIG. 1 is a schematic diagram of an image sensor according to a first embodiment of the present disclosure.

Referring to FIG. 1, it is a schematic diagram of an image sensor 100 according to a first embodiment of the present disclosure. The image sensor 100 is used to detect extremely weak light and high frequency signals, and thus a single photon avalanche diode (SPAD) is employed to detect photon events. A processor generates an image frame by counting photon events of every pixel to perform the object tracking, gesture recognition, 3D image construction, and biological feature detection and recognition.

The image sensor 100 includes a pixel array 11, a plurality of pulling circuits 12, a plurality of counters 13, a row decoder 14, a column decoder 15 and a global current source circuit 16, wherein the row decoder 14 and the column decoder 15 are used to determine a pixel position in the pixel array 11 that is being exposed and outputting a detected signal (e.g., pulses mentioned below). The operation of the row decoder 14 and the column decoder 15 is known to the art and is not a main objective of the present disclosure, and thus details thereof are not described herein.

The pixel array 11 includes a plurality of pixel circuits 111 (e.g., FIG. 1 showing 16×16 pixels as an example) arranged in a matrix. Each of the plurality of pixel circuits 111 has an avalanche diode SPAD and four N-type transistors including a resistive transistor NM1, a first switch transistor NM0, a pull down transistor NM3 and a second switch transistor NM2.

The avalanche diode SPAD is a single photon avalanche diode, and has an anode and a cathode. The cathode is connected to a positive bias voltage VA, e.g., +15V, but not limited to. The anode is connected to a node SN. When a voltage difference (or bias) between the cathode and the anode exceeds a breakdown voltage of the avalanche diode SPAD, an avalanche current Ia is generated. In the first embodiment, the resistive transistor NM1 and the first switch transistor NM0 of the pixel circuit 111 are used to form a quenching circuit, which causes the voltage difference between the cathode and the anode to be lower than the breakdown voltage for quenching when the avalanche diode SPAD generates the avalanche current Ia. The pull down transistor NM3 and the second switch transistor NM2 of the pixel circuit 111 are used to form a readout circuit, which reads an output voltage of the pixel circuit 111 to a corresponding column counter 13.

A drain of the resistive transistor NM1 is connected to the node SN to connect to the anode of the avalanche diode SPAD. A gate of the resistive transistor NM1 is used to receive a fixed voltage signal VQ and be turned on or off thereby. In the first embodiment, the resistive transistor NM1 is used to form a controllable resistor, and resistance of the controllable resistor is determined according to a voltage value of the fixed voltage signal VQ. When the avalanche diode SPAD receives a photon in the detecting state and the first switch transistor NM0 is conducted, a voltage drop is formed on the resistive transistor NM1 to cause the voltage difference between the cathode and the anode of the avalanche diode SPAD to be lower than the breakdown voltage for the quenching.

A drain of the first switch transistor NM0 is connected to a source of the resistive transistor NM1. A gate of the first switch transistor NM0 is used to receive an exposure signal RS, which is a row selection signal and, for example, generated by the row decoder 14. A source of the first switch transistor NM0 is connected to a ground voltage.

A gate of the pull down transistor NM3 is connected to the node SN to connect to the anode of the avalanche diode SPAD. A source of the pull down transistor NM3 is connected to the ground voltage. The pull down transistor NM3 is used as a discharging path of a voltage on the node SN, and a discharging speed is determined according to resistance of the resistive transistor NM1 and stray capacitance of the circuit. The resistance and the stray capacitance are values determined in circuit manufacturing.

A gate of the second switch transistor NM2 also receives the exposure signal RS, and controlled by the exposure signal RS to be turned on or off together with the first switch transistor NM0. A source of the second switch transistor NM2 is connected to a drain of the pull down transistor NM3. A drain of the second switch transistor NM2 is used to generate an output voltage of the associated pixel circuit 111.

Each of the plurality of pulling circuits 12 is used to connect to the drain of the second switch transistor NM2 of each pixel circuit 111 in one pixel circuit column via a readout line Rd for reading the output voltage. For example, the image sensor 100 further includes a multiplexer or multiple switching devices to allow the pulling circuit 12 corresponding to each pixel circuit column to be connected to different pixel circuits 111 via the multiplexer or different switching devices. In the first embodiment, each of the pulling circuits 12 includes a P-type transistor PM0 used to pull up the output voltage after reading out a pulse in the output voltage (illustrated by an example below). A drain of the P-type transistor PM0 is connected to the drain of the second switch transistor NM2. A source of the P-type transistor PM0 is connected to a system voltage VDD, which is identical to or different from the positive bias voltage VA. A gate of the P-type transistor PM0 is used to receive a control signal VB.

The global current source circuit 16 is used to form a current mirror with each of the plurality of pulling circuits 12. The image sensor 100 is arranged with only one global current source circuit 16. For example, the image sensor 100 further includes a multiplexer or multiple switching devices to allow the global current source circuit 16 to be coupled to different pulling circuits 12 via the multiplexer or different switching devices. The global current source circuit 16 includes a P-type transistor whose drain and gate are connected together and connected to a global current source. A source of the P-type transistor is connected to the system voltage VDD.

Each of the plurality of counters 13 is coupled to one pixel circuit column for counting photon events in the output voltage from each pixel circuit 111 of the coupled pixel circuit column.

Figure 2:
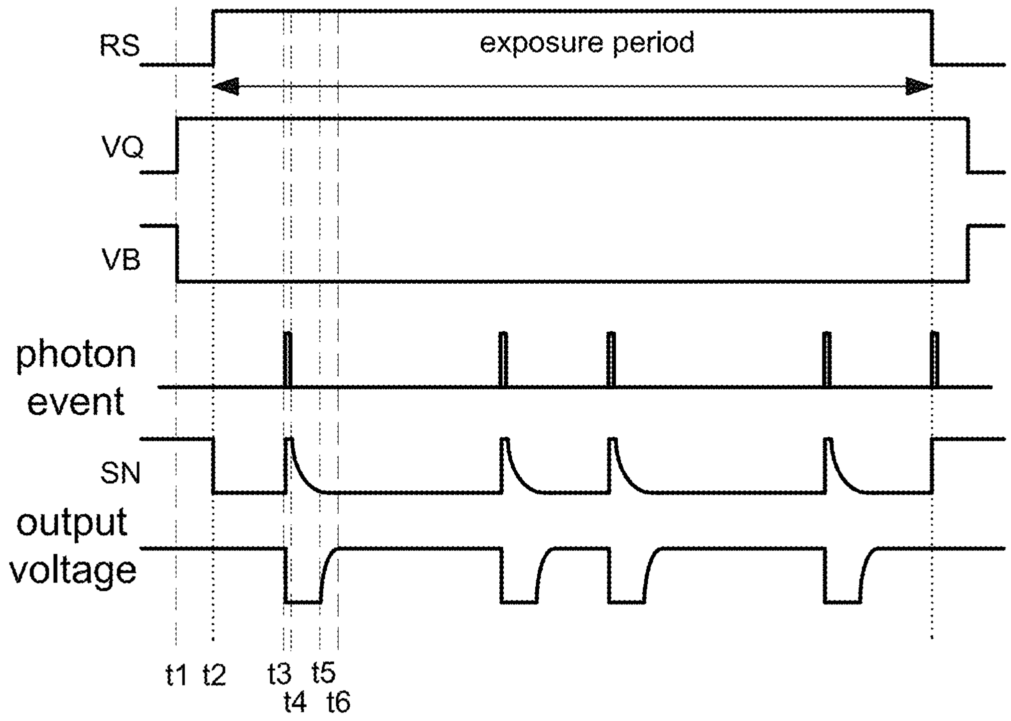
FIG. 2 is an operational timing diagram of an image sensor according to a first embodiment of the present disclosure.
Figure 3:
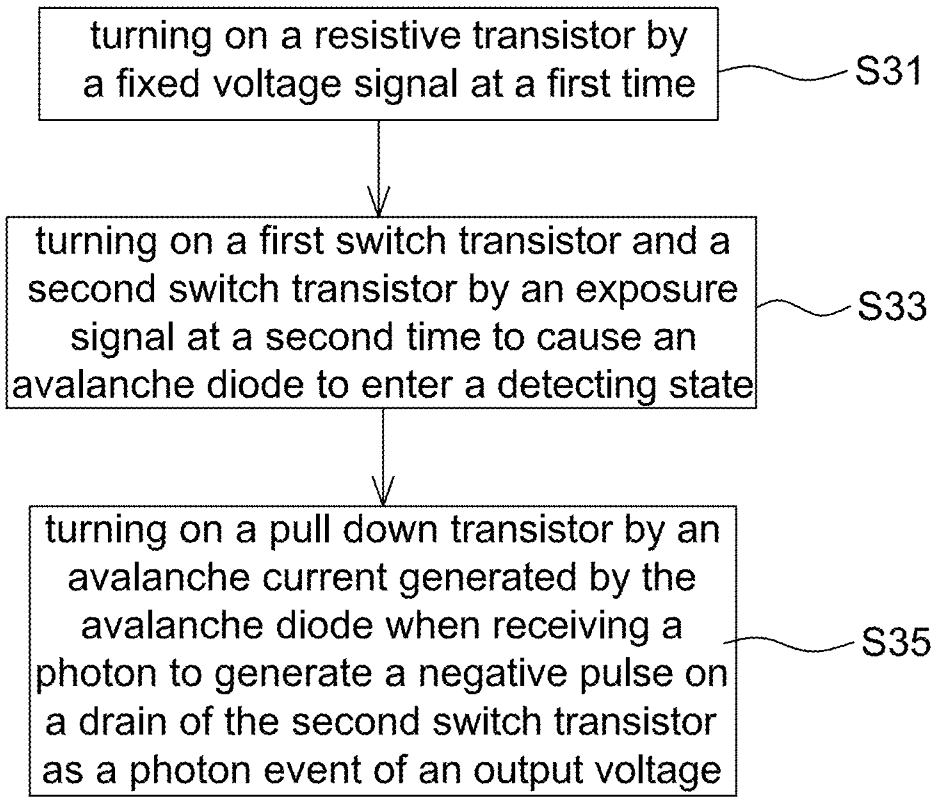
FIG. 3 is a flow chart of an image sensor according to a first embodiment of the present disclosure.

Referring to FIGS. 2 and 3, FIG. 2 is an operational timing diagram of an image sensor 100 according to a first embodiment of the present disclosure; and FIG. 3 is a flow chart of an image sensor 100 according to a first embodiment of the present disclosure. The operating method of the image sensor 100 includes: turning on a resistive transistor by a fixed voltage signal at a first time (Step S31); turning on a first switch transistor and a second switch transistor by an exposure signal at a second time to cause an avalanche diode to enter a detecting state (Step S33); and turning on a pull down transistor by an avalanche current generated by the avalanche diode when receiving a photon to generate a negative pulse on a drain of the second switch transistor as a photon event of an output voltage (Step S35).

Referring to FIGS. 1 to 3 together, details of this operating method are illustrated below. Although this operating method illustrates the operation of one pixel circuit 111, it is appreciated that every pixel circuit 111 in the same pixel circuit column has an operation identical to FIGS. 2 and 3 only occurring at a different time based on the row selection signal.

Step S31: At a first time t1, the fixed voltage signal VQ is switched to a high voltage level to turn on the resistive transistor NM1 of a pixel circuit 111. Meanwhile, as the first switch transistor NM0 is not turned on yet, a voltage drop is not generated on the resistive transistor NM1. At the first time t1, the control signal VB is switched to a low voltage level to turn on the P-type transistor of the pulling circuit 12 (now the pulling circuit 12 being coupled to the corresponding pixel circuit 111 via a switching device or multiplexer).

Step S33: At a second time t2, the exposure signal RS is switched to a high voltage level to turn on the first switch transistor NM0 and the second switch transistor NM2 together. In the first embodiment, a high level interval of the exposure signal RS is referred to an exposure period within which each photon event is counted by the column counter 13. After the first switch transistor NM0 is conducted, as the resistive transistor NM1 has been turned on at the first time t1, a voltage on the node SN is pulled down to a low voltage level. In the first embodiment, the first time t1 is prior to the second time t2 by a predetermined interval as a setting interval of the resistive transistor NM1. In addition, during an interval between the second time t2 and the time t3, although the second switch transistor NM2 is conducted, the output voltage is still kept at a high voltage level because the pull down transistor NM3 is not turned on yet.

Step S35: Within the exposure period, the SPAD is in the detecting state when the avalanche diode SPAD does not receive any photon (e.g., an interval between t2 and t3 in FIG. 2), wherein the voltage on the node SN and the output voltage are respectively kept at a low voltage level and a high voltage level. When the avalanche diode SPAD receives a photon (e.g., at time t3 in FIG. 2), the avalanche diode SPAD generates an avalanche current Ia flowing through the resistive transistor NM1 to form a voltage drop thereon to cause the voltage on the node SN to change to a high voltage level to turn on the pull down transistor NM3. Meanwhile, the drain of the second switch transistor NM2 is connected to the ground via the second switch transistor NM2 and the pull down transistor NM3 to cause the output voltage to generate a negative pulse as a photon event of the output voltage. Meanwhile, as the voltage on the node SN is changed to a high voltage level to cause the voltage difference between the cathode and the anode of the avalanche diode SPAD to be smaller than the breakdown voltage, the quenching is started.

Next, the voltage on the node SN starts to discharge at time t4 via the pull down transistor NM3, and the pull down transistor NM3 is automatically turned off (e.g., at time t5 in FIG. 2) after a discharge interval, and the avalanche diode SPAD returns to a detecting state, wherein said discharge interval is determined according to the resistance of the resistive transistor NM1 and the stray capacitance of the circuit. As mentioned above, said resistance of the resistive transistor NM1 and the stray capacitance are determined in a circuit design stage so as to determine a time interval of the avalanche diode SPAD returning to the detecting state.

Finally, after the pull down transistor NM3 is automatically turned off, the pulling circuit 12 pulls up the output voltage back to a high voltage level to return to an original level at time t6. In this way, one quenching and reading cycle is accomplished.

Figure 6:
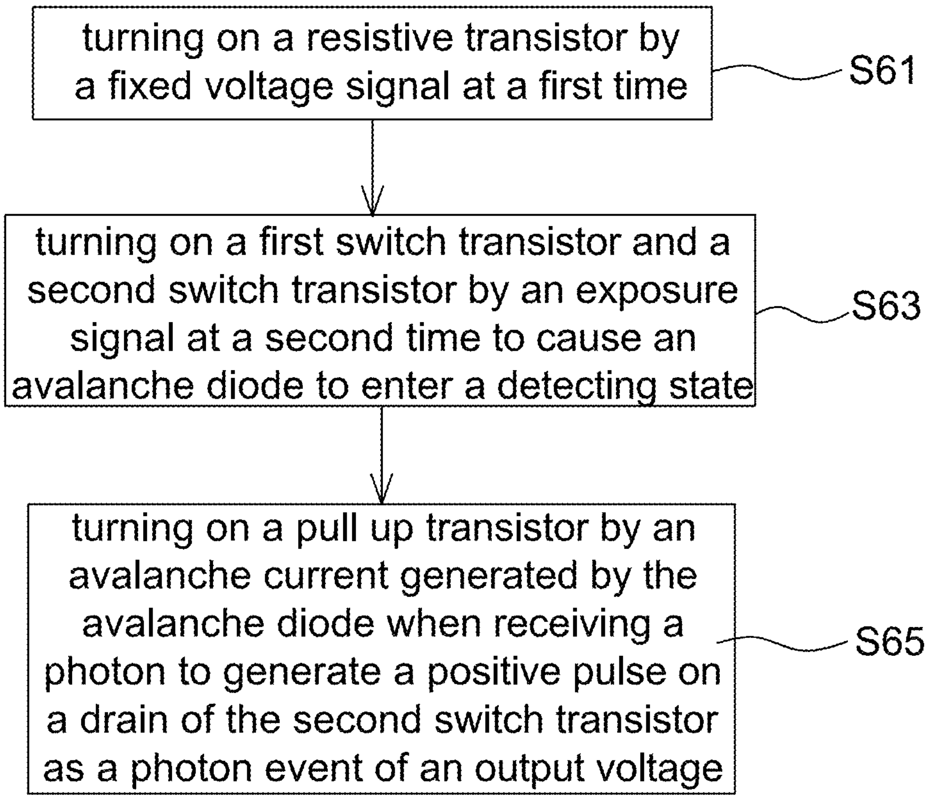
FIG. 6 is a flow chart of an image sensor according to a second embodiment of the present disclosure.

During an exposure period, corresponding to each incident photon, the operation of the pixel circuit 111 repeats the process from the first time t1 to time t6 in FIG. 6. For example, the counter 13 counts four negative pulses as the detection result within the exposure period in FIG. 2.

Figure 4:
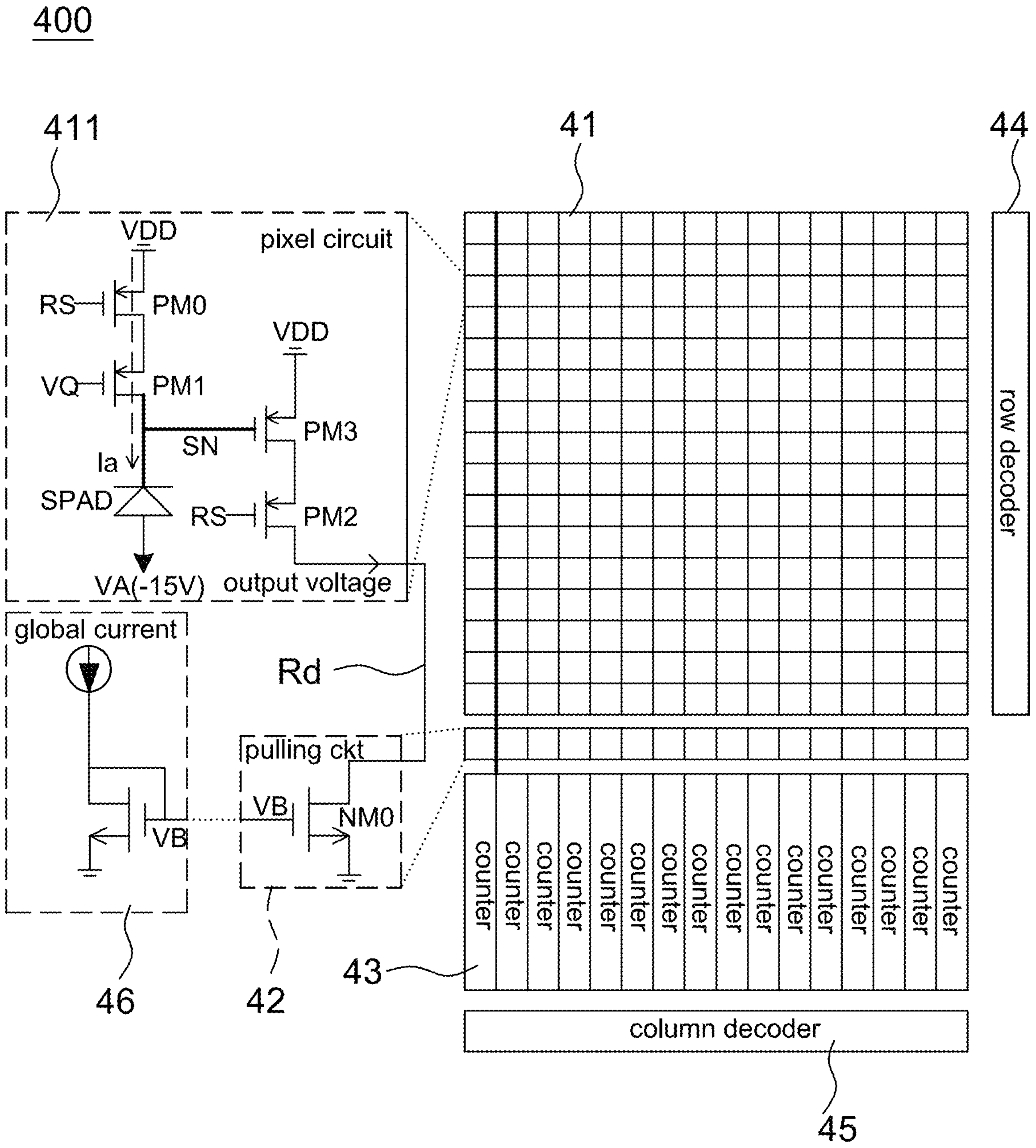
FIG. 4 is a schematic diagram of an image sensor according to a second embodiment of the present disclosure.

Referring to FIG. 4, it is a schematic diagram of an image sensor 400 according to a second embodiment of the present disclosure. The image sensor 400 is also used to detect extremely weak light and high frequency signals, and thus a single photon avalanche diode (SPAD) is employed to detect photon events. A processor generates an image frame by counting photon events of every pixel to perform the object tracking, gesture recognition, 3D image construction, and biological feature detection and recognition.

The image sensor 400 includes a pixel array 41, a plurality of pulling circuits 42, a plurality of counters 43, a row decoder 44, a column decoder 45 and a global current source circuit 46, wherein the row decoder 44 and the column decoder 45 are also used to determine a pixel position in the pixel array 41 that is being exposed and outputting a detected signal (e.g., pulses mentioned below).

The pixel array 41 includes a plurality of pixel circuits 411 (e.g., FIG. 4 also showing 16×16 pixels as an example) arranged in a matrix. Each of the plurality of pixel circuits 411 has an avalanche diode SPAD and four P-type transistors including a resistive transistor PM1, a first switch transistor PM0, a pull up transistor PM3 and a second switch transistor PM2.

The avalanche diode SPAD is a single photon avalanche diode, and has an anode and a cathode. The anode is connected to a negative bias voltage VA, e.g., −15V, but not limited to. The cathode is connected to a node SN. When a voltage difference (or bias) between the cathode and the anode exceeds a breakdown voltage of the avalanche diode SPAD, an avalanche current Ia is generated. In the second embodiment, the resistive transistor PM1 and the first switch transistor PM0 of the pixel circuit 411 are used to form a quenching circuit, which causes the voltage difference between the cathode and the anode to be lower than the breakdown voltage for quenching when the avalanche diode SPAD generates the avalanche current Ia. The pull up transistor PM3 and the second switch transistor PM2 of the pixel circuit 411 are used to form a readout circuit, which reads an output voltage of the pixel circuit 411 to a corresponding column counter 43.

A drain of the resistive transistor PM1 is connected to the node SN to connect to the cathode of the avalanche diode SPAD. A gate of the resistive transistor PM1 is used to receive a fixed voltage signal VQ and be turned on or off thereby. In the second embodiment, the resistive transistor PM1 is used to form a controllable resistor, and resistance of the controllable resistor is determined according to a voltage value of the fixed voltage signal VQ. When the avalanche diode SPAD receives a photon in the detecting state and the first switch transistor PM0 is conducted, a voltage drop is formed on the resistive transistor PM1 to cause the voltage difference between the cathode and the anode of the avalanche diode SPAD to be lower than the breakdown voltage for the quenching.

A drain of the first switch transistor PM0 is connected to a source of the resistive transistor PM1. A gate of the first switch transistor PM0 is used to receive an exposure signal RS, which is a row selection signal and, for example, generated by the row decoder 44. A source of the first switch transistor PM0 is connected to a system voltage VDD.

A gate of the pull up transistor PM3 is connected to the node SN to connect to the cathode of the avalanche diode SPAD. A source of the pull up transistor PM3 is connected to the system voltage VDD. The pull up transistor PM3 is used as a charging path of a voltage on the node SN, and a charging speed is determined according to resistance of the resistive transistor PM1 and stray capacitance of the circuit. The resistance and the stray capacitance are values determined in circuit manufacturing.

A gate of the second switch transistor PM2 also receives the exposure signal RS, and controlled by the exposure signal RS to be turned on or off together with the first switch transistor PM0. A source of the second switch transistor PM2 is connected to a drain of the pull up transistor PM3. A drain of the second switch transistor PM2 is used to generate an output voltage of the associated pixel circuit 411.

Each of the plurality of pulling circuits 42 is used to connect to the drain of the second switch transistor PM2 of each pixel circuit 411 in one pixel circuit column via a readout line Rd for reading the output voltage. For example, the image sensor 400 further includes a multiplexer or multiple switching devices to allow the pulling circuit 42 corresponding to each pixel circuit column to be connected to different pixel circuits 411 via the multiplexer or different switching devices. In the second embodiment, each of the pulling circuits 42 includes an N-type transistor NM0 used to pull down the output voltage after reading out a pulse in the output voltage (illustrated by an example below). A drain of the N-type transistor NM0 is connected to the drain of the second switch transistor PM2. A source of the N-type transistor NM0 is connected to a ground voltage. A gate of the N-type transistor NM0 is used to receive a control signal VB.

The global current source circuit 46 is used to form a current mirror with each of the plurality of pulling circuits 42. The image sensor 400 is arranged with only one global current source circuit 46. For example, the image sensor 400 further includes a multiplexer or multiple switching devices to allow the global current source circuit 46 to be coupled to different pulling circuits 42 via the multiplexer or different switching devices. The global current source circuit 46 includes an N-type transistor whose drain and gate are connected together and connected to a global current source. A source of the N-type transistor is connected to the ground voltage.

Each of the plurality of counters 43 is coupled to one pixel circuit column for counting photon events in the output voltage from each pixel circuit 411 of the coupled pixel circuit column.

Figure 5:
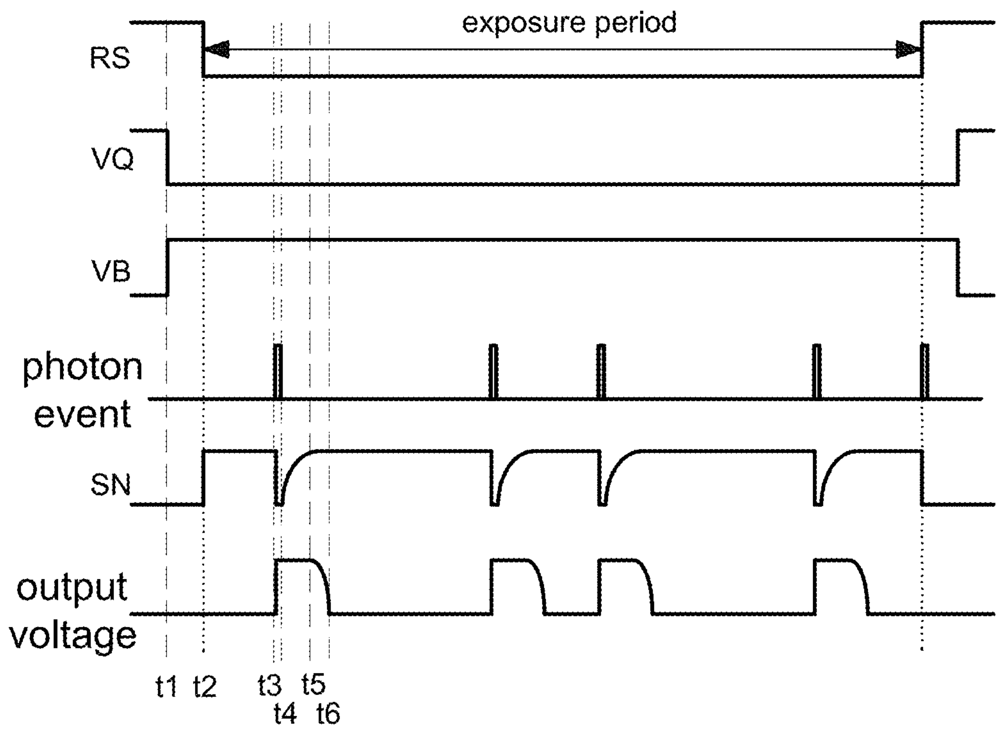
FIG. 5 is an operational timing diagram of an image sensor according to a second embodiment of the present disclosure.

Referring to FIGS. 5 and 6, FIG. 5 is an operational timing diagram of an image sensor 400 according to a second embodiment of the present disclosure; and FIG. 6 is a flow chart of an image sensor 400 according to a second embodiment of the present disclosure. The operating method of the image sensor 400 includes: turning on a resistive transistor by a fixed voltage signal at a first time (Step S61); turning on a first switch transistor and a second switch transistor by an exposure signal at a second time to cause an avalanche diode to enter a detecting state (Step S63); and turning on a pull up transistor by an avalanche current generated by the avalanche diode when receiving a photon to generate a positive pulse on a drain of the second switch transistor as a photon event of an output voltage (Step S65).

Referring to FIGS. 4 to 6 together, details of this operating method are illustrated below. Although this operating method illustrates the operation of one pixel circuit 411, it is appreciated that every pixel circuit 411 in the same pixel circuit column has an operation identical to FIGS. 5 and 6 only occurring at a different time based on the row selection signal.

Step S61: At a first time t1, the fixed voltage signal VQ is switched to a low voltage level to turn on the resistive transistor PM1 of a pixel circuit 411. Meanwhile, as the first switch transistor PM0 is not turned on yet, a voltage drop is not generated on the resistive transistor PM1. At the first time t1, the control signal VB is switched to a high voltage level to turn on the N-type transistor of the pulling circuit 42 (now the pulling circuit 42 being coupled to the corresponding pixel circuit 411 via a switching device or multiplexer).

Step S63: At a second time t2, the exposure signal RS is switched to a low voltage level to turn on the first switch transistor PM0 and the second switch transistor PM2 together. In the second embodiment, a low level interval of the exposure signal RS is referred to an exposure period within which each photon event is counted by the column counter 43. After the first switch transistor PM0 is conducted, as the resistive transistor PM1 has been turned on at the first time t1, a voltage on the node SN is pulled up to a high voltage level. In the second embodiment, the first time t1 is prior to the second time t2 by a predetermined interval as a setting interval of the resistive transistor PM1. In addition, during an interval between the second time t2 and the time t3, although the second switch transistor PM2 is conducted, the output voltage is still kept at a low voltage level because the pull up transistor PM3 is not turned on yet.

Step S65: Within the exposure period, the SPAD is in the detecting state when the avalanche diode SPAD does not receive any photon (e.g., an interval between t2 and t3 in FIG. 5), wherein the voltage on the node SN and the output voltage are respectively kept at a high voltage level and a low voltage level. When the avalanche diode SPAD receives a photon (e.g., at time t3 in FIG. 5), the avalanche diode SPAD generates an avalanche current Ia flowing through the resistive transistor PM1 to form a voltage drop thereon to cause the voltage on the node SN to change to a low voltage level to turn on the pull up transistor PM3. Meanwhile, the drain of the second switch transistor NM2 is connected to the system voltage VDD via the second switch transistor PM2 and the pull up transistor PM3 to cause the output voltage to generate a positive pulse as a photon event of the output voltage. Meanwhile, as the voltage on the node SN is changed to a low voltage level to cause the voltage difference between the cathode and the anode of the avalanche diode SPAD to be smaller than the breakdown voltage, the quenching is started.

Next, the voltage on the node SN starts to be charged at time t4 via the pull up transistor PM3, and the pull up transistor PM3 is automatically turned off (e.g., at time t5 in FIG. 5) after a charge interval, and the avalanche diode SPAD returns to a detecting state, wherein said charge interval is determined according to the resistance of the resistive transistor PM1 and the stray capacitance of the circuit. As mentioned above, said resistance of the resistive transistor PM1 and the stray capacitance are determined in a circuit design stage so as to determine a time interval of the avalanche diode SPAD returning to the detecting state.

Finally, after the pull up transistor PM3 is automatically turned off, the pulling circuit 42 pulls down the output voltage back to a low voltage level to return to an original level at time t6. In this way, one quenching and reading cycle is accomplished.

During an exposure period, corresponding to each incident photon, the operation of the pixel circuit 411 repeats the process from the first time t1 to time t6 in FIG. 6. For example, the counter 43 counts four positive pulses as the detection result within the exposure period in FIG. 5.

Figure 7:
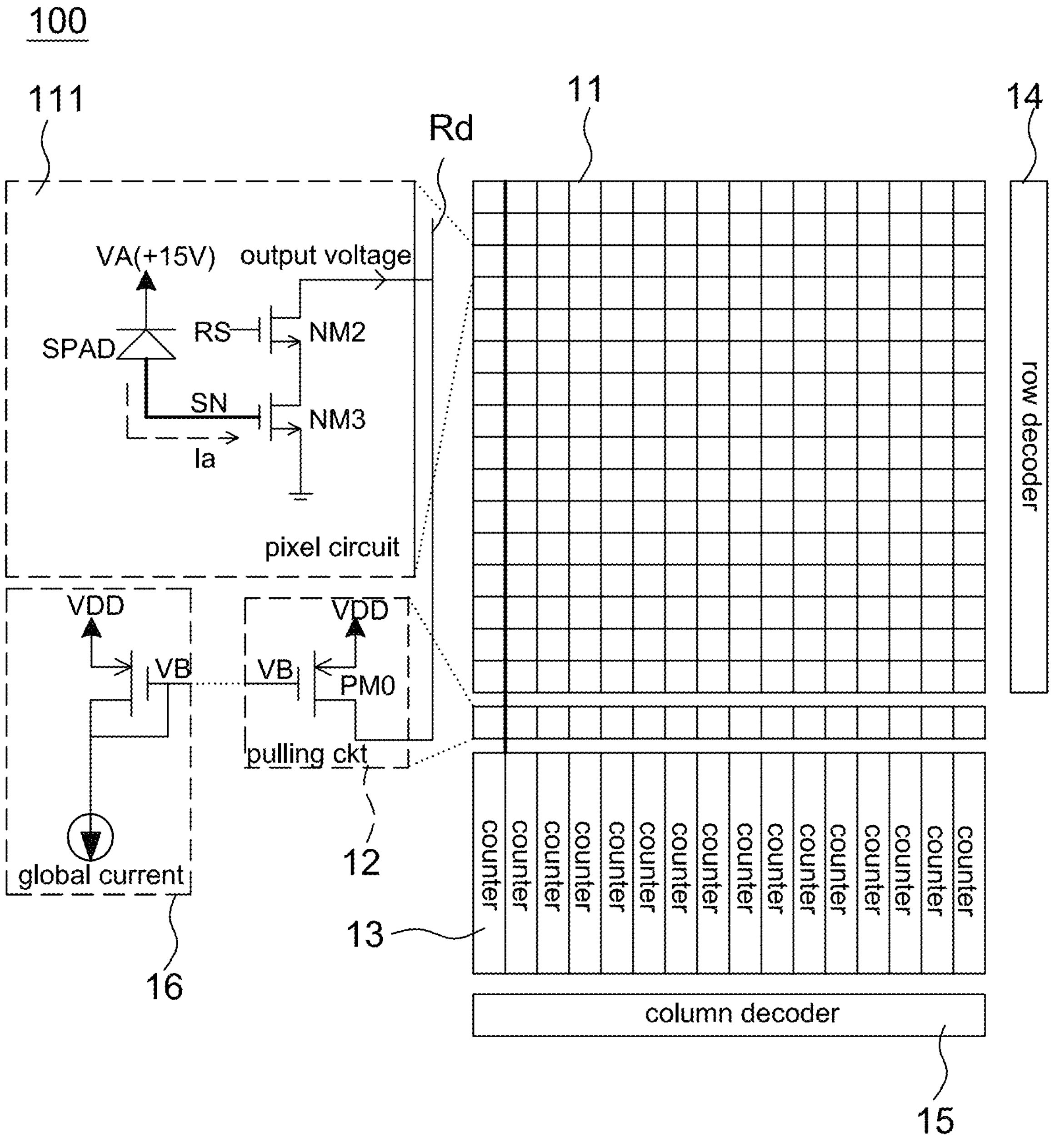
FIG. 7 is a schematic diagram of an image sensor according to a third embodiment of the present disclosure.
Figure 8:
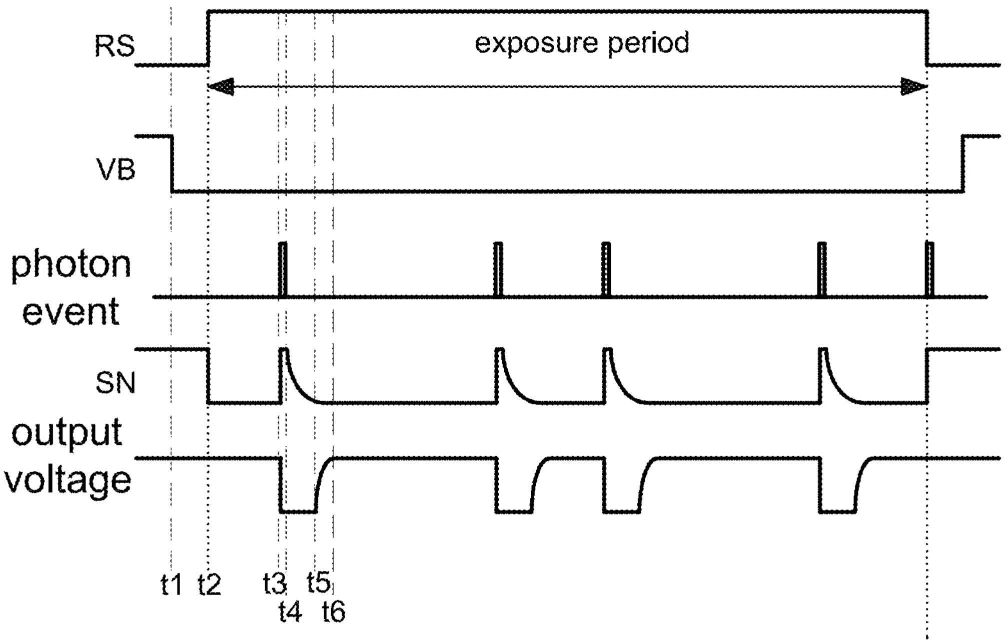
FIG. 8 is an operational timing diagram of an image sensor according to a third embodiment of the present disclosure.

Although the first and second embodiments mentioned above are described in the way that each pixel circuit includes four transistors, the present disclosure is not limited thereto. Referring to FIGS. 7 and 8, FIG. 7 is a schematic diagram of an image sensor 100 according to a third embodiment of the present disclosure; and FIG. 8 is an operational timing diagram of an image sensor 100 according to a third embodiment of the present disclosure.

In the third embodiment, the image sensor 100 also includes a pixel array 11, a plurality of pulling circuits 12, a plurality of counters 13, a row decoder 14, a column decoder 15 and a global current source circuit 16. The pixel array 11 also includes a plurality of pixel circuits 111.

Each pixel circuit 111 includes an avalanche diode SPAD and at least a transistor NM3. A cathode of SPAD is connected to a positive bias voltage VA, e.g., +15V, but not limited to. An anode of SPAD is connected to a node SN that connects to a gate of the transistor NM3. Each of the plurality of pulling circuits 12 is configured to be coupled to a drain of the transistor NM3 of each pixel circuit 111 of one pixel circuit column via a readout line Rd.

Furthermore, to control the pixel circuit 111 in one pixel circuit column to detect a photo event sequentially, each pixel circuit 111 further includes another transistor NM2 connected between the transistor NM3 and the readout line Rd. Operations of the image sensor 100 is shown in FIG. 8 and similar to that of the first embodiment, only without the transistors NM1 and NM0, and thus details thereof are not repeated herein. Functions of the plurality of pulling circuits 12, the plurality of counters 13, the row decoder 14, the column decoder 15 and the global current source circuit 16 are identical to those of the first embodiment.

Figure 9:
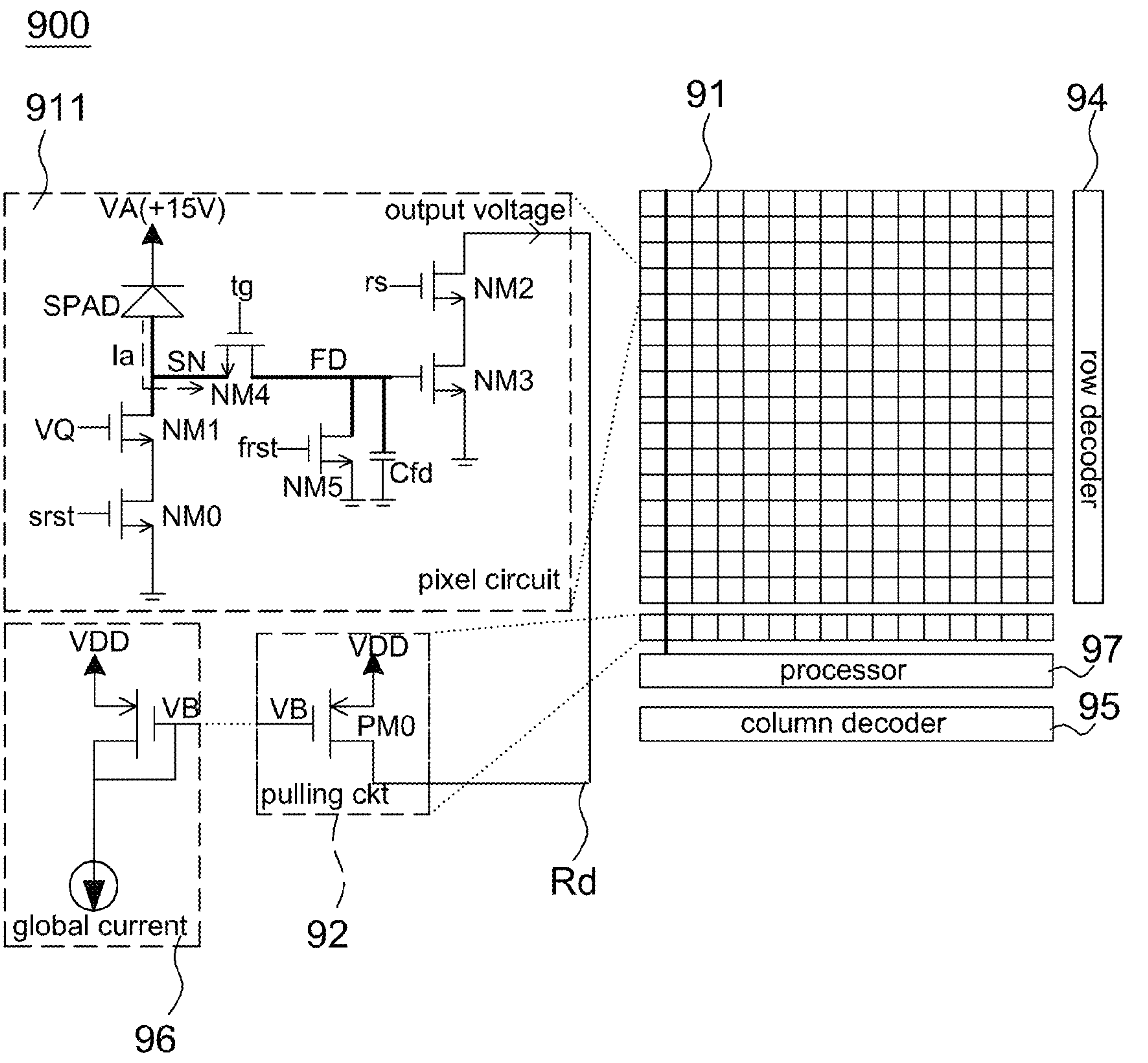
FIG. 9 is a schematic diagram of an image sensor according to a fourth embodiment of the present disclosure.

Referring to FIG. 9, it is a schematic diagram of an image sensor 900 according to a fourth embodiment of the present disclosure. The image sensor 900 is used to combine multiple bit planes outputted by a pixel array 91 corresponding to multiple exposure periods to generate an image frame for the object tracking, gesture recognition, 3D image construction, and biological feature detection and recognition.

The image sensor 900 includes a pixel array 91, a plurality of pulling circuits 92, a row decoder 94, a column decoder 95, a global current source circuit 96 and a processor 97. As mentioned above, the row decoder 94 and the column decoder 95 are used to determine a pixel position in the pixel array 91 that is being exposed and read.

The pixel array 91 includes a plurality of pixel circuits 911 (e.g., FIG. 9 showing 16×16 pixels as an example) arranged in a matrix. Each of the plurality of pixel circuits 911 has an avalanche diode SPAD and a resistive transistor NM1, a first switch transistor NM0, an exposure transistor NM4, a pull down transistor NM3 and a second switch transistor NM2.

The avalanche diode SPAD is a single photon avalanche diode, and has an anode and a cathode. The cathode is connected to a positive bias voltage VA, e.g., +15V, but not limited to. The anode is connected to a first node SN. When a voltage difference (or bias) between the cathode and the anode exceeds a breakdown voltage of the avalanche diode SPAD, an avalanche current Ia is generated to charge the first node SN. The pull down transistor NM3 and the second switch transistor NM2 of the pixel circuit 911 are used to form a readout circuit, which reads an output voltage of the pixel circuit 911 to the processor 97.

A drain of the resistive transistor NM1 is connected to the first node SN to couple to the anode of the avalanche diode SPAD. A gate of the resistive transistor NM1 is used to receive a fixed voltage signal VQ and be turned on or off thereby. As mentioned above, the resistive transistor NM1 is used to form a controllable resistor, and resistance of the controllable resistor is determined according to a voltage value of the fixed voltage signal VQ. When the avalanche diode SPAD receives a photon in the detecting state, a voltage on the first node SN rises to cause the voltage difference between the cathode and the anode of the avalanche diode SPAD to be smaller than the breakdown voltage such that the quenching occurs.

A drain of the first switch transistor NM0 is connected to a source of the resistive transistor NM1. A gate of the first switch transistor NM0 is used to receive a first reset signal srst. A source of the first switch transistor NM0 is connected to a ground voltage.

A source of the exposure transistor NM4 is connected to the first node SN. A drain of the exposure transistor NM4 is connected to a second node FD (as a floating diffusion). A gate of the exposure transistor NM4 receives an exposure signal tg for determining an exposure period Texp of the pixel circuit 911 (referring to FIGS. 10 and 11).

A gate of the pull down transistor NM3 is connected to the second node FD. A source of the pull down transistor NM3 is connected to the ground voltage.

A gate of the second switch transistor NM2 receives a readout signal rs, which is, for example, a row selection signal and generated by the row decoder 94. A source of the second switch transistor NM2 is connected to a drain of the pull down transistor NM3. A drain of the second switch transistor NM2 is used to generate an output voltage of the associated pixel circuit 911.

Each of the plurality of pulling circuits 92 is used to connect to the drain of the second switch transistor NM2 of each pixel circuit 911 in one pixel circuit column via a readout line Rd for reading the output voltage. For example, the image sensor 900 further includes a multiplexer or multiple switching devices to allow the pulling circuit 92 corresponding to each pixel circuit column to be connected to different pixel circuits 911 via the multiplexer or different switching devices. In the fourth embodiment, each of the pulling circuits 92 includes a P-type transistor PM0 used to pull up the output voltage after reading out the output voltage. A drain of the P-type transistor PM0 is connected to the drain of the second switch transistor NM2 via the readout line Rd. A source of the P-type transistor PM0 is connected to a system voltage VDD, which is identical to or different from the positive bias voltage VA. A gate of the P-type transistor PM0 is used to receive a control signal VB.

The global current source circuit 96 is used to form a current mirror with each of the plurality of pulling circuits 92. The image sensor 900 is arranged with only one global current source circuit 96. For example, the image sensor 900 further includes a multiplexer or multiple switching devices to allow the global current source circuit 96 to be coupled to different pulling circuits 92 via the multiplexer or different switching devices. The global current source circuit 96 includes a P-type transistor whose drain and gate are connected together and connected to a global current source. A source of the P-type transistor is connected to the system voltage VDD.

In one aspect, when the first reset signal srst is resetting a voltage on the first node SN, the exposure transistor NM4 is turned on to reset a voltage on the second node FD at the same time. To shorten a time interval for resetting the first node SN, in the aspect shown in FIG. 9, each pixel circuit 911 further includes a reset transistor NM5 for resetting the second node FD using a second reset signal first separated from resetting the first node SN. A gate of the reset transistor NM5 receives the second reset signal frst. A drain of the reset transistor NM5 is connected to the second node FD. A source of the reset transistor NM5 is connected to the ground voltage.

The stray capacitance of the second node FD is used to store a voltage of one photon event from the avalanche diode SPAD within the exposure period Texp. In the aspect shown in FIG. 9, each pixel circuit 911 further includes a capacitor Cfd connected between the second node FD and the ground voltage for temporarily storing the voltage associated with the one photon event.

That is, in the fourth embodiment, the reset transistor NM5 and the capacitor Cfd are optional.

Figure 10:
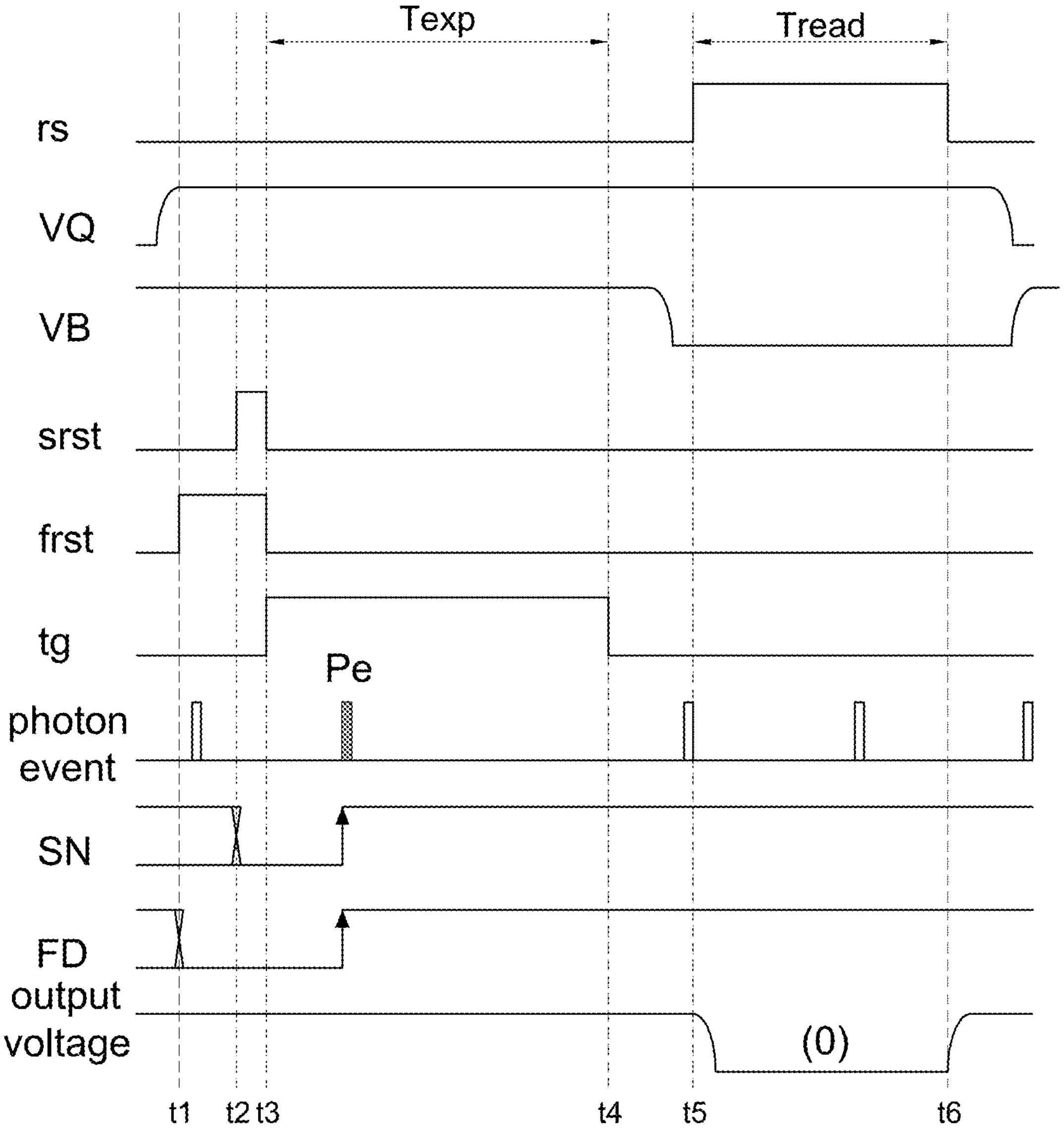
FIG. 10 is an operational timing diagram of an image sensor according to a fourth embodiment of the present disclosure, in which one photon event occurs within an exposure period.
Figure 11:
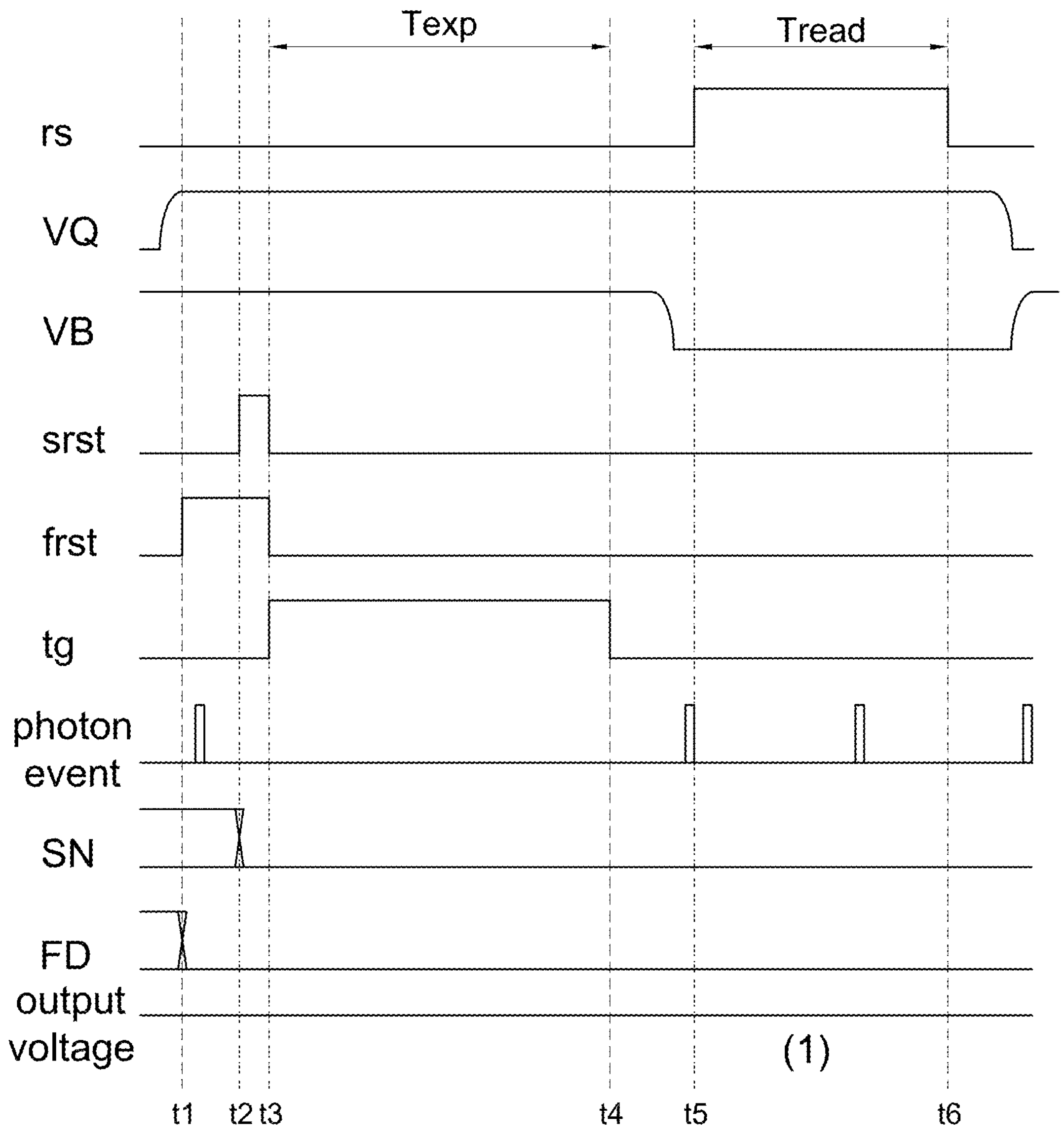
FIG. 11 is another operational timing diagram of an image sensor according to a fourth embodiment of the present disclosure, in which no photon event occurs within an exposure period.

Referring to FIGS. 9 to 11, FIGS. 10 and 11 are operational timing diagrams of an image sensor 900 according to a fourth embodiment of the present disclosure. The operating method of the image sensor 900 includes: turning on a resistive transistor by a fixed voltage signal at a first time (Step S91); turning on a reset transistor by a second reset signal at the first time to reset a second node to low (Step S92); turning on a first switch transistor by a first reset signal at a second time to reset a first node to low (Step S93); turning on and off an exposure transistor by an exposure signal respectively at a third time and a fourth time to form an exposure period (Step S94); and turning on a second switch transistor by a readout signal at a fifth time to read a voltage on the second node as an output voltage (Step S95).

Figure 12:
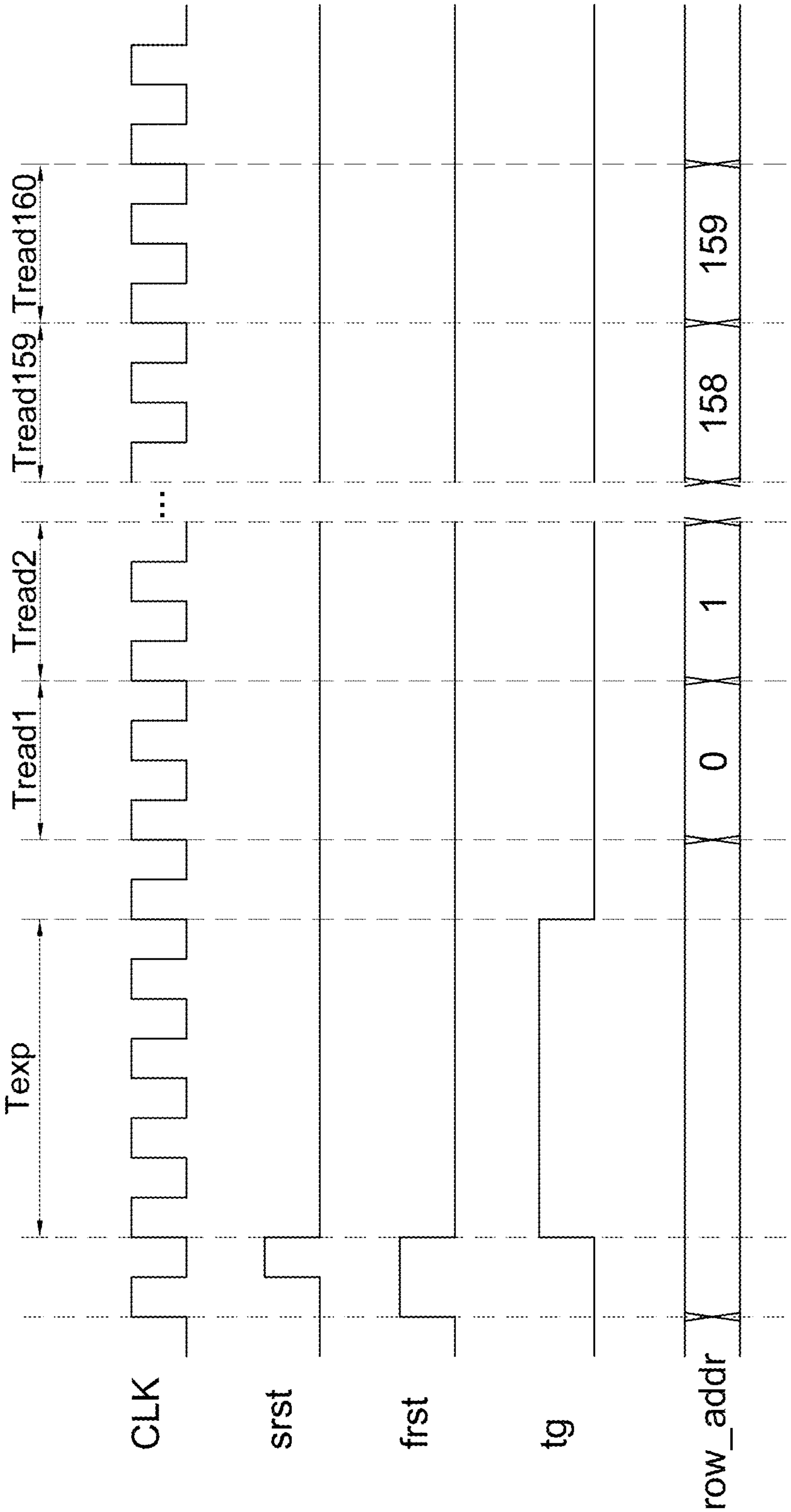
FIG. 12 is a schematic diagram of the exposure period and readout periods of an image sensor according to one embodiment of the present disclosure.

Referring to FIGS. 9 to 11 together, details of this operating method are illustrated below. Although this operating method illustrates the operation of one pixel circuit 911, it is appreciated that every pixel circuit 911 in the same pixel circuit column has an operation identical to FIGS. 10 and 11 only the readout period Tread occurs at a different time based on the row selection signal as shown in FIG. 12.

Steps S91-S92: At a first time t1, the fixed voltage signal VQ is switched to a high voltage level to turn on the resistive transistor NM1 of a pixel circuit 911. Also at the first time t1, the second reset signal frst is switched to a high voltage level to reset the second node FD to a low voltage level. It should be mentioned that a time at which the second reset signal frst is transferred to the high voltage level may be behind the first time t1, but preferably prior to a second time t2.

Step S93: At the second time t2, the first reset signal srst is switched to a high voltage level to reset the first node SN to a low voltage level.

Step S94: At a third time t3, the exposure signal tg is switched to a high voltage level to start the exposure period Texp. Till a fourth time t4, the exposure signal tg is switched back to a low voltage level to end the exposure period Texp. Within the exposure period Texp, preferably only one photon event occurs in order to generate a bit plane. A length of the exposure period Texp is determined according to an expected value calculated according to light intensity in detection and element parameters.

When the avalanche diode SPAD receives a photon (e.g., shown as Pe) within the exposure period Texp, the first node SN and the second node FD are transferred to high voltage levels till the readout signal rs turns off the second switch transistor NM2.

When the avalanche diode SPAD does not receive any photon within the exposure period Texp, the first node SN and the second node FD are kept at low voltage levels till the readout signal rs turns off the second switch transistor NM2.

Step S95: At a time t5, the readout signal rs is switched to a high voltage level to start the readout period Tread. Within the readout period Tread, the second switch transistor NM2 is turned on. When the avalanche diode SPAD receives a photon (e.g., shown as Pe) within the exposure period Texp, the second node FD is high so as to turn on the pull down transistor NM3 such that the output voltage turns to a low voltage level for indicating one photon event, i.e. the pixel circuit 911 outputting 0 as shown in FIG. 10. When the avalanche diode SPAD does not receive any photon within the exposure period Texp, the second node FD is low without turning on the pull down transistor NM3 such that the output voltage keeps at a high voltage level for indicating no photon event, i.e. the pixel circuit 911 outputting 1 as shown in FIG. 11.

Next, between the time t4 and the time t5, the P-type transistor of the pulling circuit 92 is turned on. At a time t6, the readout signal rs is transferred to a low voltage level to turn off the second switch transistor NM2 such that the pulling circuit 92 pulls up the output voltage.

Referring to FIG. 12, it is a schematic diagram of the exposure period Texp and the readout period Tread of an image sensor according to one embodiment of the present disclosure. In the present disclosure, exposure periods Texp of all pixel circuits of a pixel array are synchronized, and different pixel circuit rows of the pixel array are sequentially read according to a corresponding readout signal rs, i.e. using global exposure and sequentially readout. For example, FIG. 12 shows an operating method of a pixel array having 16 pixel rows. Within the exposure period Texp, all pixel circuits of the pixel array are exposed together to detect photon events which are temporarily stored in the respective second node FD. In the first readout period Tread1, output voltages of the first pixel circuit row (row address shown as 0) are read; in the second readout period Tread2, output voltages of the second pixel circuit row (row address shown as 1) are read; and so on. After output voltages of all pixel circuits of the pixel array (e.g., 91 or 131) are read, one bit plane is generated. Each pixel of the bit plane is 1 (indicating the corresponding pixel circuit not receiving or receiving one photon) or 0 (indicating the corresponding pixel circuit receiving or not receiving one photon), referring to FIGS. 10-11 or FIGS. 14-15. The processor combines multiple (e.g., more than 100, which is determined according to a length of exposure period Texp and ambient light intensity) bit planes to generate an image frame for the post-processing.

Figure 13:
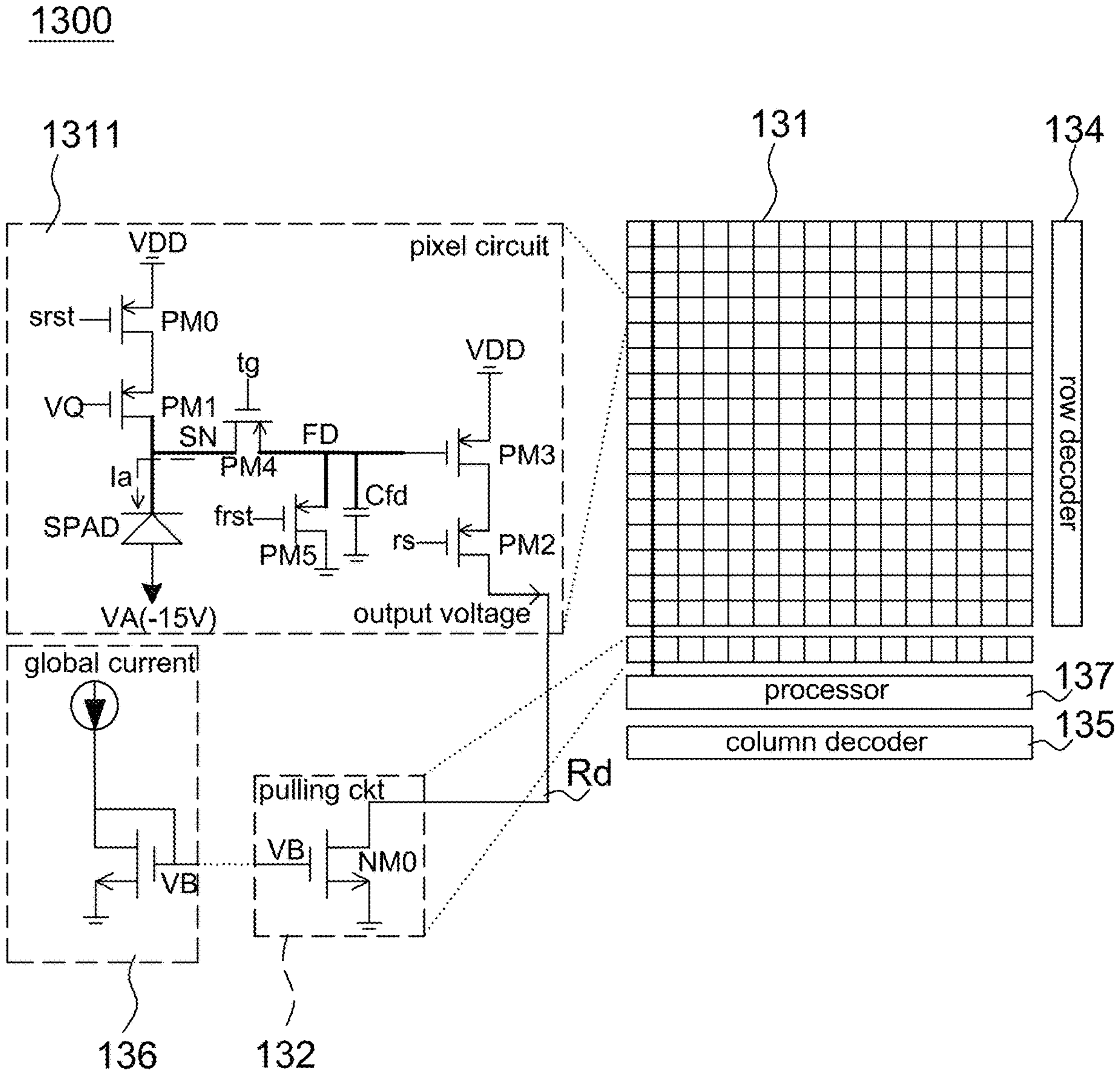
FIG. 13 is a schematic diagram of an image sensor according to a fifth embodiment of the present disclosure.

Referring to FIG. 13, it is a schematic diagram of an image sensor 1300 according to a fifth embodiment of the present disclosure. The image sensor 1300 is also used to combine multiple bit planes outputted by a pixel array 131 corresponding to multiple exposure periods to generate an image frame for the object tracking, gesture recognition, 3D image construction, and biological feature detection and recognition.

The image sensor 1300 includes a pixel array 131, a plurality of pulling circuits 132, a row decoder 134, a column decoder 135, a global current source circuit 136 and a processor 137. As mentioned above, the row decoder 134 and the column decoder 135 are used to determine a pixel position in the pixel array 131 that is being exposed and read.

The pixel array 131 includes a plurality of pixel circuits 1311 (e.g., FIG. 13 showing 16×16 pixels as an example) arranged in a matrix. Each of the plurality of pixel circuits 1311 has an avalanche diode SPAD and a resistive transistor PM1, a first switch transistor PM0, an exposure transistor PM4, a pull up transistor PM3 and a second switch transistor PM2.

The avalanche diode SPAD is a single photon avalanche diode, and has an anode and a cathode. The anode is connected to a negative bias voltage VA, e.g., −15V, but not limited to. The cathode is connected to a first node SN. When a voltage difference (or bias) between the cathode and the anode exceeds a breakdown voltage of the avalanche diode SPAD, an avalanche current Ia is generated to discharge the first node SN. The pull up transistor PM3 and the second switch transistor PM2 of the pixel circuit 1311 are used to form a readout circuit, which reads an output voltage of the pixel circuit 1311 to the processor 137.

A drain of the resistive transistor PM1 is connected to the first node SN to couple to the cathode of the avalanche diode SPAD. A gate of the resistive transistor PM1 is used to receive a fixed voltage signal VQ and be turned on or off thereby. As mentioned above, the resistive transistor PM1 is used to form a controllable resistor, and resistance of the controllable resistor is determined according to a voltage value of the fixed voltage signal VQ. When the avalanche diode SPAD receives a photon in the detecting state, a voltage on the first node SN falls to cause the voltage difference between the cathode and the anode of the avalanche diode SPAD to be smaller than the breakdown voltage such that the quenching occurs.

A drain of the first switch transistor PM0 is connected to a source of the resistive transistor PM1. A gate of the first switch transistor PM0 is used to receive a first reset signal srst. A source of the first switch transistor PM0 is connected to a system voltage VDD.

A drain of the exposure transistor PM4 is connected to the first node SN. A source of the exposure transistor PM4 is connected to a second node FD (as a floating diffusion). A gate of the exposure transistor PM4 receives an exposure signal tg for determining an exposure period Texp of the pixel circuit 1311 (referring to FIGS. 14 and 15).

A gate of the pull up transistor PM3 is connected to the second node FD. A source of the pull up transistor PM3 is connected to the system voltage VDD.

A gate of the second switch transistor PM2 receives a readout signal rs, which is, for example, a row selection signal and generated by the row decoder 134. A source of the second switch transistor PM2 is connected to a drain of the pull up transistor PM3. A drain of the second switch transistor PM2 is used to generate an output voltage of the associated pixel circuit 1311.

Each of the plurality of pulling circuits 132 is used to connect to the drain of the second switch transistor PM2 of each pixel circuit 1311 in one pixel circuit column via a readout line Rd for reading the output voltage. For example, the image sensor 1300 further includes a multiplexer or multiple switching devices to allow the pulling circuit 132 corresponding to each pixel circuit column to be connected to different pixel circuits 1311 via the multiplexer or different switching devices. In the fifth embodiment, each of the pulling circuits 132 includes an N-type transistor NM0 used to pull down the output voltage after reading out the output voltage. A drain of the N-type transistor NM0 is connected to the drain of the second switch transistor PM2 via the readout line Rd. A source of the N-type transistor NM0 is connected to a ground voltage. A gate of the N-type transistor NM0 is used to receive a control signal VB.

The global current source circuit 136 is used to form a current mirror with each of the plurality of pulling circuits 132. The image sensor 1300 is arranged with only one global current source circuit 136. For example, the image sensor 1300 further includes a multiplexer or multiple switching devices to allow the global current source circuit 136 to be coupled to different pulling circuits 132 via the multiplexer or different switching devices. The global current source circuit 136 includes an N-type transistor whose drain and gate are connected together and connected to a global current source. A source of the N-type transistor is connected to the ground voltage.

In one aspect, when the first reset signal srst is resetting a voltage on the first node SN, the exposure transistor PM4 is turned on to reset a voltage on the second node FD at the same time. To shorten a time interval for resetting the first node SN, in the aspect shown in FIG. 13, each pixel circuit 1311 further includes a reset transistor PM5 for resetting the second node FD using a second reset signal frst separated from resetting the first node SN. A gate of the reset transistor PM5 receives the second reset signal frst. A source of the reset transistor PM5 is connected to the second node FD. A drain of the reset transistor PM5 is connected to the ground voltage.

The stray capacitance of the second node FD is used to store a voltage of one photon event from the avalanche diode SPAD within the exposure period Texp. In the aspect shown in FIG. 13, each pixel circuit 1311 further includes a capacitor Cfd connected between the second node FD and the ground voltage for temporarily storing the voltage associated with the one photon event.

That is, in the fifth embodiment, the reset transistor PM5 and the capacitor Cfd are optional.

Figure 14:
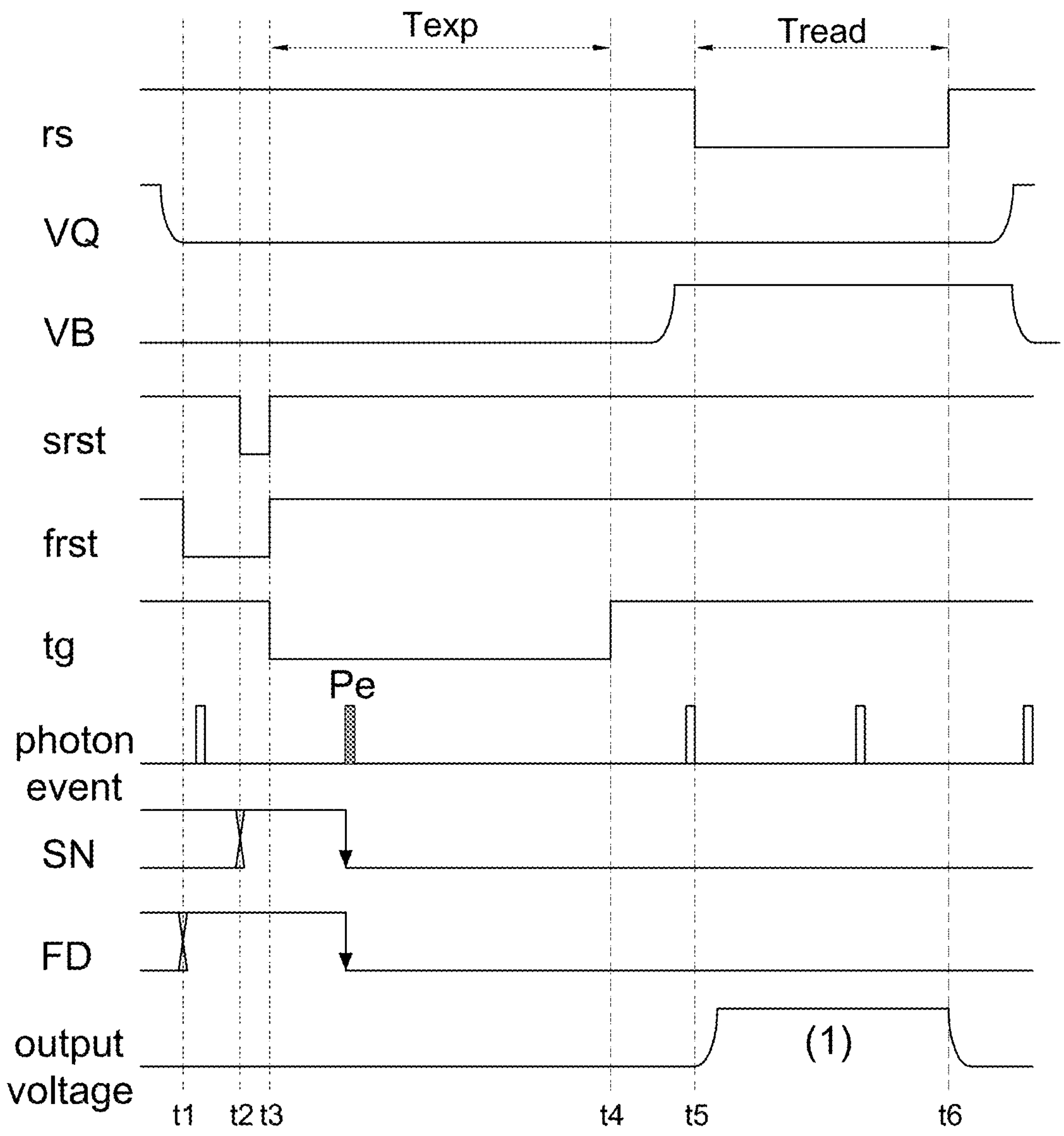
FIG. 14 is an operational timing diagram of an image sensor according to a fifth embodiment of the present disclosure, in which one photon event occurs within an exposure period.
Figure 15:
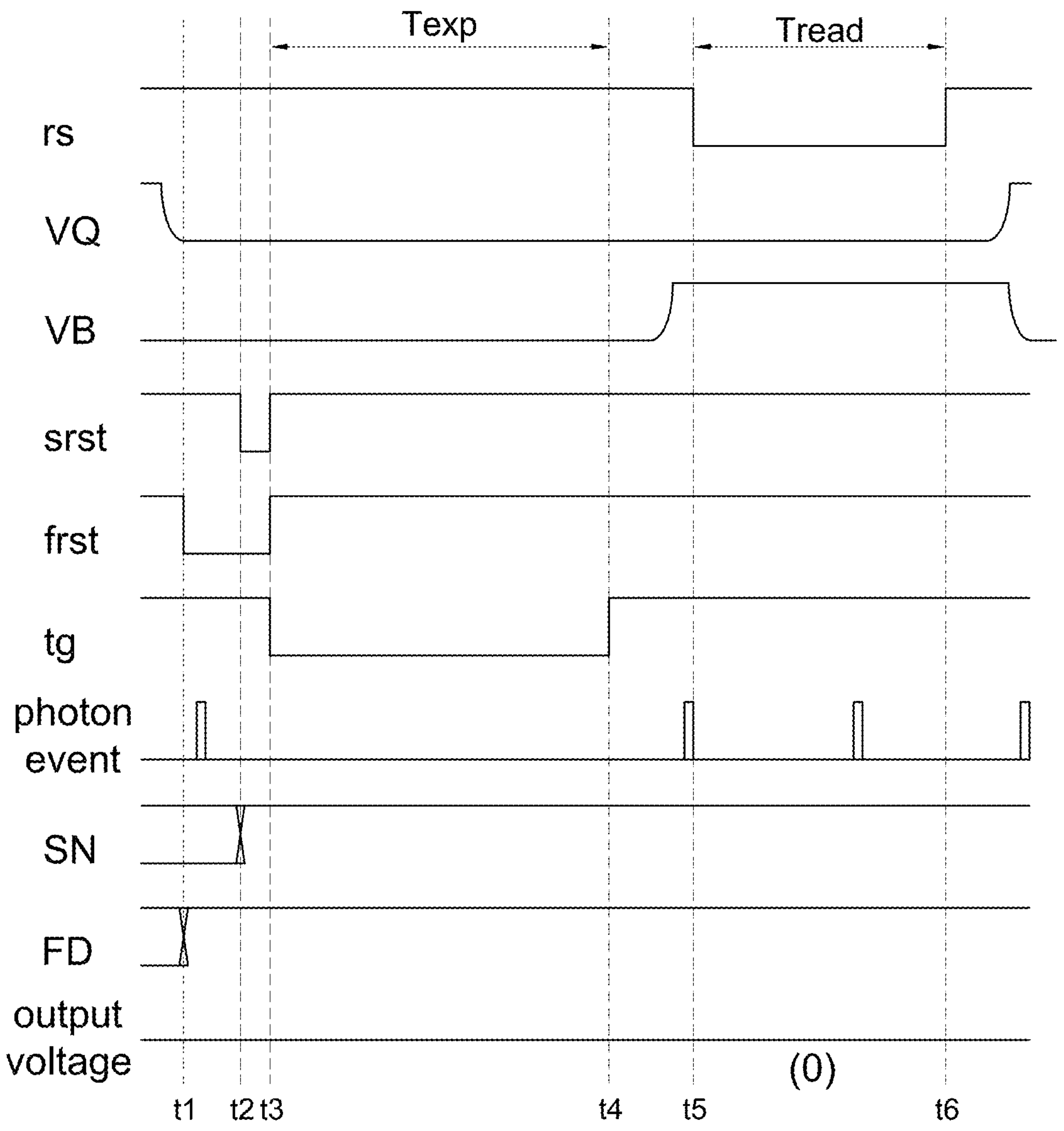
FIG. 15 is another operational timing diagram of an image sensor according to a fifth embodiment of the present disclosure, in which no photon event occurs within an exposure period.

Referring to FIGS. 13 to 15, FIGS. 14 and 15 are operational timing diagrams of an image sensor 1300 according to a fifth embodiment of the present disclosure. The operating method of the image sensor 1300 includes: turning on a resistive transistor by a fixed voltage signal at a first time (Step S131); turning on a reset transistor by a second reset signal at the first time to reset a second node to high (Step S132); turning on a first switch transistor by a first reset signal at a second time to reset a first node to high (Step S133); turning on and off an exposure transistor by an exposure signal respectively at a third time and a fourth time to form an exposure period (Step S134); and turning on a second switch transistor by a readout signal at a fifth time to read a voltage on the second node as an output voltage (Step S135).

Referring to FIGS. 13 to 15 together, details of this operating method are illustrated below. Although this operating method illustrates the operation of one pixel circuit 1311, it is appreciated that every pixel circuit 1311 in the same pixel circuit column has an operation identical to FIGS. 14 and 15 only the readout period Tread occurs at a different time based on the row selection signal as shown in FIG. 12.

Steps S131-S132: At a first time t1, the fixed voltage signal VQ is switched to a low voltage level to turn on the resistive transistor PM1 of a pixel circuit 1311. Also at the first time t1, the second reset signal frst is switched to a low voltage level to reset the second node FD to a high voltage level. It should be mentioned that a time at which the second reset signal frst is transferred to the low voltage level may be behind the first time t1, but preferably prior to a second time t2.

Step S133: At the second time t2, the first reset signal srst is switched to a low voltage level to reset the first node SN to a high voltage level.

Step S134: At a third time t3, the exposure signal tg is switched to a low voltage level to start the exposure period Texp. Till a fourth time t4, the exposure signal tg is switched back to a high voltage level to end the exposure period Texp. Within the exposure period Texp, preferably only one photon event occurs in order to generate a bit plane. A length of the exposure period Texp is determined according to an expected value calculated according to light intensity in detection and element parameters.

When the avalanche diode SPAD receives a photon (e.g., shown as Pe) within the exposure period Texp, the first node SN and the second node FD are transferred to low voltage levels till the readout signal rs turns off the second switch transistor PM2.

When the avalanche diode SPAD does not receive any photon within the exposure period Texp, the first node SN and the second node FD are kept at high voltage levels till the readout signal rs turns off the second switch transistor PM2.

Step S135: At a time t5, the readout signal rs is switched to a low voltage level to start the readout period Tread. Within the readout period Tread, the second switch transistor PM2 is turned on. When the avalanche diode SPAD receives a photon (e.g., shown as Pe) within the exposure period Texp, the second node FD is low so as to turn on the pull up transistor PM3 such that the output voltage turns to a high voltage level for indicating one photon event, i.e. the pixel circuit 1311 outputting 1 as shown in FIG. 14. When the avalanche diode SPAD does not receive any photon within the exposure period Texp, the second node FD is high without turning on the pull up transistor PM3 such that the output voltage keeps at a low voltage level for indicating no photon event, i.e. the pixel circuit 1311 outputting 0 as shown in FIG. 15.

Next, between the time t4 and the time t5, the N-type transistor of the pulling circuit 132 is turned on. At a time t6, the readout signal rs is transferred to a high voltage level to turn off the second switch transistor PM2 such that the pulling circuit 132 pulls down the output voltage.

Photon evens not within the exposure period Texp is not recorded by the pixel circuit 911 or 1311.

Figure 16:
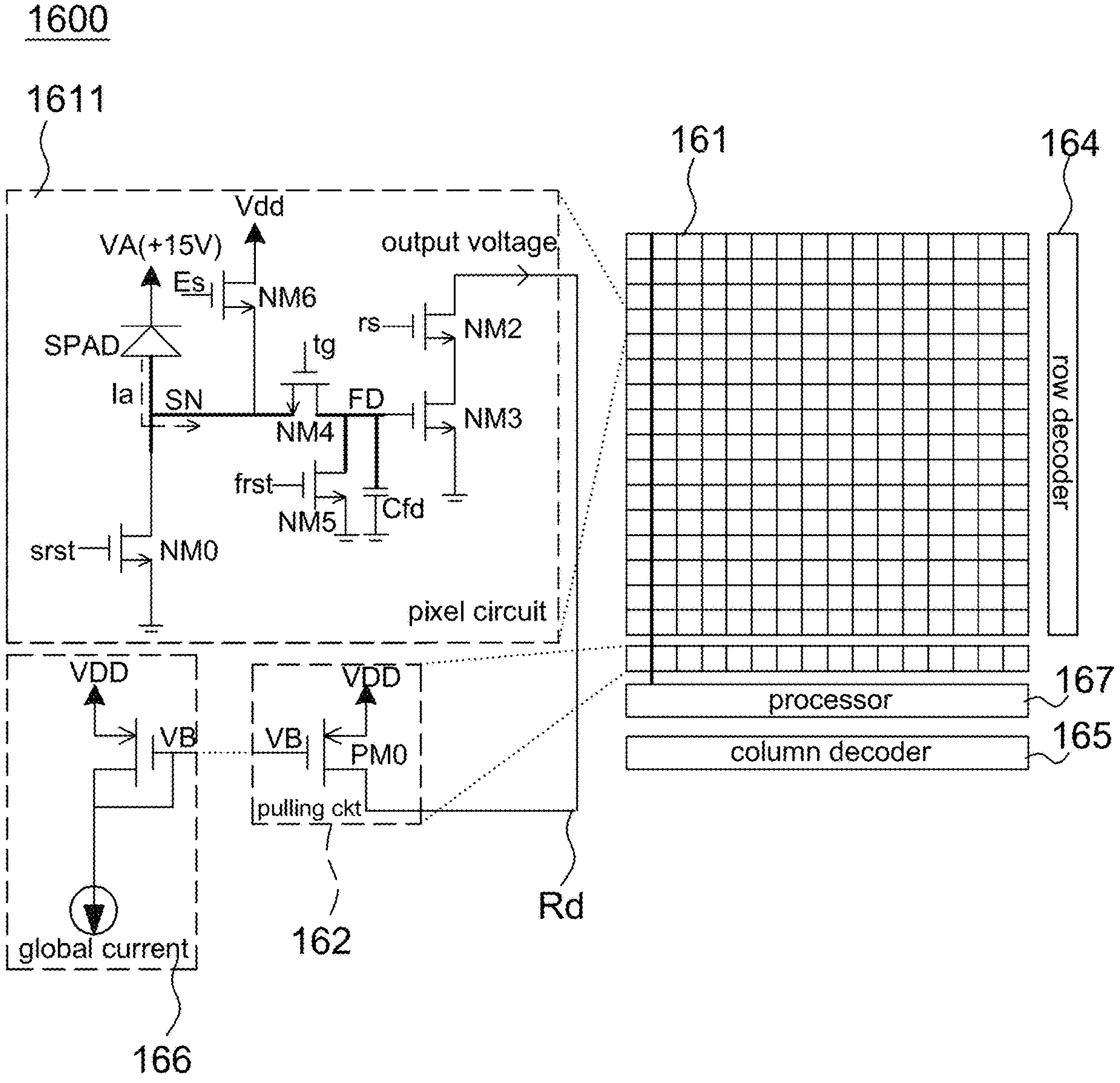
FIG. 16 is a schematic diagram of an image sensor according to a sixth embodiment of the present disclosure.

Referring to FIG. 16, it is a schematic diagram of an image sensor 1600 according to a sixth embodiment of the present disclosure. The image sensor 1600 is also used to combine (e.g., by the processor 167) multiple bit planes outputted by a pixel array 161 corresponding to multiple exposure periods to generate an image frame for the object tracking, gesture recognition, 3D image construction, and biological feature detection and recognition.

The image sensor 1600 includes a pixel array 161, a plurality of pulling circuits 162, a row decoder 164, a column decoder 165, a global current source circuit 166 and a processor 167. As mentioned above, the row decoder 164 and the column decoder 165 are used to determine a pixel position in the pixel array 161 that is being exposed and read.

The pixel array 161 includes a plurality of pixel circuits 1611 (e.g., FIG. 16 showing 16×16 pixels as an example) arranged in a matrix. Each of the pixel circuits 1611 has an avalanche diode SPAD and N-type transistors including an enable transistor NM6, a first switch transistor NM0, an exposure transistor NM4, a pull down transistor NM3 and a second switch transistor NM2.

The avalanche diode SPAD is a single photon avalanche diode, and has an anode and a cathode. The cathode is connected to a positive bias voltage VA, e.g., +15V, but not limited to. The anode is connected to a first node SN. When a voltage difference (or bias) between the cathode and the anode exceeds a breakdown voltage of the SPAD, an avalanche current Ia is generated to charge the first node SN. The pull down transistor NM3 and the second switch transistor NM2 of the pixel circuit 1611 are used to form a readout circuit, which reads an output voltage of the pixel circuit 1611 to the processor 167.

Figure 17:
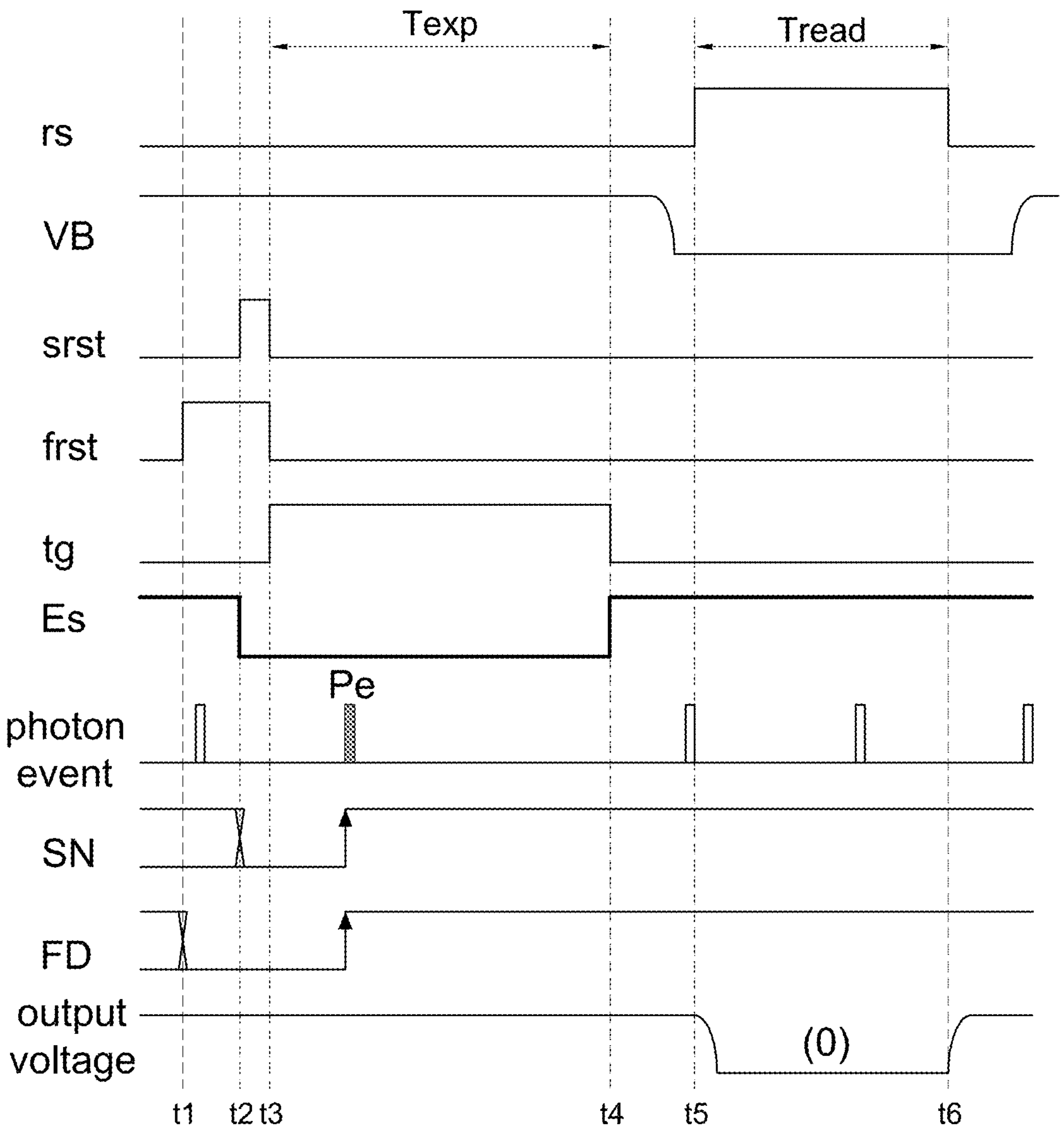
FIG. 17 is an operational timing diagram of an image sensor of FIG. 16, in which one photon event occurs within an exposure period.
Figure 18:
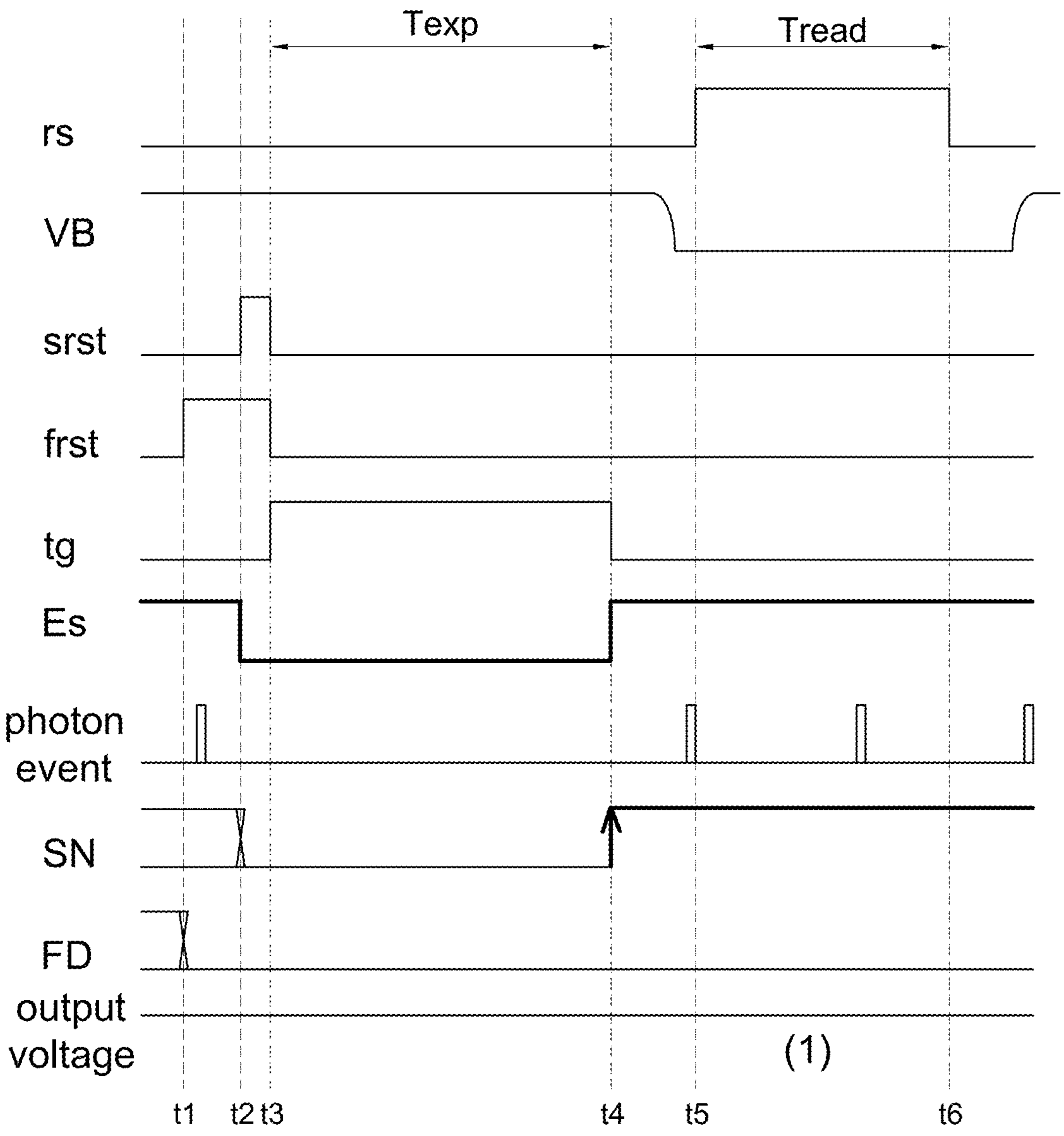
FIG. 18 is another operational timing diagram of an image sensor of FIG. 16, in which no photon event occurs within an exposure period.

A source of the enable transistor NM6 is connected to the first node SN to couple to the anode of the avalanche diode SPAD. A drain of the enable transistor NM6 is connected to a positive bias voltage Vdd, which is equal to or different from VA. A gate of the enable transistor NM6 is used to receive an enable signal Es to be turned on or off thereby. The enable signal Es is used to pull up a voltage on the first node SN when the pixel circuit 1611 is not in sampling or resetting to prevent the avalanche diode SPAD from avalanche, as shown in FIG. 18. When the avalanche diode SPAD receives a photon in the detecting state, a voltage on the first node SN rises to cause the voltage difference between the cathode and the anode of the avalanche diode SPAD to be smaller than the breakdown voltage such that the quenching occurs, as shown in FIG. 17.

A drain of the first switch transistor NM0 is connected to the first node SN. A gate of the first switch transistor NM0 is used to receive a first reset signal srst. A source of the first switch transistor NM0 is connected to a ground voltage.

A source of the exposure transistor NM4 is connected to the first node SN. A drain of the exposure transistor NM4 is connected to a second node FD (as a floating diffusion). A gate of the exposure transistor NM4 receives an exposure signal tg for determining an exposure period Texp of the pixel circuit 1611 (referring to FIGS. 17 and 18).

A gate of the pull down transistor NM3 is connected to the second node FD. A source of the pull down transistor NM3 is connected to the ground voltage.

A gate of the second switch transistor NM2 receives a readout signal rs, which is, for example, a row selection signal and generated by the row decoder 164. A source of the second switch transistor NM2 is connected to a drain of the pull down transistor NM3. A drain of the second switch transistor NM2 is used to generate an output voltage of the associated pixel circuit 1611.

Each of the plurality of pulling circuits 162 is used to connect to the drain of the second switch transistor NM2 of each pixel circuit 1611 in one pixel circuit column via a readout line Rd for reading the output voltage. For example, the image sensor 1600 further includes a multiplexer or multiple switching devices to allow the pulling circuit 162 corresponding to each pixel circuit column to be connected to different pixel circuits 1611 via the multiplexer or different switching devices. In the sixth embodiment, each of the pulling circuits 162 includes a P-type transistor PM0 used to pull up the output voltage after reading out the output voltage. A drain of the P-type transistor PM0 is connected to the drain of the second switch transistor NM2 via the readout line Rd. A source of the P-type transistor PM0 is connected to a system voltage VDD, which is identical to or different from the positive bias voltage VA. A gate of the P-type transistor PM0 is used to receive a control signal VB.

The global current source circuit 166 is used to form a current mirror with each of the plurality of pulling circuits 162. The image sensor 1600 is arranged with only one global current source circuit 166, which has the same arrangement as that in the fourth embodiment and thus details thereof are not repeated herein.

In one aspect, when the first reset signal srst is resetting a voltage on the first node SN, the exposure transistor NM4 is turned on to reset a voltage on the second node FD at the same time. To shorten a time interval for resetting the first node SN, in the aspect shown in FIG. 16, each pixel circuit 1611 further includes a reset transistor NM5 for resetting the second node FD using a second reset signal frst separated from resetting the first node SN. A gate of the reset transistor NM5 receives the second reset signal frst. A drain of the reset transistor NM5 is connected to the second node FD. A source of the reset transistor NM5 is connected to the ground voltage.

The stray capacitance of the second node FD is used to store a voltage of one photon event from the avalanche diode SPAD within the exposure period Texp. In the aspect shown in FIG. 16, each pixel circuit 1611 further includes a capacitor Cfd connected between the second node FD and the ground voltage for temporarily storing the voltage associated with the one photon event.

In the sixth embodiment, the reset transistor NM5 and the capacitor Cfd are optional.

Referring to FIGS. 16 to 18, FIGS. 17 and 18 are operational timing diagrams of an image sensor 1600 according to a sixth embodiment of the present disclosure. The difference between FIG. 17 of the sixth embodiment and FIG. 10 of the fourth embodiment is that, FIG. 17 does not include the control signal VQ but further includes an enable signal Es, which transfers to Low at a second time t2 to turn off the enable transistor NM6 and transfers to High at a fourth time t4 to turn on the enable transistor NM6, and other parts are identical to FIG. 10, referring to Steps S91 to S95.

In the sixth embodiment, when the avalanche diode SPAD receives a photon (e.g., shown as Pe) within the exposure period Texp, the first node SN and the second node FD are transferred to high voltage levels till the readout signal rs turns off the second switch transistor NM2. When the avalanche diode SPAD does not receive any photon within the exposure period Texp, the second node FD is kept at a low voltage level till the readout signal rs turns off the second switch transistor NM2, but the first node SN it pulled up to a high voltage level when the enable transistor NM6 is turned on (e.g., at the fourth time t4). In this embodiment, a voltage to which the first node SN is pulled up by the enable transistor NM6 is higher than, lower than or equal to a voltage to which the first node SN is pulled up by a photon event according to values of VA, Vdd and breakdown voltage of SPAD. In other words, the voltage on the first node SN in FIG. 17 may be different prior to and behind the fourth time t4, and is not limited to be fixed as shown in FIG. 17.

Figure 22:
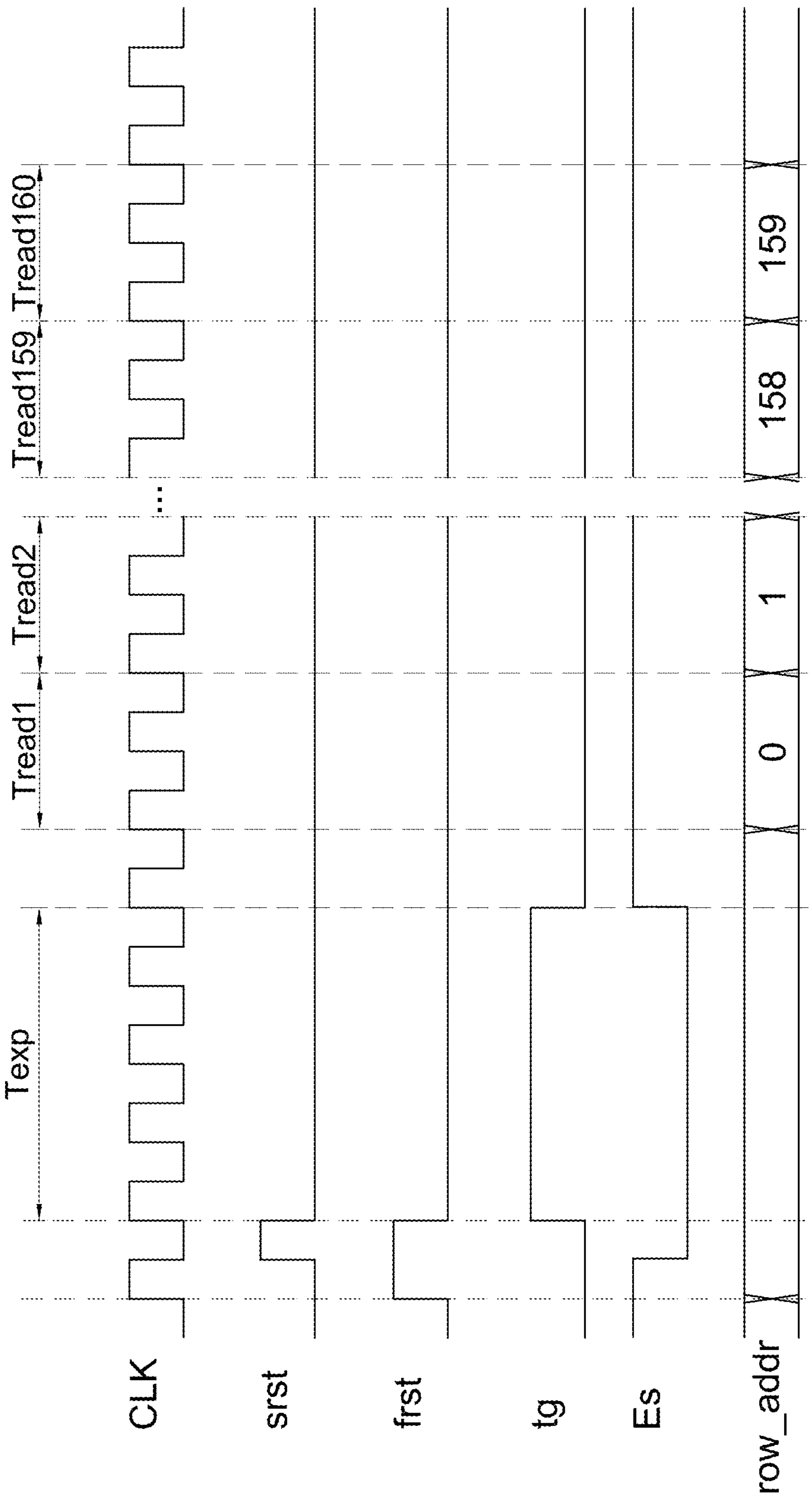
FIG. 22 is a schematic diagram of the exposure period and readout periods of an image sensor according to another embodiment of the present disclosure.

The exposure period Texp and readout periods Tread of the image sensor 1600 are referred to FIG. 22, which is different from FIG. 12 only with an enable signal Es being added, and other parts are identical to FIG. 12 and thus details thereof are not repeated again. As mentioned above, the enable signal Es is used to pull up a voltage on the first node SN after an exposure period Texp when the voltage on the first node SN is not pulled up by a photon event within the exposure period Texp.

Figure 19:
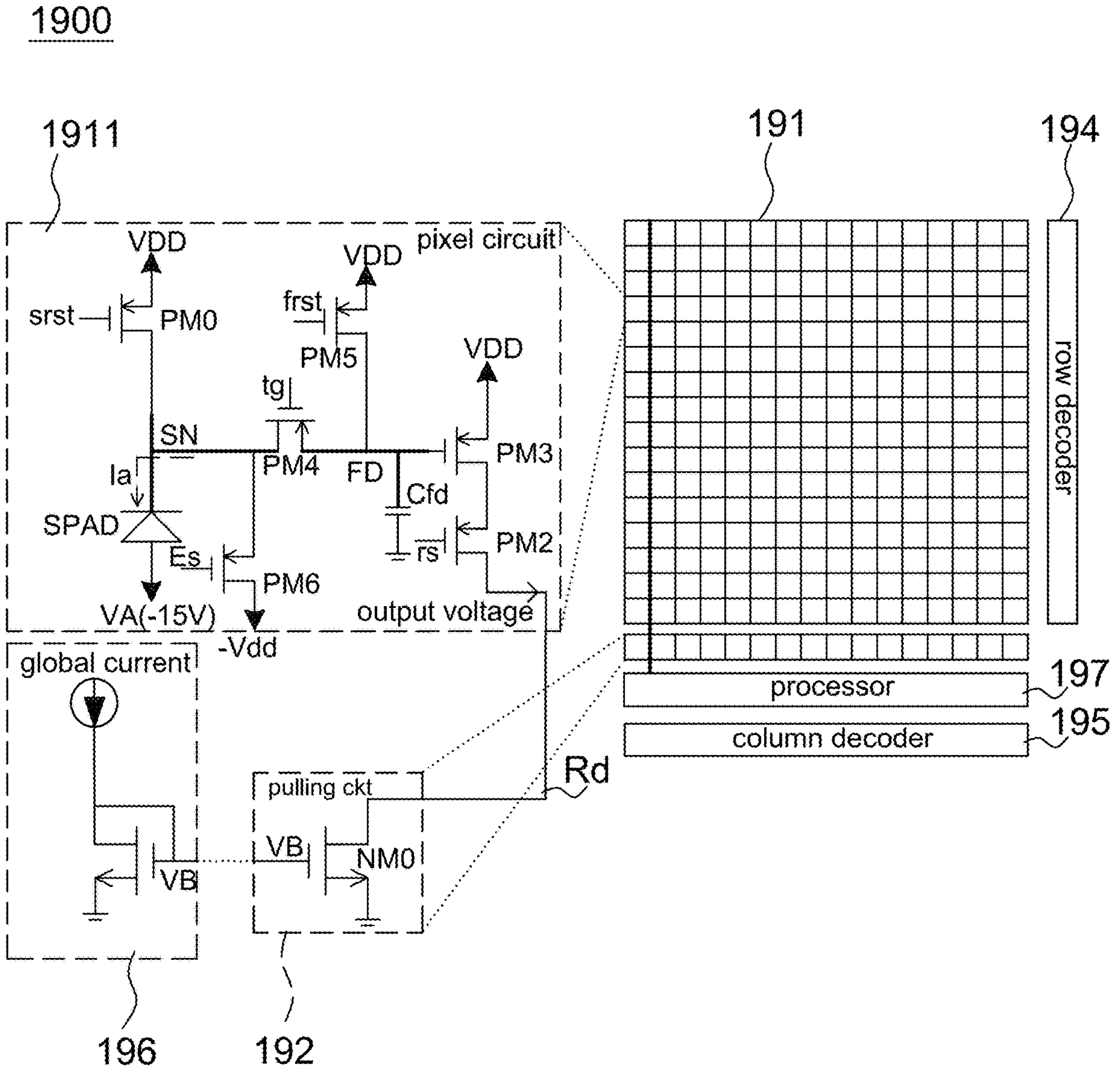
FIG. 19 is a schematic diagram of an image sensor according to a seventh embodiment of the present disclosure.

Referring to FIG. 19, it is a schematic diagram of an image sensor 1900 according to a seventh embodiment of the present disclosure. The image sensor 1900 is also used to combine (e.g., by the processor 197) multiple bit planes outputted by a pixel array 191 corresponding to multiple exposure periods to generate an image frame for the object tracking, gesture recognition, 3D image construction, and biological feature detection and recognition.

The image sensor 1900 includes a pixel array 191, a plurality of pulling circuits 192, a row decoder 194, a column decoder 195, a global current source circuit 196 and a processor 197. As mentioned above, the row decoder 194 and the column decoder 195 are used to determine a pixel position in the pixel array 191 that is being exposed and read.

The pixel array 191 includes a plurality of pixel circuits 1911 (e.g., FIG. 19 showing 16×16 pixels as an example) arranged in a matrix. Each of the pixel circuits 1911 has an avalanche diode SPAD and P-type transistors including an enable transistor PM6, a first switch transistor PM0, an exposure transistor PM4, a pull up transistor PM3 and a second switch transistor PM2.

The avalanche diode SPAD is a single photon avalanche diode, and has an anode and a cathode. The anode is connected to a negative bias voltage VA, e.g., −15V, but not limited to. The cathode is connected to a first node SN. When a voltage difference (or bias) between the cathode and the anode exceeds a breakdown voltage of the SPAD, an avalanche current Ia is generated to discharge the first node SN. The pull up transistor PM3 and the second switch transistor PM2 of the pixel circuit 1911 are used to form a readout circuit, which reads an output voltage of the pixel circuit 1911 to the processor 197.

Figure 20:
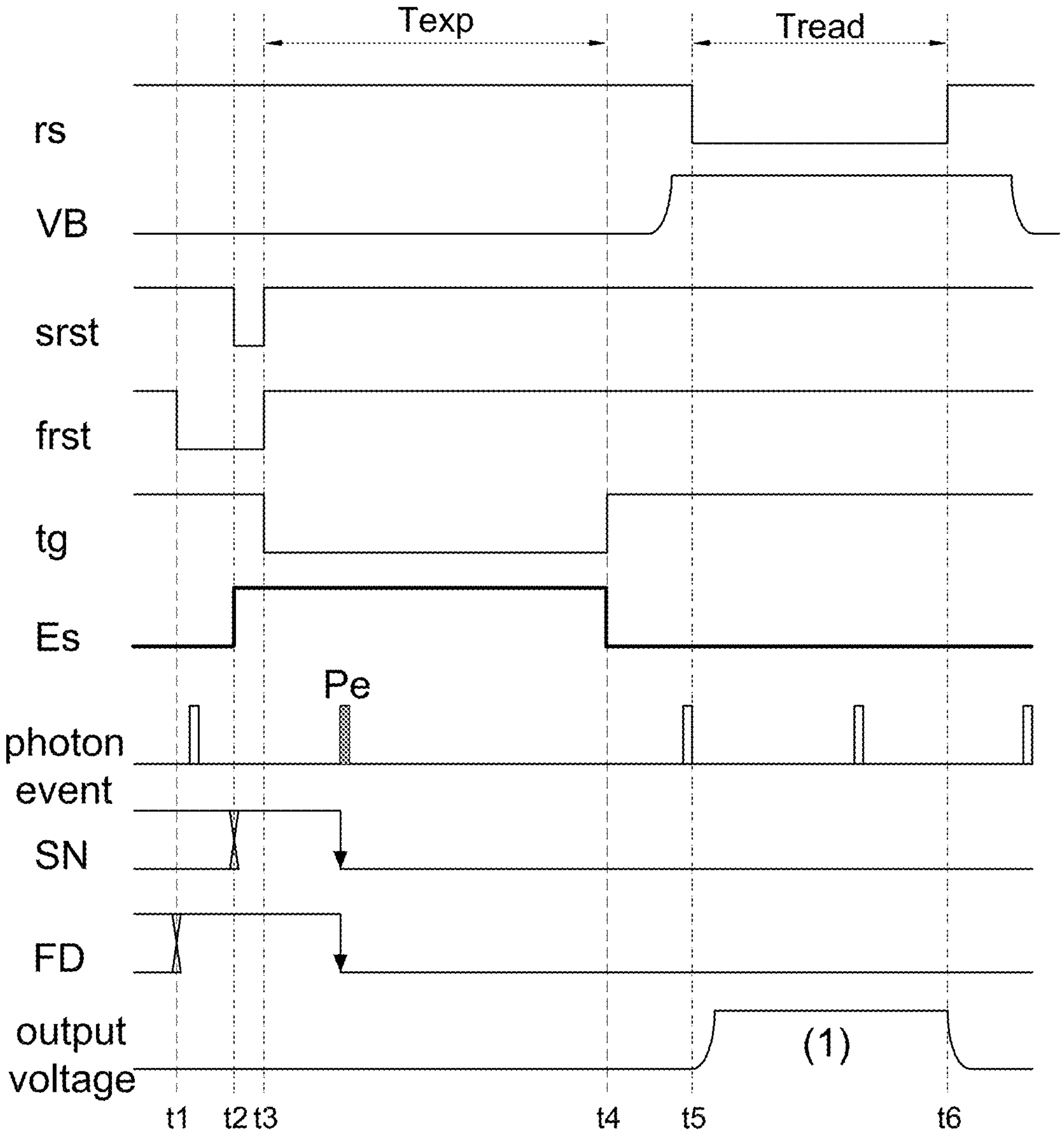
FIG. 20 is an operational timing diagram of an image sensor of FIG. 19, in which one photon event occurs within an exposure period.
Figure 21:
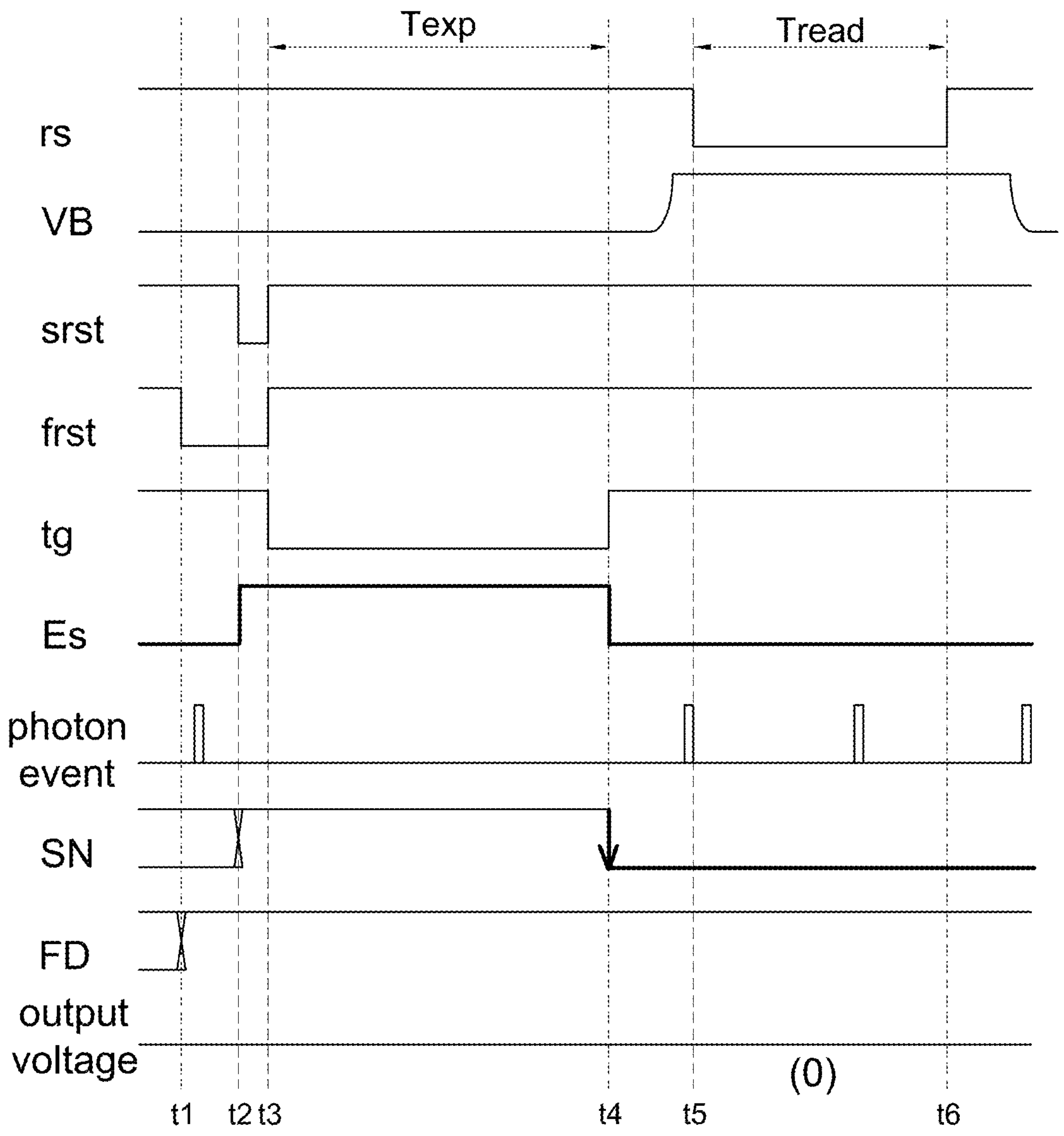
FIG. 21 is another operational timing diagram of an image sensor of FIG. 19, in which no photon event occurs within an exposure period.

A source of the enable transistor PM6 is connected to the first node SN to couple to the cathode of the avalanche diode SPAD. A drain of the enable transistor PM6 is connected to a negative bias voltage-Vdd, which is equal to or different from VA. A gate of the enable transistor PM6 is used to receive an enable signal Es to be turned on or off thereby. The enable signal Es is used to pull down a voltage on the first node SN when the pixel circuit 1911 is not in sampling or resetting to prevent the avalanche diode SPAD from avalanche, as shown in FIG. 21. When the avalanche diode SPAD receives a photon in the detecting state, a voltage on the first node SN falls to cause the voltage difference between the cathode and the anode of the avalanche diode SPAD to be smaller than the breakdown voltage such that the quenching occurs, as shown in FIG. 20.

A drain of the first switch transistor PM0 is connected to the first node SN. A gate of the first switch transistor PM0 is used to receive a first reset signal srst. A source of the first switch transistor PM0 is connected to a system voltage VDD.

A drain of the exposure transistor PM4 is connected to the first node SN. A source of the exposure transistor PM4 is connected to a second node FD (as a floating diffusion). A gate of the exposure transistor PM4 receives an exposure signal tg for determining an exposure period Texp of the pixel circuit 1911 (referring to FIGS. 20 and 21).

A gate of the pull up transistor PM3 is connected to the second node FD. A source of the pull up transistor PM3 is connected to the system voltage VDD.

A gate of the second switch transistor PM2 receives a readout signal rs, which is, for example, a row selection signal and generated by the row decoder 194. A source of the second switch transistor PM2 is connected to a drain of the pull up transistor PM3. A drain of the second switch transistor PM2 is used to generate an output voltage of the associated pixel circuit 1911.

Each of the plurality of pulling circuits 192 is used to connect to the drain of the second switch transistor PM2 of each pixel circuit 1911 in one pixel circuit column via a readout line Rd for reading the output voltage. For example, the image sensor 1900 further includes a multiplexer or multiple switching devices to allow the pulling circuit 192 corresponding to each pixel circuit column to be connected to different pixel circuits 1911 via the multiplexer or different switching devices. In the seventh embodiment, each of the pulling circuits 192 includes an N-type transistor NM0 used to pull down the output voltage after reading out the output voltage. A drain of the N-type transistor NM0 is connected to the drain of the second switch transistor PM2 via the readout line Rd. A source of the N-type transistor NM0 is connected to a ground voltage. A gate of the N-type transistor NM0 is used to receive a control signal VB.

The global current source circuit 196 is used to form a current mirror with each of the plurality of pulling circuits 192. The image sensor 1900 is arranged with only one global current source circuit 196, which has the same arrangement as that in the fifth embodiment and thus details thereof are not repeated herein.

In one aspect, when the first reset signal srst is resetting a voltage on the first node SN, the exposure transistor PM4 is turned on to reset a voltage on the second node FD at the same time. To shorten a time interval for resetting the first node SN, in the aspect shown in FIG. 19, each pixel circuit 1911 further includes a reset transistor PM5 for resetting the second node FD using a second reset signal frst separated from resetting the first node SN. A gate of the reset transistor PM5 receives the second reset signal frst. A drain of the reset transistor PM5 is connected to the second node FD. A source of the reset transistor PM5 is connected to the system voltage.

The stray capacitance of the second node FD is used to store a voltage of one photon event from the avalanche diode SPAD within the exposure period Texp. In the aspect shown in FIG. 19, each pixel circuit 1911 further includes a capacitor Cfd connected between the second node FD and the ground voltage for temporarily storing the voltage associated with the one photon event.

In the seventh embodiment, the reset transistor PM5 and the capacitor Cfd are optional.

Referring to FIGS. 19 to 21, FIGS. 20 and 21 are operational timing diagrams of an image sensor 1900 according to a seventh embodiment of the present disclosure. The difference between FIG. 20 of the seventh embodiment and FIG. 14 of the fifth embodiment is that, FIG. 20 does not include the control signal VQ but further includes an enable signal Es, which transfers to High at a second time t2 to turn off the enable transistor PM6 and transfers to Low at a fourth time t4 to turn on the enable transistor PM6, and other parts are identical to FIG. 14, referring to Steps S131 to S135.

In the seventh embodiment, when the avalanche diode SPAD receives a photon (e.g., shown as Pe) within the exposure period Texp, the first node SN and the second node FD are transferred to low voltage levels till the readout signal rs turns off the second switch transistor PM2. When the avalanche diode SPAD does not receive any photon within the exposure period Texp, the second node FD is kept at a high voltage level till the readout signal rs turns off the second switch transistor PM2, but the first node SN it pulled down to a low voltage level when the enable transistor PM6 is turned on (e.g., at the fourth time t4). In this embodiment, a voltage to which the first node SN is pulled down by the enable transistor PM6 is higher than, lower than or equal to a voltage to which the first node SN is pulled down by a photon event according to values of VA, Vdd and breakdown voltage of SPAD. In other words, the voltage on the first node SN in FIG. 20 may be different prior to and behind the fourth time t4, and is not limited to be fixed as shown in FIG. 20.

The exposure period Texp and readout periods Tread of the image sensor 1900 are also referred to FIG. 22, only changing high and low voltage levels of signals srst, frst, tg and Es.

Similarly, in the sixth embodiment and the seventh embodiment, photon evens not within the exposure period Texp is not recorded by the pixel circuit 1611 or 1911.

Figure 23:
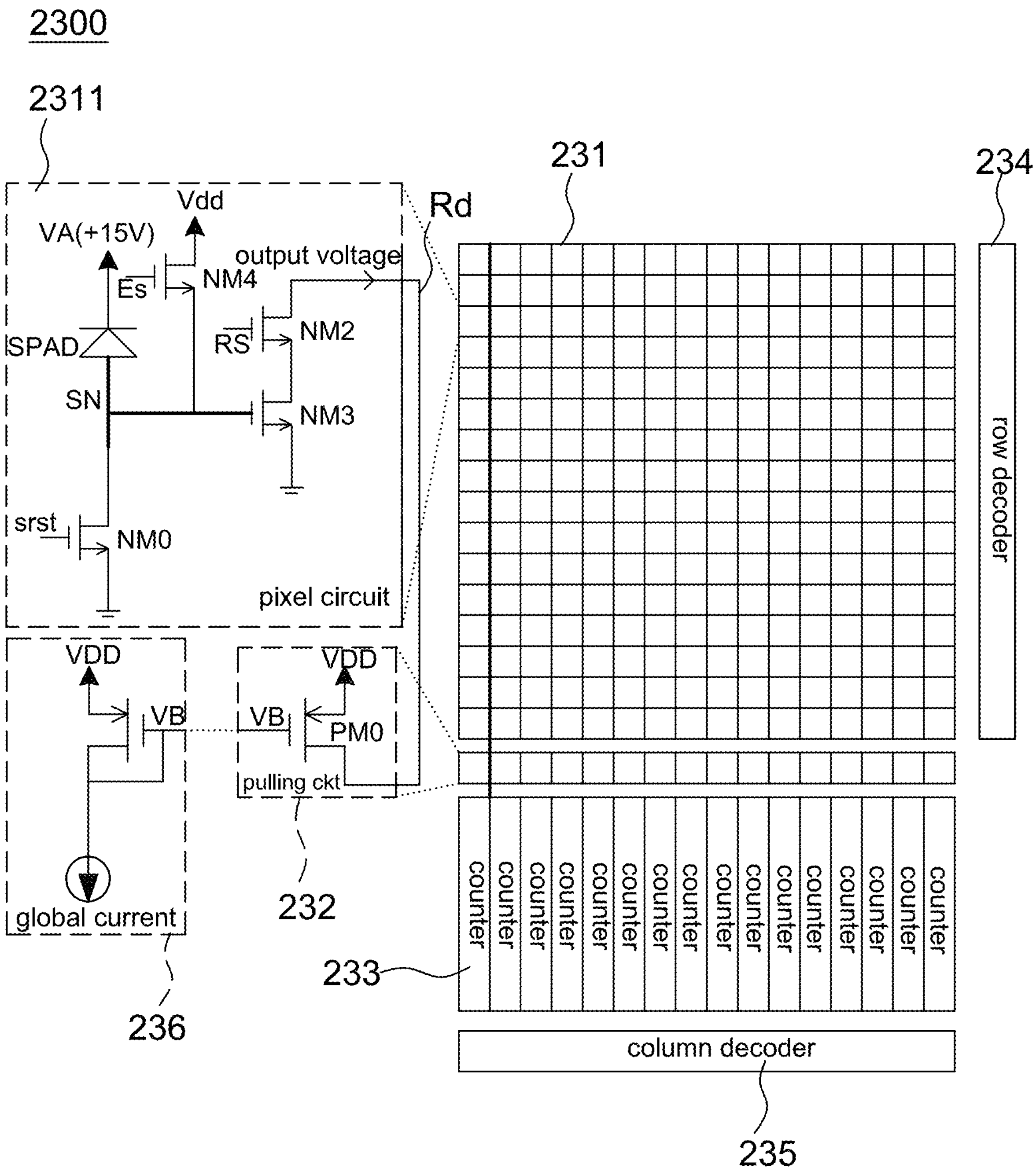
FIG. 23 is a schematic diagram of an image sensor according to an eighth embodiment of the present disclosure.

Referring to FIG. 23, it is a schematic diagram of an image sensor 2300 according to an eighth embodiment of the present disclosure.

The image sensor 2300 includes a pixel array 231, a plurality of pulling circuits 232, a plurality of counters 233, a row decoder 234, a column decoder 235 and a global current source circuit 236. As mentioned above, the row decoder 234 and the column decoder 235 are used to determine a pixel position in the pixel array 231 that is being exposed and outputting a detected signal (e.g., pulses mentioned below).

The pixel array 231 includes a plurality of pixel circuits 2311 (e.g., FIG. 23 showing 16×16 pixels as an example) arranged in a matrix. Each of the pixel circuits 2311 has an avalanche diode SPAD and four N-type transistors including an enable transistor NM4, a first switch transistor NM0, a pull down transistor NM3 and a second switch transistor NM2.

The avalanche diode SPAD is a single photon avalanche diode, and has an anode and a cathode. The cathode is connected to a positive bias voltage VA, e.g., +15V, but not limited to. The anode is connected to a node SN. When a voltage difference (or bias) between the cathode and the anode exceeds a breakdown voltage of the avalanche diode SPAD, an avalanche current is generated to charge stray capacitance at the node SN. In the eighth embodiment, the enable transistor NM4 pulls up a voltage on the node SN when the pixel circuit 2311 is not in sampling or resetting to prevent the avalanche diode SPAD from avalanche. The pull down transistor NM3 and the second switch transistor NM2 of the pixel circuit 2311 are used to form a readout circuit, which reads an output voltage of the pixel circuit 2311 to a corresponding column counter 233.

A source of the enable transistor NM4 is connected to the node SN to connect to the anode of the avalanche diode SPAD. A drain of the enable transistor NM4 is connected to a positive bias voltage Vdd, which is identical to or different from VA. A gate of the enable transistor NM4 is used to receive an enable signal Es to be turned on or off thereby. The enable signal Es is used to turn on the enable transistor NM4 when the pixel circuit 2311 is not in sampling or resetting.

A drain of the first switch transistor NM0 is connected to the node SN. A gate of the first switch transistor NM0 is used to receive a reset signal srst. A source of the first switch transistor NM0 is connected to a ground voltage.

A gate of the pull down transistor NM3 is connected to the node SN to connect to the anode of the avalanche diode SPAD. A source of the pull down transistor NM3 is connected to the ground voltage. The pull down transistor NM3 is used as a discharging path of a voltage on the node SN, and a discharging speed is determined according to stray capacitance of the circuit.

A gate of the second switch transistor NM2 receives an exposure signal RS, and controlled by the exposure signal RS to be turned on or off. The exposure signal RS is, for example, a row selection signal, which is generated by, for example, the row decoder 234. A source of the second switch transistor NM2 is connected to a drain of the pull down transistor NM3. A drain of the second switch transistor NM2 is used to generate an output voltage of the associated pixel circuit 2311.

Each of the plurality of pulling circuits 232 is used to connect to the drain of the second switch transistor NM2 of each pixel circuit 2311 in one pixel circuit column via a readout line Rd for reading the output voltage. For example, the image sensor 2300 further includes a multiplexer or multiple switching devices to allow the pulling circuit 232 corresponding to each pixel circuit column to be connected to different pixel circuits 2311 via the multiplexer or different switching devices. In the eighth embodiment, each of the pulling circuits 232 includes a P-type transistor PM0 used to pull up the output voltage when the pull down transistor NM3 is being turned off (illustrated by an example below). A drain of the P-type transistor PM0 is connected to the drain of the second switch transistor NM2. A source of the P-type transistor PM0 is connected to a system voltage VDD, which is identical to or different from the positive bias voltage VA. A gate of the P-type transistor PM0 is used to receive a control signal VB.

The global current source circuit 236 is used to form a current mirror with each of the plurality of pulling circuits 232. The image sensor 2300 is arranged with only one global current source circuit 236, which has the same arrangement as that in the first embodiment and thus details thereof are not repeated herein.

Each of the plurality of counters 233 is coupled to one pixel circuit column for counting photon events in the output voltage from each pixel circuit 2311 of the coupled pixel circuit column corresponding to each sampling period (e.g., determined according to High of a sampling signal smp). In the eighth embodiment, each counter 233 receives multiple pulses of a sampling signal smp within an exposure period to respectively count a photon event. Meanwhile, the enable signal Es is at a low voltage level within the sampling period to cause the SPAD to be able to generate avalanche current due to photon energy.

Figure 24:
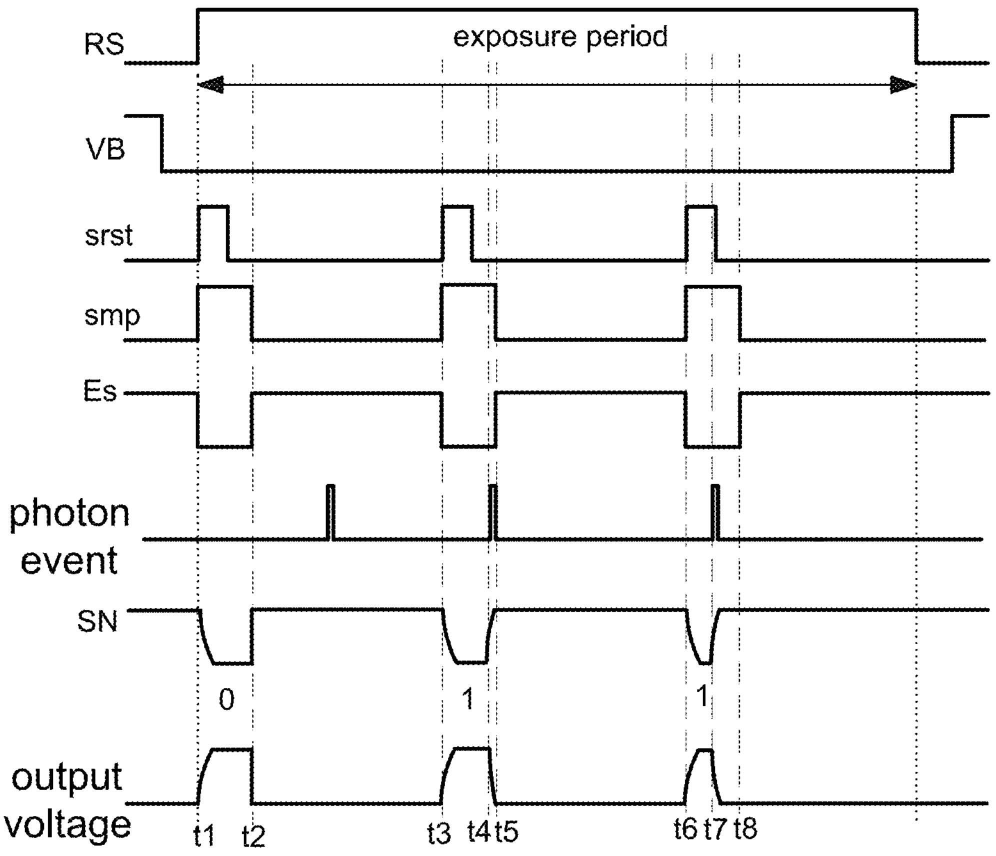
FIG. 24 is an operational timing diagram of an image sensor in FIG. 23.

Please refer to FIG. 24, it is an operational timing diagram of an image sensor 2300 according to an eighth embodiment of the present disclosure. The operating method of the image sensor 2300 is described below.

At a first time t1, the second switch transistor NM2 is turned on by an exposure signal RS to allow the SPAD to enter a detecting state. An interval with a high voltage level of the exposure signal RS is referred to an exposure period herein.

At the first time t1, the first switch transistor NM0 is turned on by a reset signal srst to cause a voltage on the node SN to be reset to a low voltage level. Meanwhile, the pull down transistor NM3 is turned off and the pulling circuit 232 pulls up an output voltage to a high voltage level.

At the first time t1, the counter 233 is enabled by a sampling signal smp to perform counting within a sampling period (e.g., shown as t1 to t2). The sampling signal smp enables the counter 233 to start counting using a high pulse or a low pulse without being limited to that shown in FIG. 24.

At the first time t1, the enable signal Es transfers to a low voltage level to turn off the enable transistor NM4 to allow the SPAD to be able to generate avalanche current within the sampling period. Preferably, an enabling period of the enable signal Es is corresponding to a sampling period of the sampling signal smp.

It should be mentioned that it is also possible to arrange the reset signal srst to be prior to the sampling period to pull down the voltage on the node Sn to a low voltage level before the sampling period begins.

In the sampling period between t1 and t2, the SPAD does not receive any photon such that the voltage on the node SN and the output voltage do not have a voltage change (after the voltage being reset). Therefore, the counter 233 counts 0 photon event. At a second time t2, the enable signal Es transfers to a high voltage level to turn on the enable transistor NM4 to pull up the voltage on the node SN to a high voltage level, which turns on the pull down transistor NM3 to cause the output voltage to be pulled down to a low voltage level.

Between the second time t2 and a third time t3, because the counter 233 is not enabled by the sampling signal smp to start counting, the counter 233 does not take a photon event occurring therein as an event within the exposure period.

At the third time t3, another sampling period (e.g., shown between t3 and t5) starts, and states of the reset signal srst, the sampling signal smp, the enable signal Es, a voltage on the node SN and the output voltage are identical to those at the first time t1 as shown in FIG. 24.

In the sampling period between the third time t3 and a fifth time t5, the SPAD receives a photon at a fourth time t4 at which the avalanche current charges the node SN to pull up the voltage on the node SN to a high voltage level, which turns on the pull down transistor NM3 to cause the output voltage to transfer to a low voltage level.

In this embodiment, when the output voltage has a voltage variation (i.e. reset voltage of the node SN having a variation), e.g., from High to Low, the counter 233 counts one photon event. The voltage variation of the node SN occurs before the fifth time t5 at which the enable signal Es has a level change.

The difference between the eighth embodiment and the first embodiment is that in the first embodiment the counter 13 continuously counts photon events within the exposure period (referring to FIG. 2); whereas in the eighth embodiment the counter 233 receives multiple pulses of a sampling signal smp at a predetermined frequency within an exposure period determined by an exposure signal RS to determine multiple sampling periods, and the counter 233 counts a photon event only within each of the multiple sampling periods without counting any photon event appearing outside the multiple sampling periods, e.g., no photon event being counted between the second time t2 and the third time t3 as well as between the fifth time t5 and the sixth time t6 as shown in FIG. 24. The counting is increased by 1 when the output voltage has a variation within one sampling period (e.g., between t4 and t5, between t7 and t8); and on the other hand, the counting is increased by 0 (i.e. not increased) when the output voltage does not have a variation within one sampling period (e.g., between t1 and t2).

The photon event can occur at any time point within one sampling period, e.g., the fourth time t4 and the seventh time t7 showing different time points in the sampling period at which a photon event occurs. Preferably, only one photon event occurs in each sampling period, and a length of the sampling period is previously determined according to an expectation value of photon events.

FIG. 24 shows operation of one pixel circuit 2311. It is appreciated that every pixel circuit 2311 in the same pixel circuit column has operation identical to FIG. 24 only occurring at a different time based on the row selection signal.

Figure 25:
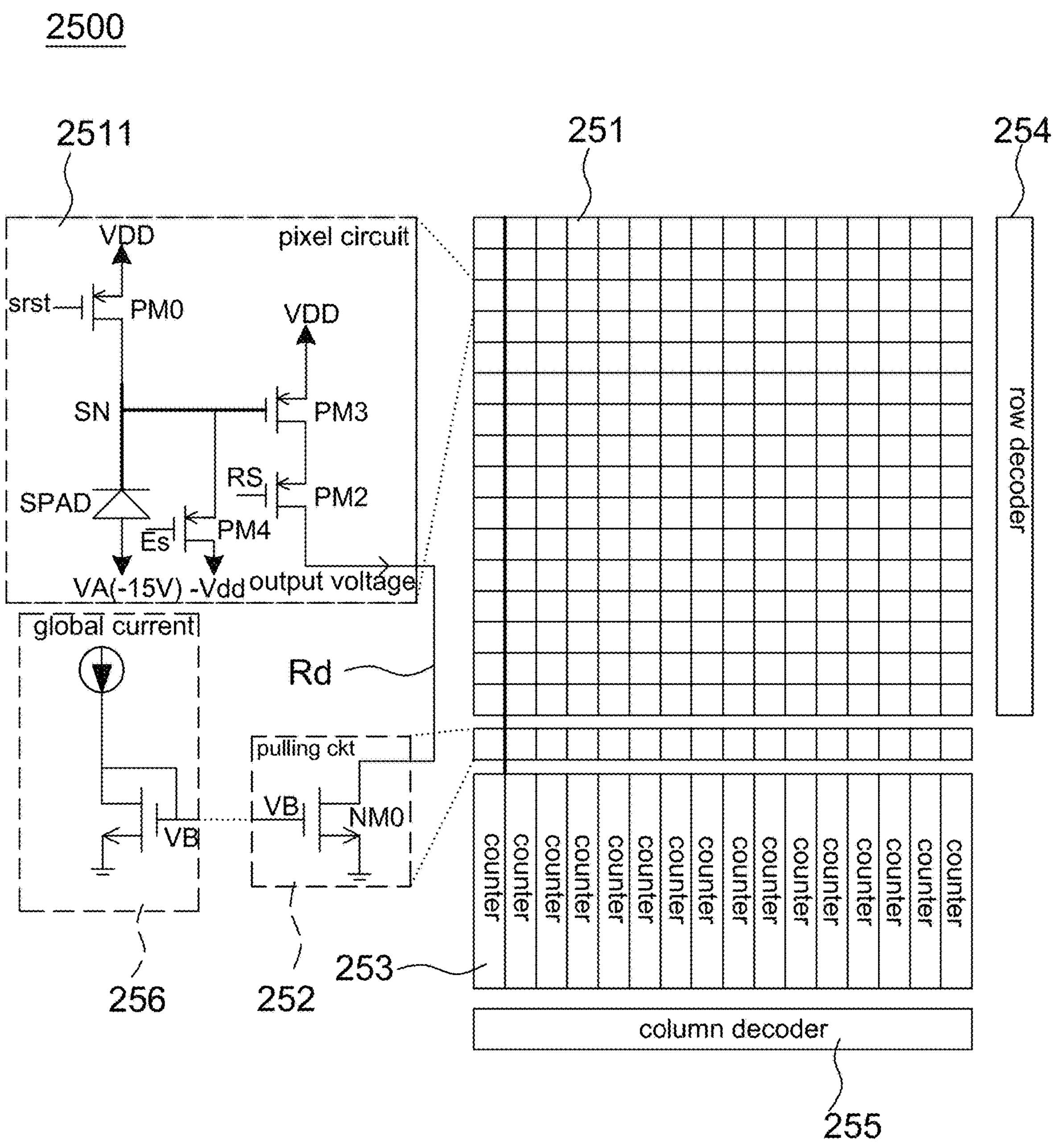
FIG. 25 is a schematic diagram of an image sensor according to a ninth embodiment of the present disclosure.

Referring to FIG. 25, it is a schematic diagram of an image sensor 2500 according to a ninth embodiment of the present disclosure.

The image sensor 2500 includes a pixel array 251, a plurality of pulling circuits 252, a plurality of counters 253, a row decoder 254, a column decoder 255 and a global current source circuit 256. As mentioned above, the row decoder 254 and the column decoder 255 are also used to determine a pixel position in the pixel array 251 that is being exposed and outputting a detected signal (e.g., pulses mentioned below).

The pixel array 251 includes a plurality of pixel circuits 2511 (e.g., FIG. 25 also showing 16×16 pixels as an example) arranged in a matrix. Each of the pixel circuits 2511 has an avalanche diode SPAD and four P-type transistors including an enable transistor PM4, a first switch transistor PM0, a pull up transistor PM3 and a second switch transistor PM2.

The avalanche diode SPAD is a single photon avalanche diode, and has an anode and a cathode. The anode is connected to a negative bias voltage VA, e.g., −15V, but not limited to. The cathode is connected to a node SN. When a voltage difference (or bias) between the cathode and the anode exceeds a breakdown voltage of the avalanche diode SPAD, an avalanche current is generated to discharge stray capacitance at the node SN. In the ninth embodiment, the enable transistor PM4 pulls down a voltage on the node SN when the pixel circuit 2511 is not in sampling or resetting to prevent the avalanche diode SPAD from avalanche. The pull up transistor PM3 and the second switch transistor PM2 of the pixel circuit 2511 are used to form a readout circuit, which reads an output voltage of the pixel circuit 2511 to a corresponding column counter 253.

A source of the enable transistor PM4 is connected to the node SN to connect to the cathode of the avalanche diode SPAD. A drain of the enable transistor PM4 is connected to a negative bias voltage −Vdd, which is identical to or different from VA. A gate of the enable transistor PM4 is used to receive an enable signal Es to be turned on or off thereby. The enable signal Es is used to turn on the enable transistor PM4 when the pixel circuit 2511 is not in sampling or resetting.

A drain of the first switch transistor PM0 is connected to the node SN. A gate of the first switch transistor PM0 is used to receive a reset signal srst. A source of the first switch transistor PM0 is connected to a system voltage VDD.

A gate of the pull up transistor PM3 is connected to the node SN to connect to the cathode of the avalanche diode SPAD. A source of the pull up transistor PM3 is connected to the system voltage VDD. The pull up transistor PM3 is used as a charging path of a voltage on the node SN, and a charging speed is determined according to stray capacitance of the circuit.

A gate of the second switch transistor PM2 receives an exposure signal RS, and controlled by the exposure signal RS to be turned on or off. The exposure signal RS is, for example, a row selection signal, which is generated by, for example, the row decoder 254. A source of the second switch transistor PM2 is connected to a drain of the pull up transistor PM3. A drain of the second switch transistor PM2 generates an output voltage of the associated pixel circuit 2511.

Each of the plurality of pulling circuits 252 is used to connect to the drain of the second switch transistor PM2 of each pixel circuit 2511 in one pixel circuit column via a readout line Rd for reading the output voltage. For example, the image sensor 2500 further includes a multiplexer or multiple switching devices to allow the pulling circuit 252 corresponding to each pixel circuit column to be connected to different pixel circuits 2511 via the multiplexer or different switching devices. In the ninth embodiment, each of the pulling circuits 252 includes an N-type transistor NM0 used to pull down the output voltage when the pull up transistor PM3 is being turned off (illustrated by an example below). A drain of the N-type transistor NM0 is connected to the drain of the second switch transistor PM2. A source of the N-type transistor NM0 is connected to a ground voltage. A gate of the N-type transistor NM0 is used to receive a control signal VB.

The global current source circuit 256 is used to form a current mirror with each of the plurality of pulling circuits 252. The image sensor 2500 is arranged with only one global current source circuit 256, which has the same arrangement as that in the second embodiment and thus details thereof are not repeated herein.

Each of the plurality of counters 253 is coupled to one pixel circuit column for counting photon events in the output voltage from each pixel circuit 2511 of the coupled pixel circuit column corresponding to each sampling period (e.g., determined according to High of a sampling signal smp). In the ninth embodiment, each counter 253 receives multiple pulses of a sampling signal smp within an exposure period to respectively count a photon event. Meanwhile, the enable signal Es is at a high voltage level within the sampling period to cause the SPAD to be able to generate avalanche current due to photon energy.

Figure 26:
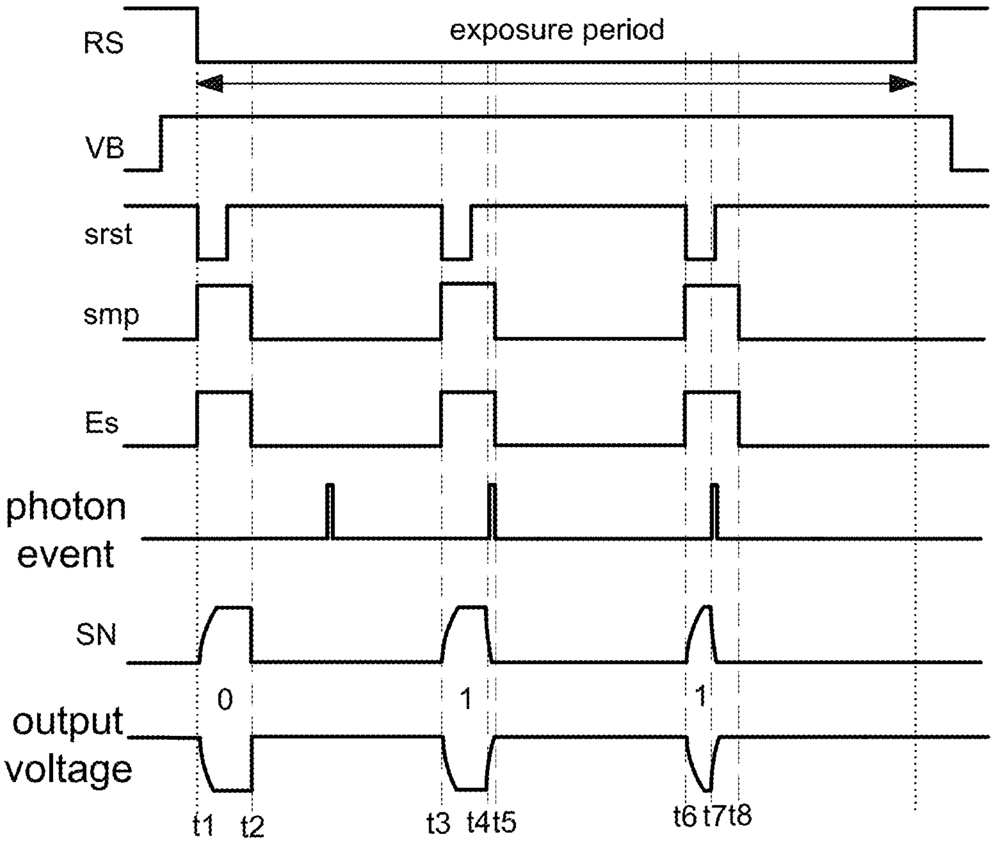
FIG. 26 is an operational timing diagram of an image sensor in FIG. 25.

Please refer to FIG. 26, it is an operational timing diagram of an image sensor 2500 according to a ninth embodiment of the present disclosure. The operating method of the image sensor 2500 is described below.

At a first time t1, the second switch transistor PM2 is turned on by an exposure signal RS to allow the SPAD to enter a detecting state. An interval with a low voltage level of the exposure signal RS is referred to an exposure period herein.

At the first time t1, the first switch transistor PM0 is turned on by a reset signal srst to cause a voltage on the node SN to be reset to a high voltage level. Meanwhile, the pull up transistor PM3 is turned off and the pulling circuit 252 pulls down an output voltage to a low voltage level.

At the first time t1, the counter 253 is enabled by a sampling signal smp to perform counting within a sampling period (e.g., shown as t1 to t2). The sampling signal smp enables the counter 253 to start counting using a high pulse or a low pulse without being limited to that shown in FIG. 26.

At the first time t1, the enable signal Es transfers to a high voltage level to turn off the enable transistor PM4 to allow the SPAD to be able to generate avalanche current within the sampling period. Preferably, an enabling period of the enable signal Es is corresponding to a sampling period of the sampling signal smp.

It should be mentioned that it is also possible to arrange the reset signal srst to be prior to the sampling period to pull up the voltage on the node Sn to a high voltage level before the sampling period begins.

In the sampling period between t1 and t2, the SPAD does not receive any photon such that the voltage on the node SN and the output voltage do not have a voltage change (after the voltage being reset). Therefore, the counter 253 counts 0 photon event. At a second time t2, the enable signal Es transfers to a low voltage level to turn on the enable transistor PM4 to pull down the voltage on the node SN to a low voltage level, which turns on the pull up transistor PM3 to cause the output voltage to be pulled up to a high voltage level.

Between the second time t2 and a third time t3, because the counter 253 is not enabled by the sampling signal smp to start counting, the counter 253 does not take a photon event occurring therein as an event within the exposure period.

At the third time t3, another sampling period (e.g., shown between t3 and t5) starts, and states of the reset signal srst, the sampling signal smp, the enable signal Es, a voltage on the node SN and the output voltage are identical to those at the first time t1 as shown in FIG. 26.

In the sampling period between the third time t3 and a fifth time t5, the SPAD receives a photon at a fourth time t4 at which the avalanche current discharges the node SN to pull down the voltage on the node SN to a low voltage level, which turns on the pull up transistor PM3 to cause the output voltage to transfer to a high voltage level.

In this embodiment, when the output voltage has a voltage variation (i.e. reset voltage of the node SN having a variation), e.g., from Low to High, the counter 253 counts one photon event. The voltage variation of the node SN occurs before the fifth time t5 at which the enable signal Es has a level change.

The difference between the ninth embodiment and the second embodiment is that in the second embodiment the counter 43 continuously counts photon events within the exposure period (referring to FIG. 5); whereas in the ninth embodiment the counter 253 receives multiple pulses of a sampling signal smp at a predetermined frequency within an exposure period determined by an exposure signal RS to determine multiple sampling periods, and the counter 253 counts a photon event only within each of the multiple sampling periods without counting any photon event appearing outside the multiple sampling periods, e.g., no photon event being counted between the second time t2 and the third time t3 as well as between the fifth time t5 and the sixth time t6 as shown in FIG. 26. The counting is increased by 1 when the output voltage has a variation within one sampling period (e.g., between t4 and t5, between t7 and t8); and on the other hand, the counting is increased by 0 (i.e. not increased) when the output voltage does not have a variation within one sampling period (e.g., between t1 and t2).

The photon event can occur at any time point within one sampling period, e.g., the fourth time t4 and the seventh time t7 showing different time points in the sampling period at which a photon event occurs. Preferably, only one photon event occurs in each sampling period, and a length of the sampling period is previously determined according to an expectation value of photon events.

FIG. 26 shows operation of one pixel circuit 2511. It is appreciated that every pixel circuit 2511 in the same pixel circuit column has operation identical to FIG. 26 only occurring at a different time based on the row selection signal.

Figure 27:
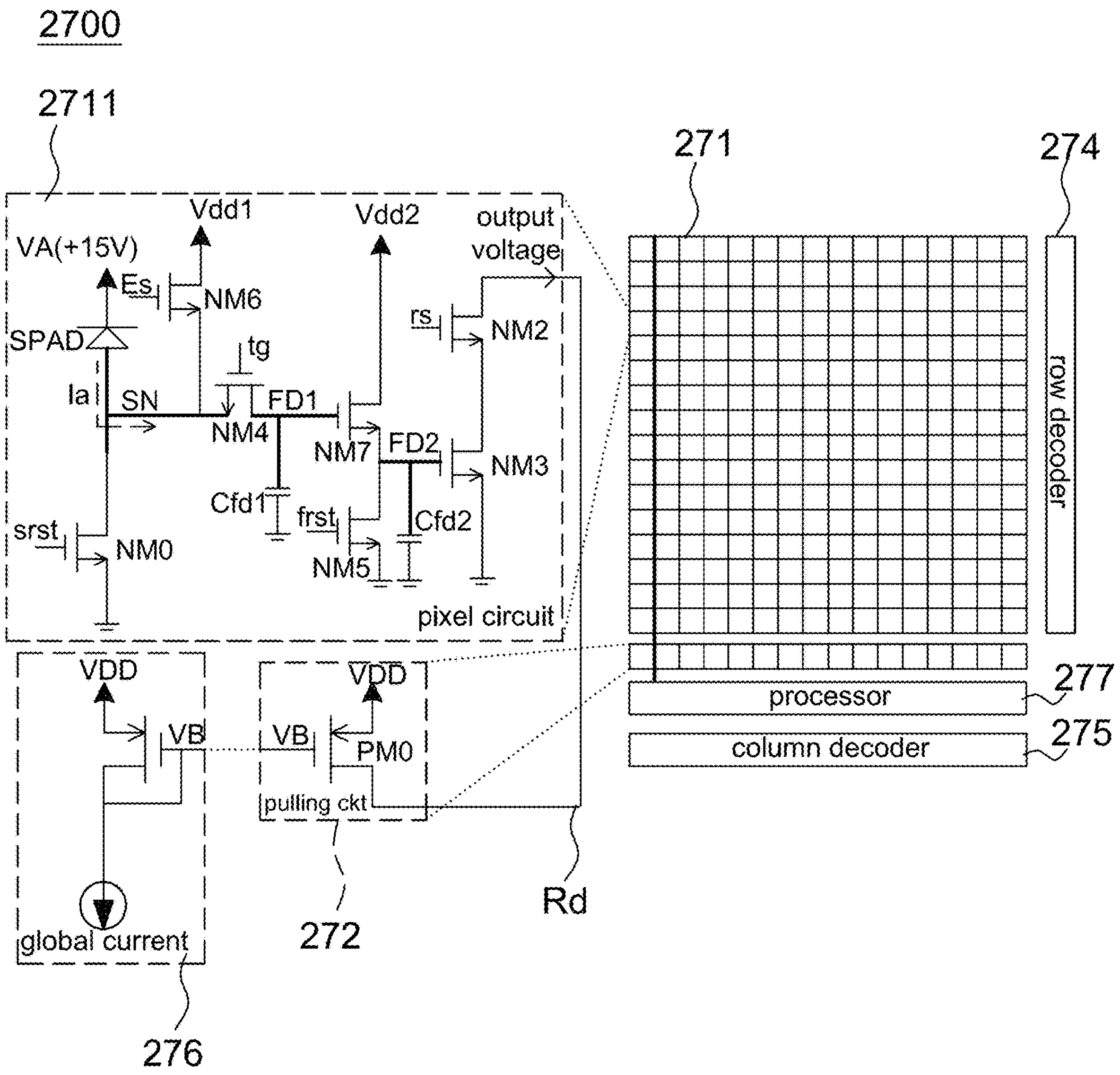
FIG. 27 is a schematic diagram of an image sensor according to a tenth embodiment of the present disclosure.

Referring to FIG. 27, it is a schematic diagram of an image sensor 2700 according to a tenth embodiment of the present disclosure. The image sensor 2700 is also used to combine (e.g., by the processor 277) multiple bit planes outputted by a pixel array 271 corresponding to multiple exposure periods to generate an image frame for the object tracking, gesture recognition, 3D image construction, and biological feature detection and recognition.

The image sensor 2700 includes a pixel array 271, a plurality of pulling circuits 272, a row decoder 274, a column decoder 275, a global current source circuit 276 and a processor 277. As mentioned above, the row decoder 274 and the column decoder 275 are used to determine a pixel position in the pixel array 271 that is being exposed and read.

The pixel array 271 includes a plurality of pixel circuits 2711 (e.g., FIG. 27 showing 16×16 pixels as an example) arranged in a matrix. Each of the pixel circuits 2711 has an avalanche diode SPAD and N-type transistors including an enable transistor NM6, a first switch transistor NM0, an exposure transistor NM4, a reset transistor NM5, a control transistor NM7, a pull down transistor NM3 and a second switch transistor NM2.

The avalanche diode SPAD is a single photon avalanche diode, and has an anode and a cathode. The cathode is connected to a positive bias voltage VA, e.g., +15V, but not limited to. The anode is connected to a first node SN. When a voltage difference (or bias) between the cathode and the anode exceeds a breakdown voltage of the SPAD, an avalanche current Ia is generated to charge the first node SN. The pull down transistor NM3 and the second switch transistor NM2 of the pixel circuit 2711 are used to form a readout circuit, which reads an output voltage of the pixel circuit 2711 to the processor 277.

Figure 28:
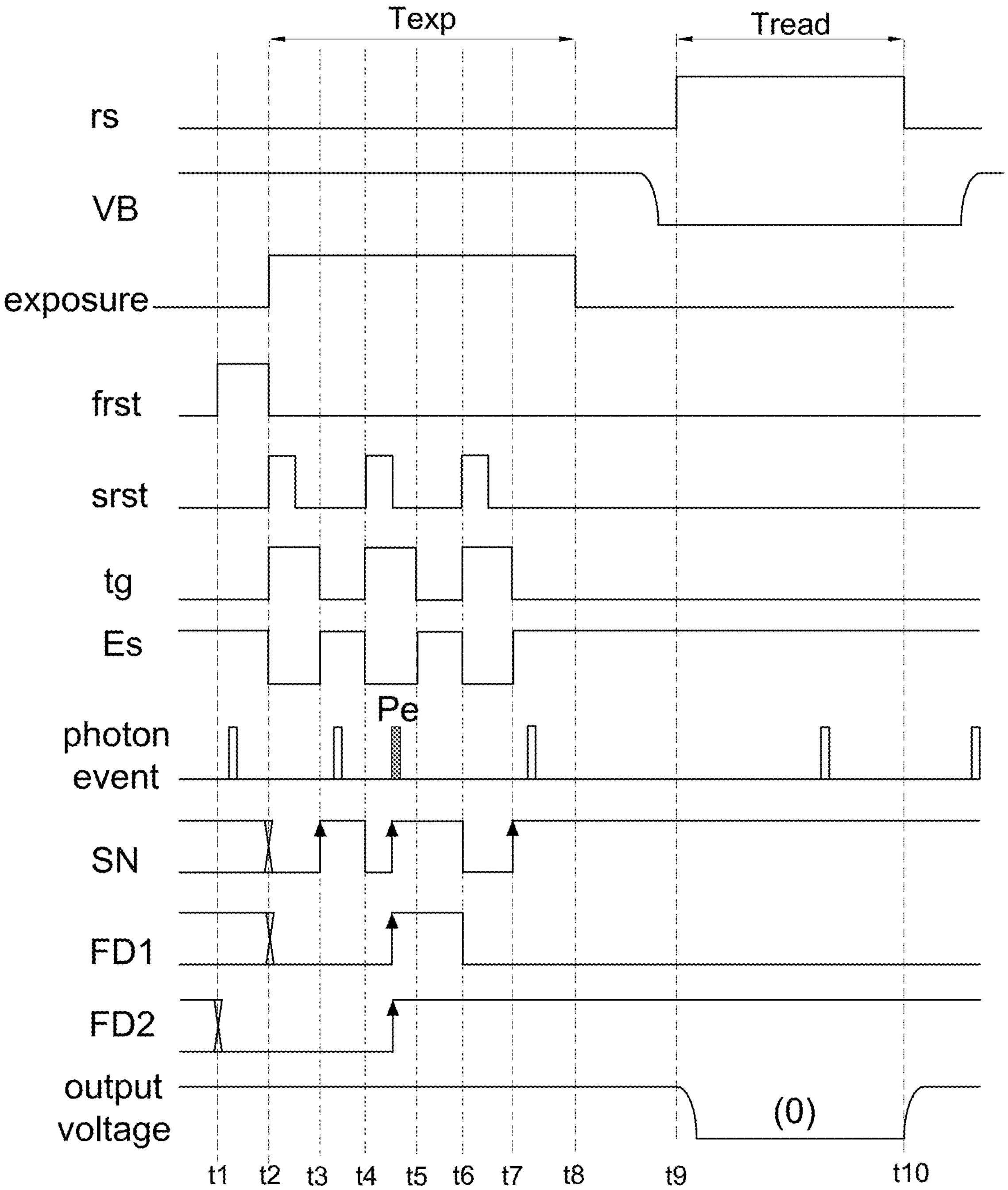
FIG. 28 is an operational timing diagram of an image sensor of FIG. 27, in which one photon event occurs within an exposure period.

A source of the enable transistor NM6 is connected to the first node SN to couple to the anode of the avalanche diode SPAD. A drain of the enable transistor NM6 is connected to a positive bias voltage Vdd1, which is equal to or different from VA. A gate of the enable transistor NM6 is used to receive an enable signal Es to be turned on or off thereby. The enable signal Es is used to determine multiple enabling periods for turning off the enable transistor NM6 within an exposure period (an interval for determining a bit plane) Texp of the pixel circuit 2711. The enable signal Es is also used to pull up a voltage on the first node SN when the pixel circuit 2711 is not in sampling or resetting to prevent the avalanche diode SPAD from avalanche, shown at time points t3, t5 and t7 in FIG. 29. When the avalanche diode SPAD receives a photon in the detecting state (e.g., enabling periods t2-t3, t4-t5, t6-t7), a voltage on the first node SN rises to cause the voltage difference between the cathode and the anode of the avalanche diode SPAD to be smaller than the breakdown voltage such that the quenching occurs, as shown in FIG. 28.

A drain of the first switch transistor NM0 is connected to the first node SN. A gate of the first switch transistor NM0 is used to receive a first reset signal srst. A source of the first switch transistor NM0 is connected to a ground voltage.

A source of the exposure transistor NM4 is connected to the first node SN. A drain of the exposure transistor NM4 is connected to a second node FD1 (shown coupled with a first capacitor Cfd1, which is a stray capacitor or an additionally arranged capacitor). A gate of the exposure transistor NM4 receives an exposure signal tg for turning on the exposure transistor NM4 corresponding to the multiple enabling periods within the exposure period Texp. In other words, in this embodiment, a photon event is considered occurring when a photon is received by the SPAD within the enabling periods of the exposure period Texp, but a photon being received by the SPAD not within the enabling periods of the exposure period Texp, i.e. intervals during which the enable transistor NM6 is turned on to prevent the SPAD from avalanche, is not considered as a photon event.

The reset transistor NM5 is used to reset a voltage on the third node FD2 (shown coupled with a second capacitor Cfd2, which is a stray capacitor or an additionally arranged capacitor). A gate of the reset transistor NM5 receives a second reset signal frst, a drain of the reset transistor NM5 is connected to the third node FD2, and a source of the reset transistor NM5 is connected to the ground voltage.

The third node FD2 is used to temporarily store the voltage associated with a photon event(s) detected by the SPAD within the exposure period Texp, and the control transistor NM7 is to control whether a voltage on the third node FD2 is pulled up or not according to a voltage on the second node FD1. A gate of the control transistor NM7 is connected to the second node FD1, a source of the control transistor NM7 is connected to the third node FD2, and a drain of the control transistor NM7 is connected to a positive bias voltage Vdd2, which is equal to or different from Vdd1.

A gate of the pull down transistor NM3 is connected to the third node FD2. A source of the pull down transistor NM3 is connected to the ground voltage.

A gate of the second switch transistor NM2 receives a readout signal rs, which is, for example, a row selection signal and generated by the row decoder 274. A source of the second switch transistor NM2 is connected to a drain of the pull down transistor NM3. A drain of the second switch transistor NM2 is used to generate an output voltage of the associated pixel circuit 2711.

Each of the plurality of pulling circuits 272 is used to connect to the drain of the second switch transistor NM2 of each pixel circuit 2711 in one pixel circuit column via a readout line Rd for reading the output voltage. For example, the image sensor 2700 further includes a multiplexer or multiple switching devices to allow the pulling circuit 272 corresponding to each pixel circuit column to be connected to different pixel circuits 2711 via the multiplexer or different switching devices. Each of the pulling circuits 272 includes a P-type transistor PM0 used to pull up the output voltage after reading out the output voltage. A drain of the P-type transistor PM0 is connected to the drain of the second switch transistor NM2 via the readout line Rd. A source of the P-type transistor PM0 is connected to a system voltage VDD, which is identical to or different from the positive bias voltage VA. A gate of the P-type transistor PM0 is used to receive a control signal VB.

The global current source circuit 276 is used to form a current mirror with each of the plurality of pulling circuits 272. The image sensor 2700 is arranged with only one global current source circuit 276, which has the same arrangement as that in the fourth embodiment and thus details thereof are not repeated herein.

Figure 29:
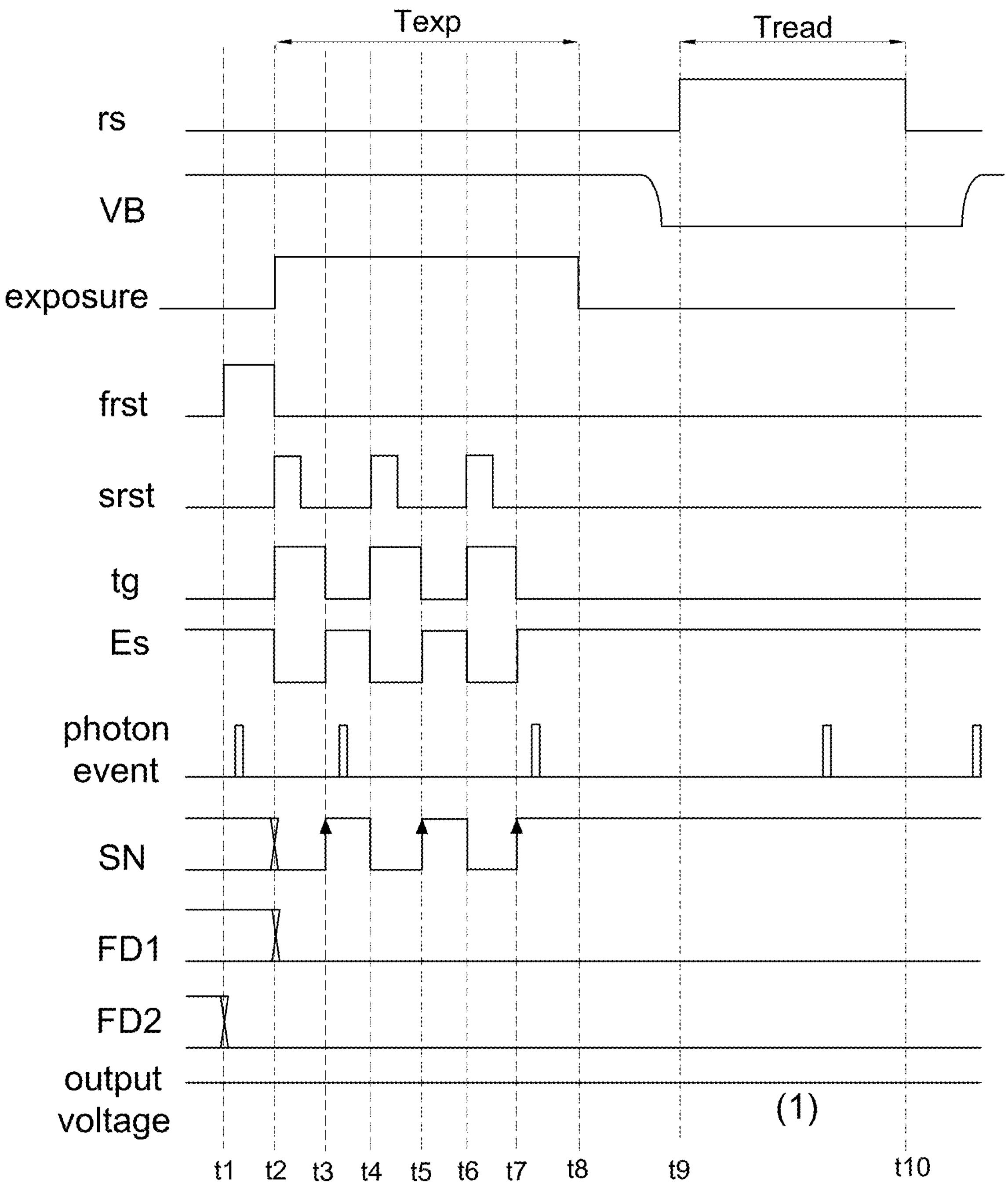
FIG. 29 is another operational timing diagram of an image sensor of FIG. 27, in which no photon event occurs within an exposure period.

Referring to FIGS. 27 to 29, FIGS. 28 and 29 are operational timing diagrams of an image sensor 2700 according to a tenth embodiment of the present disclosure. The difference between FIG. 28 of the tenth embodiment and FIG. 17 of the sixth embodiment is that, FIG. 28 shows that a photon event is detected using multiple enabling periods (having predetermined frequency) within an exposure period Texp, whereas FIG. 17 shows that the photon event is detected within the whole of the exposure period Texp, wherein a number of the multiple enabling periods is arranged to be determined according to auto exposure.

As shown in FIGS. 28 and 29, firstly at a time point t1, a voltage on the third node FD2 is reset to a low voltage level. Next, at a time point t2, a voltage on the second node FD1 is reset to a low voltage level; and the first node SN is reset to Low, the exposure transistor NM4 is turned on and the enable transistor NM6 is turned off at time points t2, t4, t6 at a predetermined frequency. When the SPAD receives a photon Pe within any one (e.g., between t4-t5 in FIG. 28) of the multiple enabling periods, a voltage on the third node FD2 is at a high voltage level behind the exposure period Texp till the second switch transistor NM2 is turned on by the readout signal rs, the output voltage transfers to a low voltage level (shown as 0) within the readout period Tread to indicate a photon event appearing within the exposure period Texp. It should be mentioned that if there are more than one photon event appearing in more than one enabling period within the exposure period Texp, the output voltage is also at the low voltage level within the readout period Tread.

When the SPAD does not receive any photon within the multiple enabling periods, the voltage on the third node FD2 is at a low voltage level behind the exposure period Texp till the second switch transistor NM2 is turned on by the readout signal rs, the output voltage maintains at a high voltage level (shown as 1) within the readout period Tread to indicate no photon event appearing within the exposure period Texp.

Other parts are shown in FIGS. 28 and 29, and are similar to FIGS. 17 and 18, and thus details thereof are not repeated herein.

Figure 33:
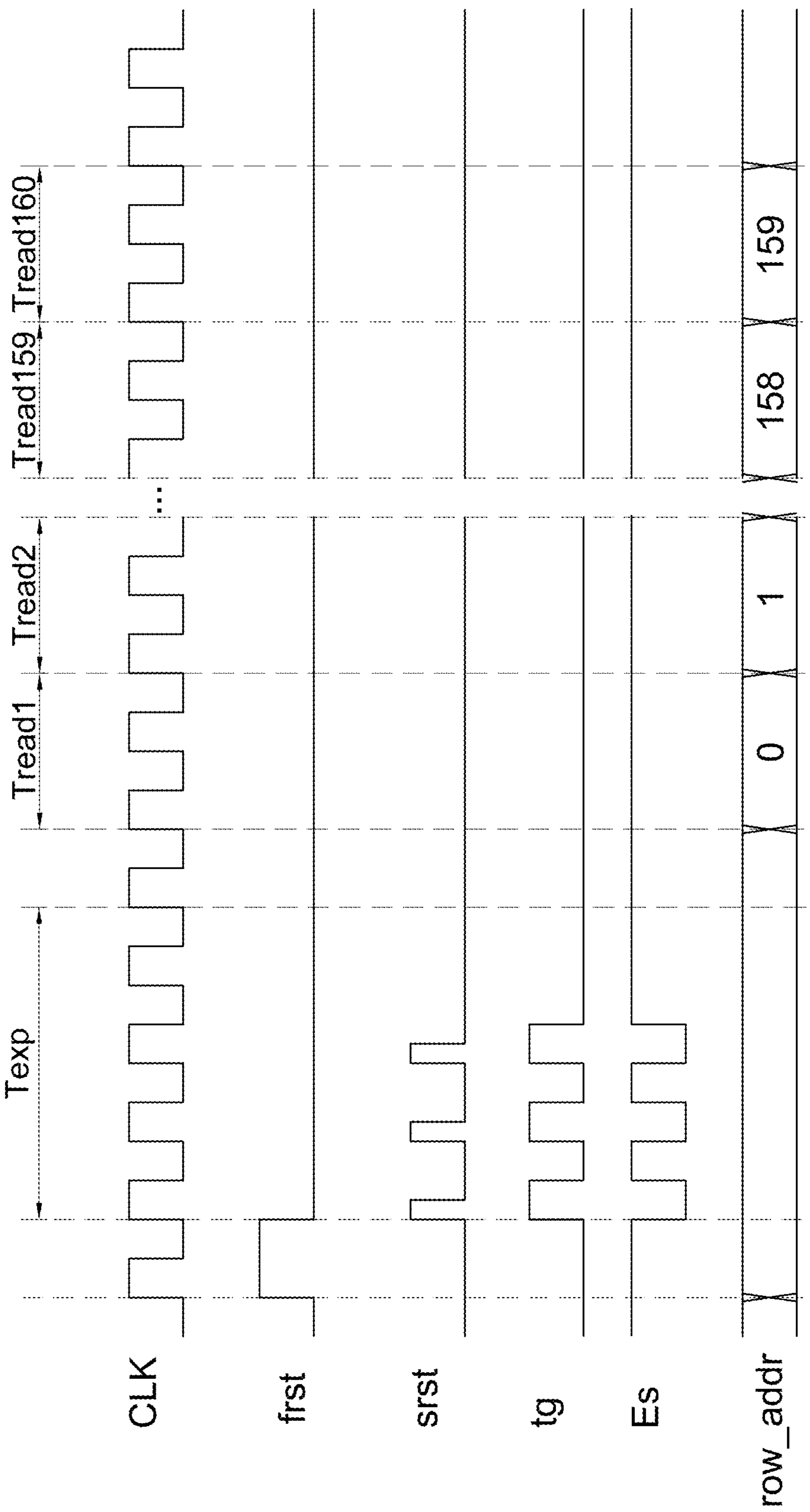
FIG. 33 is a schematic diagram of the exposure period and readout periods of an image sensor according to a further embodiment of the present disclosure.

The exposure period Texp and readout periods Tread of the image sensor 2700 are referred to FIG. 33.

Figure 30:
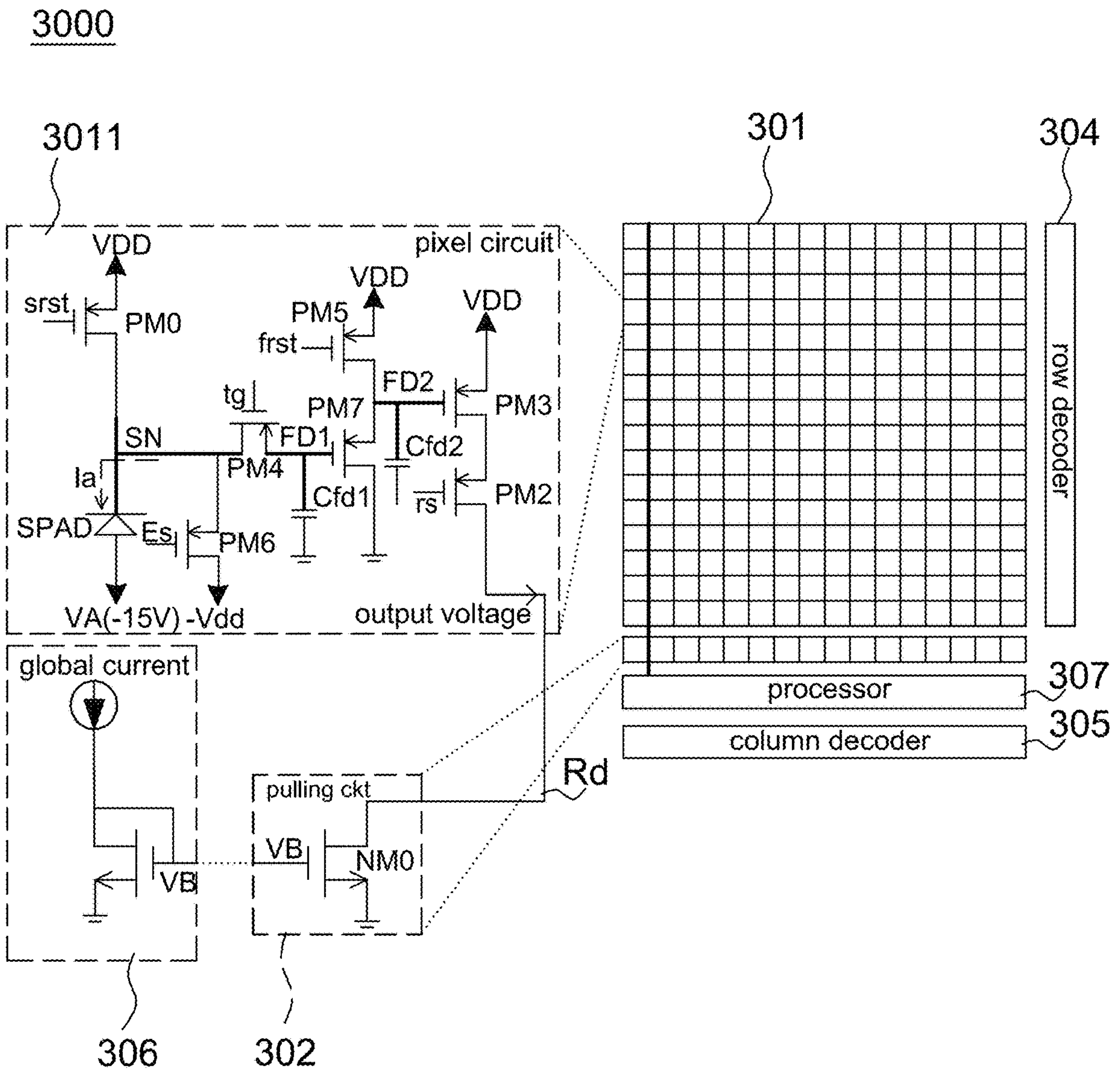
FIG. 30 is a schematic diagram of an image sensor according to an eleventh embodiment of the present disclosure.

Referring to FIG. 30, it is a schematic diagram of an image sensor 3000 according to an eleventh embodiment of the present disclosure. The image sensor 3000 is also used to combine (e.g., by the processor 307) multiple bit planes outputted by a pixel array 301 corresponding to multiple exposure periods to generate an image frame for the object tracking, gesture recognition, 3D image construction, and biological feature detection and recognition.

The image sensor 3000 includes a pixel array 301, a plurality of pulling circuits 302, a row decoder 304, a column decoder 305, a global current source circuit 306 and a processor 307. As mentioned above, the row decoder 304 and the column decoder 305 are used to determine a pixel position in the pixel array 301 that is being exposed and read.

The pixel array 301 includes a plurality of pixel circuits 3011 (e.g., FIG. 30 showing 16×16 pixels as an example) arranged in a matrix. Each of the pixel circuits 3011 has an avalanche diode SPAD and P-type transistors including an enable transistor PM6, a first switch transistor PM0, an exposure transistor PM4, a reset transistor PM5, a control transistor PM7, a pull up transistor PM3 and a second switch transistor PM2.

The avalanche diode SPAD is a single photon avalanche diode, and has an anode and a cathode. The anode is connected to a negative bias voltage VA, e.g., −15V, but not limited to. The cathode is connected to a first node SN. When a voltage difference (or bias) between the cathode and the anode exceeds a breakdown voltage of the SPAD, an avalanche current Ia is generated to discharge the first node SN. The pull up transistor PM3 and the second switch transistor PM2 of the pixel circuit 3011 are used to form a readout circuit, which reads an output voltage of the pixel circuit 3011 to the processor 307.

Figure 31:
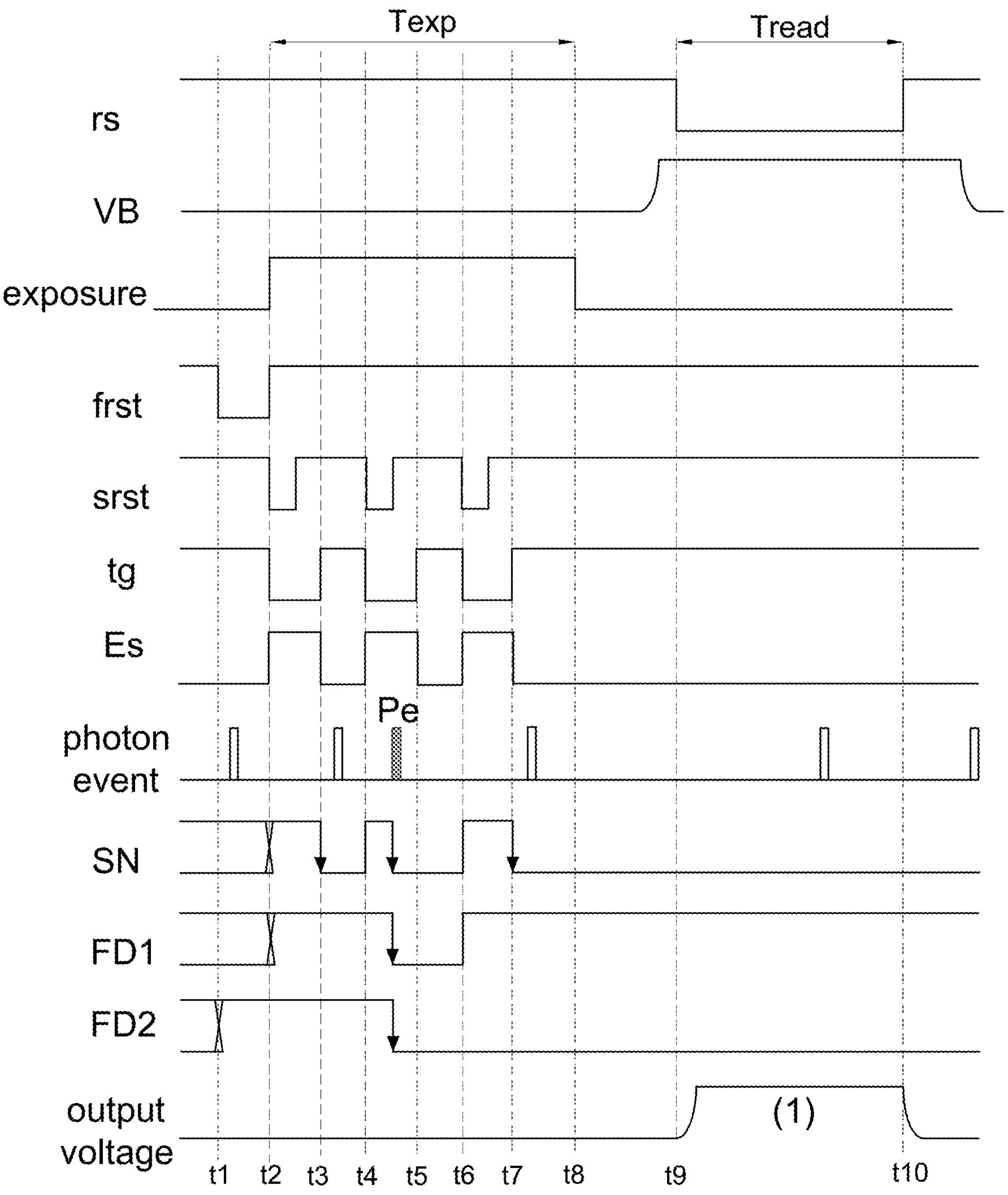
FIG. 31 is an operational timing diagram of an image sensor of FIG. 30, in which one photon event occurs within an exposure period.

A source of the enable transistor PM6 is connected to the first node SN to couple to the cathode of the avalanche diode SPAD. A drain of the enable transistor PM6 is connected to a negative bias voltage-Vdd, which is equal to or different from VA. A gate of the enable transistor PM6 is used to receive an enable signal Es to be turned on or off thereby. The enable signal Es is used to determine multiple enabling periods for turning off the enable transistor PM6 within an exposure period (an interval for determining a bit plane) Texp of the pixel circuit 3011. The enable signal Es is also used to pull down a voltage on the first node SN when the pixel circuit 3011 is not in sampling or resetting to prevent the avalanche diode SPAD from avalanche, shown at time points t3, t5 and t7 in FIG. 32. When the avalanche diode SPAD receives a photon in the detecting state (e.g., enabling periods t2-t3, t4-t5, t6-t7), a voltage on the first node SN falls to cause the voltage difference between the cathode and the anode of the avalanche diode SPAD to be smaller than the breakdown voltage such that the quenching occurs, as shown in FIG. 31.

A drain of the first switch transistor PM0 is connected to the first node SN. A gate of the first switch transistor PM0 is used to receive a first reset signal srst. A source of the first switch transistor PM0 is connected to a system voltage VDD.

A drain of the exposure transistor PM4 is connected to the first node SN. A source of the exposure transistor PM4 is connected to a second node FD1 (shown coupled with a first capacitor Cfd1, which is a stray capacitor or an additionally arranged capacitor). A gate of the exposure transistor PM4 receives an exposure signal tg for turning on the exposure transistor PM4 corresponding to the multiple enabling periods within the exposure period Texp. In other words, in this embodiment, a photon event is considered occurring when a photon is received by the SPAD within enabling periods of the exposure period Texp, but a photon being received by the SPAD not within the enabling periods of the exposure period Texpt, i.e. intervals during which the enable transistor PM6 is turned on to prevent the SPAD from avalanche, is not considered as a photon event.

The reset transistor PM5 is used to reset a voltage on the third node FD2 (shown coupled with a second capacitor Cfd2, which is a stray capacitor or an additionally arranged capacitor). A gate of the reset transistor PM5 receives a second reset signal frst, a drain of the reset transistor PM5 is connected to the third node FD2, and a source of the reset transistor PM5 is connected to the system voltage.

The third node FD2 is used to temporarily store the voltage associated with a photon event(s) detected by the SPAD within the exposure period Texp, and the control transistor PM7 is to control whether a voltage on the third node FD2 is pulled down or not according to a voltage on the second node FD1. A gate of the control transistor PM7 is connected to the second node FD1, a source of the control transistor PM7 is connected to the third node FD2, and a drain of the control transistor PM7 is connected to a ground voltage, which is equal to or different from VA.

A gate of the pull up transistor PM3 is connected to the third node FD2. A source of the pull up transistor PM3 is connected to the system voltage VDD.

A gate of the second switch transistor PM2 receives a readout signal rs, which is, for example, a row selection signal and generated by the row decoder 304. A source of the second switch transistor PM2 is connected to a drain of the pull up transistor PM3. A drain of the second switch transistor PM2 is used to generate an output voltage of the associated pixel circuit 3011.

Each of the plurality of pulling circuits 302 is used to connect to the drain of the second switch transistor PM2 of each pixel circuit 3011 in one pixel circuit column via a readout line Rd for reading the output voltage. For example, the image sensor 3000 further includes a multiplexer or multiple switching devices to allow the pulling circuit 302 corresponding to each pixel circuit column to be connected to different pixel circuits 3011 via the multiplexer or different switching devices. Each of the pulling circuits 302 includes an N-type transistor NM0 used to pull down the output voltage after reading out the output voltage. A drain of the N-type transistor NM0 is connected to the drain of the second switch transistor PM2 via the readout line Rd. A source of the N-type transistor NM0 is connected to a ground voltage. A gate of the N-type transistor NM0 is used to receive a control signal VB.

The global current source circuit 306 is used to form a current mirror with each of the plurality of pulling circuits 302. The image sensor 3000 is arranged with only one global current source circuit 306, which has the same arrangement as that in the fifth embodiment and thus details thereof are not repeated herein.

Figure 32:
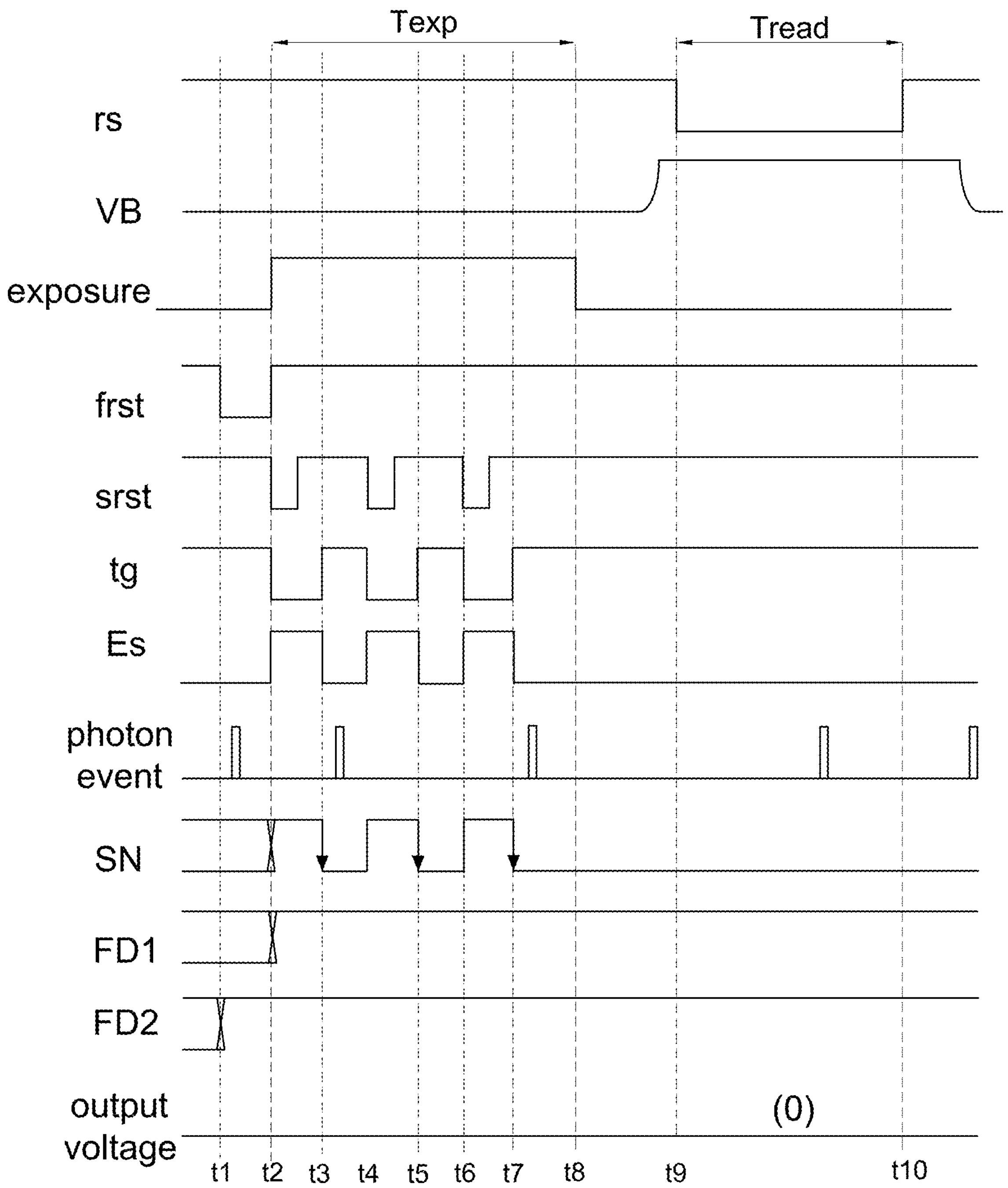
FIG. 32 is another operational timing diagram of an image sensor of FIG. 30, in which no photon event occurs within an exposure period.

Referring to FIGS. 30 to 32, FIGS. 31 and 32 are operational timing diagrams of an image sensor 3000 according to an eleventh embodiment of the present disclosure. The difference between FIG. 31 of the eleventh embodiment and FIG. 20 of the seventh embodiment is that, FIG. 31 shows that a photon event is detected using multiple enabling periods (having predetermined frequency) within an exposure period Texp, whereas FIG. 20 shows that the photon event is detected within the whole of the exposure period Texp, wherein a number of the multiple enabling periods is arranged to be determined according to auto exposure.

As shown in FIGS. 31 and 32, firstly at a time point t1, a voltage on the third node FD2 is reset to a high voltage level. Next, at a time point t2, a voltage on the second node FD1 is reset to a high voltage level; and the first node SN is reset to High, the exposure transistor PM4 is turned on and the enable transistor PM6 is turned off at time points t2, t4, t6 at a predetermined frequency. When the SPAD receives a photon Pe within any one (e.g., between t4-t5 in FIG. 31) of the multiple enabling periods, a voltage on the third node FD2 is at a low voltage level behind the exposure period Texp till the second switch transistor PM2 is turned on by the readout signal rs, the output voltage transfers to a high voltage level (shown as 1) within the readout period Tread to indicate a photon event appearing within the exposure period Texp. It should be mentioned that if there are more than one photon event appearing in more than one enabling period within the exposure period Texp, the output voltage is also at the high voltage level within the readout period Tread.

When the SPAD does not receive any photon within the multiple enabling periods, the voltage on the third node FD2 is at a high voltage level behind the exposure period Texp till the second switch transistor PM2 is turned on by the readout signal rs, the output voltage maintains at a low voltage level (shown as 0) within the readout period Tread to indicate no photon event appearing within the exposure period Texp.

Other parts are shown in FIGS. 31 and 32, and are similar to FIGS. 20 and 32, and thus details thereof are not repeated herein.

The exposure period Texp and readout periods Tread of the image sensor 3000 are also referred to FIG. 33, only changing high and low voltage levels of the signals srst, frst, tg and Es.

It is appreciated that numbers mentioned in the above embodiment, such as the pixel number and pulse number are only intended to illustrate but not to limit the present disclosure.

In addition, the high and low voltage levels mentioned in the above embodiments are selected properly without particular limitations as long as every element operates normally. Meanwhile, the fixed voltage value VQ is referred to a voltage value thereof is maintained constant during the exposure period.

As mentioned above, although the SPAD can be used to detect extremely weak light and high frequency signals, it still needs to operate in corporation with the quenching circuit. Poor circuit design can influence the minimum pixel size and fill factor. Accordingly, the present disclosure further provides an image sensor, the quenching and readout circuit thereof (e.g., FIGS. 1 and 4) and an operating method of the image sensor (e.g., FIGS. 2-3 and 5-6) that have simple circuit structure, low pixel size limitation and high fill factor.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An image sensor, comprising:

a pixel array, comprising a plurality of pixel circuits arranged in a matrix, each of the pixel circuits comprising:

an avalanche diode, having an anode connected to a first node;

an enable transistor, a source of the enable transistor connected to the first node, and a gate of the enable transistor configured to receive an enable signal, which is configured to pull up a voltage on the first node when the pixel circuit is not in sampling or resetting to prevent the avalanche diode from avalanche;

a first switch transistor, a drain of the first switch transistor connected to the first node, a gate of the first switch transistor configured to receive a first reset signal, and a source of the first switch transistor connected to ground;

an exposure transistor, a source of the exposure transistor connected to the first node, a drain of the exposure transistor connected to a second node, and a gate of the exposure transistor receiving an exposure signal for determining an exposure period;

a pull down transistor, a gate of the pull down transistor connected to the second node, and a source of the pull down transistor connected to the ground; and a second switch transistor, a gate of the second switch transistor configured to receive a readout signal, a source of the second switch transistor connected to a drain of the pull down transistor, and a drain of the second switch transistor configured to generate an output voltage.

2. The image sensor as claimed in claim 1, further comprising:

a plurality of pulling circuits, each being configured to be coupled to the drain of the second switch transistor of each pixel circuit of one pixel circuit column via a readout line to read the output voltage, wherein each of the pulling circuits comprises a P-type transistor configured to pull up the output voltage after the output voltage is read, and the enable transistor, the first switch transistor, the exposure transistor, the pull down transistor and the second switch transistor are N-type transistors.

3. The image sensor as claimed in claim 1, wherein the pixel array is configured to output a bit plane corresponding to every exposure period, and the image sensor further comprises a processor configured to combine multiple bit planes to generate an image frame.

4. The image sensor as claimed in claim 1, wherein exposure periods of all pixel circuits of the pixel array are synchronized, and different pixel circuit rows of the pixel array are sequentially read according to a corresponding readout signal.

5. The image sensor as claimed in claim 1, wherein each of the pixel circuits further comprises a reset transistor, a gate of the reset transistor is configured to receive a second reset signal, a drain of the reset transistor is connected to the second node, and a source of the reset transistor is connected to the ground, and the second node is configured to temporarily record a voltage of one photon event detected by the avalanche diode within the exposure period.

6. An image sensor, comprising:

a pixel array, comprising a plurality of pixel circuits arranged in a matrix, each of the pixel circuits comprising:

an avalanche diode, having a cathode connected to a first node;

an enable transistor, a source of the enable transistor connected to the first node, and a gate of the enable transistor configured to receive an enable signal, which is configured to pull down a voltage on the first node when the pixel circuit is not in sampling or resetting to prevent the avalanche diode from avalanche;

a first switch transistor, a drain of the first switch transistor connected to the first node, a gate of the first switch transistor configured to receive a first reset signal, and a source of the first switch transistor connected to a system voltage;

an exposure transistor, a source of the exposure transistor connected to a second node, a drain of the exposure transistor connected to the first node, and a gate of the exposure transistor receiving an exposure signal for determining an exposure period;

a pull up transistor, a gate of the pull up transistor connected to the second node, and a source of the pull up transistor connected to the system voltage; and a second switch transistor, a gate of the second switch transistor configured to receive a readout signal, a source of the second switch transistor connected to a drain of the pull up transistor, and a drain of the second switch transistor configured to generate an output voltage.

7. The image sensor as claimed in claim 6, further comprising:

a plurality of pulling circuits, each being configured to be coupled to the drain of the second switch transistor of each pixel circuit of one pixel circuit column via a readout line to read the output voltage, wherein each of the pulling circuits comprises an N-type transistor configured to pull down the output voltage after the output voltage is read, and the enable transistor, the first switch transistor, the exposure transistor, the pull up transistor and the second switch transistor are P-type transistors.

8. The image sensor as claimed in claim 6, wherein the pixel array is configured to output a bit plane corresponding to every exposure period, and the image sensor further comprises a processor configured to combine multiple bit planes to generate an image frame.

9. The image sensor as claimed in claim 6, wherein exposure periods of all pixel circuits of the pixel array are synchronized, and different pixel circuit rows of the pixel array are sequentially read according to a corresponding readout signal.

10. The image sensor as claimed in claim 6, wherein each of the pixel circuits further comprises a reset transistor, a gate of the reset transistor is configured to receive a second reset signal, a drain of the reset transistor is connected to the second node, and a source of the reset transistor is connected to the system voltage, and the second node is configured to temporarily record a voltage of one photon event detected by the avalanche diode within the exposure period.

11. An image sensor, comprising:

a pixel array, comprising a plurality of pixel circuits arranged in a matrix, each of the pixel circuits comprising:

an avalanche diode, having an anode connected to a node;

an enable transistor, a source of the enable transistor connected to the node, and a gate of the enable transistor configured to receive an enable signal, which is configured to pull up a voltage on the node when the pixel circuit is not in sampling or resetting to prevent the avalanche diode from avalanche;

a first switch transistor, a drain of the first switch transistor connected to the node, a gate of the first switch transistor configured to receive a reset signal, and a source of the first switch transistor connected to ground;

a pull down transistor, a gate of the pull down transistor connected to the node, and a source of the pull down transistor connected to the ground; and a second switch transistor, a gate of the second switch transistor configured to receive an exposure signal, a source of the second switch transistor connected to a drain of the pull down transistor, and a drain of the second switch transistor configured to generate an output voltage.

12. The image sensor as claimed in claim 11, further comprising:

a plurality of pulling circuits each being configured to be coupled to the drain of the second switch transistor of each pixel circuit of one pixel circuit column via a readout line to read the output voltage, wherein each of the pulling circuits comprises a P-type transistor configured to pull up the output voltage when the pull down transistor is turned off, and the enable transistor, the first switch transistor, the pull down transistor and the second switch transistor are N-type transistors.

13. The image sensor as claimed in claim 12, further comprising a global current source circuit configured to form a current mirror with each of the pulling circuits.

14. The image sensor as claimed in claim 11, further comprising a plurality of counters each being coupled to the one pixel circuit column and configured to count photon events of the output voltage corresponding to each sampling period.

15. The image sensor as claimed in claim 14, wherein the exposure signal is a row selection signal, and the plurality of counters is configured to receive multiple pulses of the sampling signal within an exposure period determined by the exposure signal to determine the sampling period.

16. An image sensor, comprising:

a pixel array comprising a plurality of pixel circuits arranged in a matrix, each of the pixel circuits comprising:

an avalanche diode, having a cathode connected to a node;

an enable transistor, a source of the enable transistor connected to the node, and a gate of the enable transistor configured to receive an enable signal, which is configured to pull down a voltage on the node when the pixel circuit is not in sampling or resetting to prevent the avalanche diode from avalanche;

a first switch transistor, a drain of the first switch transistor connected to the node, a gate of the first switch transistor configured to receive a reset signal, and a source of the first switch transistor connected to a system voltage;

a pull up transistor, a gate of the pull up transistor connected to the node, and a source of the pull up transistor connected to the system voltage; and a second switch transistor, a gate of the second switch transistor configured to receive an exposure signal, a source of the second switch transistor connected to a drain of the pull up transistor, and a drain of the second switch transistor configured to generate an output voltage.

17. The image sensor as claimed in claim 16, further comprising:

a plurality of pulling circuits each being configured to be coupled to the drain of the second switch transistor of each pixel circuit of one pixel circuit column via a readout line to read the output voltage, wherein each of the pulling circuits comprises an N-type transistor configured to pull down the output voltage when the pull up transistor is turned off, and the enable transistor, the first switch transistor, the pull up transistor and the second switch transistor are P-type transistors.

18. The image sensor as claimed in claim 17, further comprising a global current source circuit configured to form a current mirror with each of the pulling circuits.

19. The image sensor as claimed in claim 16, further comprising a plurality of counters each being coupled to the one pixel circuit column and configured to count photon events of the output voltage corresponding to each sampling period.

20. The image sensor as claimed in claim 19, wherein the exposure signal is a row selection signal, and the plurality of counters is configured to receive multiple pulses of the sampling signal within an exposure period determined by the exposure signal to determine the sampling period.

* * * * *